United States Patent
Malhotra et al.

(10) Patent No.: US 7,412,682 B2
(45) Date of Patent: Aug. 12, 2008

(54) LOCAL PREFERRED DIRECTION ROUTING

(75) Inventors: Anish Malhotra, Los Altos, CA (US);
Jonathan Frankle, Los Gatos, CA (US);
Asmus Hetzel, Berlin (DE); Etienne Jacques, Bristol (GB)

(73) Assignee: Cadence Design Systems, Inc, San Jose, CA (US)

( * ) Notice: Subject to any disclaimer, the term of this patent is extended or adjusted under 35 U.S.C. 154(b) by 292 days.

(21) Appl. No.: 11/005,169

(22) Filed: Dec. 6, 2004

(65) Prior Publication Data

US 2005/0273747 A1 Dec. 8, 2005

Related U.S. Application Data

(60) Provisional application No. 60/577,434, filed on Jun. 4, 2004.

(51) Int. Cl.
*G06F 17/50* (2006.01)
(52) U.S. Cl. .......................... 716/13; 716/14
(58) Field of Classification Search .......... 716/8–15
See application file for complete search history.

(56) References Cited

U.S. PATENT DOCUMENTS

| | | | |
|---|---|---|---|
| 4,571,451 A | 2/1986 | Linsker et al. |
| 4,615,011 A | 9/1986 | Linsker |
| 4,777,606 A | 10/1988 | Fournier |
| 4,855,253 A | 8/1989 | Weber |
| 4,855,929 A | 8/1989 | Nakajima |
| 4,910,680 A | 3/1990 | Hiwatshi |
| 5,375,069 A | 12/1994 | Satoh et al. |
| 5,541,005 A | 7/1996 | Bezama et al. |
| 5,635,736 A | 6/1997 | Funaki et al. |
| 5,650,653 A | 7/1997 | Rostoker et al. |
| 5,673,201 A | 9/1997 | Malm et al. |
| 5,723,908 A | 3/1998 | Fuchida et al. |
| 5,798,936 A | 8/1998 | Cheng |
| 5,801,385 A | 9/1998 | Endo et al. |
| 5,801,960 A | 9/1998 | Takano et al. |
| 5,811,863 A | 9/1998 | Rostoker et al. |
| 5,814,847 A | 9/1998 | Shihadeh et al. |

(Continued)

FOREIGN PATENT DOCUMENTS

JP 04000677 1/1992

(Continued)

OTHER PUBLICATIONS

Cheng-Kok Koh and Patrick H. Madden, Manhattan or Non Manhattan? A Study of Alternative VLSI routing Architectures, 2000, pp. 47-52.

(Continued)

*Primary Examiner*—Jack Chiang
*Assistant Examiner*—Binh Tat
(74) *Attorney, Agent, or Firm*—Adeli & Tollen LLP

(57) ABSTRACT

Some embodiments of the invention provide a method for routing. The method defines at least one wiring layer that has at least two regions with different local preferred wiring directions. The method then uses the differing local preferred wiring directions to define a global route on the wiring layer. The two regions are a first region with a first local preferred wiring direction, and a second region with a second local preferred wiring direction. The global route traverses the first region along the first local preferred wiring direction and traverses the second region along the second local preferred wiring direction.

23 Claims, 38 Drawing Sheets

U.S. PATENT DOCUMENTS

| | | | |
|---|---|---|---|
| 5,980,093 | A | 11/1999 | Jones et al. |
| 6,262,487 | B1 | 7/2001 | Igarashi et al. |
| 6,263,475 | B1 | 7/2001 | Toyonaga et al. |
| 6,324,674 | B2 | 11/2001 | Andreev et al. |
| 6,407,434 | B1 | 6/2002 | Rostoker et al. |
| 6,441,470 | B1 | 8/2002 | Shenoy |
| 6,448,591 | B1 | 9/2002 | Juengling |
| 6,526,555 | B1 | 2/2003 | Teig et al. |
| 6,711,727 | B1 | 3/2004 | Teig et al. |
| 6,769,105 | B1 | 7/2004 | Teig et al. |
| 6,772,406 | B1 | 8/2004 | Trimberger |
| 6,792,587 | B2 | 9/2004 | Xing et al. |
| 6,858,928 | B1 | 2/2005 | Teig et al. |
| 6,870,255 | B1 | 3/2005 | Teig et al. |
| 6,889,371 | B1 * | 5/2005 | Teig et al. ............ 716/12 |
| 6,889,372 | B1 | 5/2005 | Teig et al. |
| 6,898,773 | B1 | 5/2005 | Teig et al. |
| 6,915,500 | B1 | 7/2005 | Teig et al. |
| 6,973,634 | B1 | 12/2005 | Teig et al. |
| 6,988,258 | B2 | 1/2006 | Tan et al. |
| 6,996,789 | B2 | 2/2006 | Teig et al. |
| 7,003,752 | B2 | 2/2006 | Teig et al. |
| 7,010,771 | B2 | 3/2006 | Teig et al. |
| 7,036,101 | B2 * | 4/2006 | He et al. ............ 716/7 |
| 7,036,105 | B1 | 4/2006 | Teig et al. |
| 7,047,513 | B2 * | 5/2006 | Teig et al. ............ 716/13 |
| 7,062,743 | B2 * | 6/2006 | Kahng et al. ............ 716/13 |
| 7,080,342 | B2 | 7/2006 | Teig et al. |
| 7,096,449 | B1 | 8/2006 | Teig et al. |
| 7,117,468 | B1 | 10/2006 | Teig et al. |
| 7,171,635 | B2 * | 1/2007 | Teig et al. ............ 716/3 |
| 7,174,529 | B1 * | 2/2007 | Hetzel ............ 716/13 |
| 7,197,738 | B1 * | 3/2007 | Hetzel et al. ............ 716/12 |
| 2004/0098696 | A1 | 5/2004 | Teig et al. |
| 2004/0098697 | A1 * | 5/2004 | Frankle et al. ............ 716/13 |
| 2005/0229134 | A1 | 10/2005 | Hetzel et al. |
| 2005/0240894 | A1 | 10/2005 | Teig et al. |

OTHER PUBLICATIONS

U.S. Appl. No. 11/005,316, filed Dec. 6, 2004, Asmus Hetzel et al.
U.S. Appl. No. 11/005,448, filed Dec. 6, 2004, Asmus Hetzel et al.
U.S. Appl. No. 11/005,162, filed Dec. 6, 2004, Anish Malhotra et al.
International Search Report, Cadence Design Systems, Inc., Feb. 15, 2006, International Search Report of PCT Application based on U.S. Appl. No. 11/005,148, which is related to this application.
Written Opinion of the International Searching Authority, Cadence Design Systems, Inc., Feb. 15, 2006, Written Opinion of the International Searching Authority of PCT Application based on U.S. Appl. No. 11/005,448, which is related to this application.
U.S. Appl. No. 09/733,104 (Non Final Office Action), filed Dec. 7, 2000, Teig, Non-Final Office Action mailed Oct. 27, 2003 of related application.
U.S. Appl. No. 09/733,104 (Final Office Action), filed Dec. 7, 2000, Teig, Final Office Action mailed Sep. 26, 2002, of related application.
U.S. Appl. No. 09/733,104 (Non-Final Office Action), filed Dec. 7, 2000, Teig, Non-Final Office Action mailed Jan. 3, 2002 of related application.
U.S. Appl. No. 11/005,448 (Non-Final Office Action), filed Dec. 6, 2004, Hetzel, Non-Final Office Action mailed Aug. 25, 2006, of related application.
U.S. Appl. No. 11/005,448 (Non-Final Office Action), filed Dec. 6, 2004, Hetzel, Non-Final Office Action mailed Mar. 14, 2007 of related application.
U.S. Appl. No. 11/005,316 (Non-Final Office Action), filed Dec. 6, 2004, Hetzel, Non-Final Office Action mailed Apr. 26, 2007 of related application.
U.S. Appl. No. 11/031,472 (Non-Final Office Action), filed Jan. 6, 2005, Teig, Non-Final Office Action mailed Sep. 20, 2006 of related application.
International Search Report, Sep. 2006, Cadence Design Systems, Inc., International Search Report of PCT Application PCT/US2005/019361 based on U.S. Appl. No. 11/005,316, which is related to this application.
Written Opinion of the International Searching Authority, Sep. 2006, Cadence Design Systems, Inc., Written Opinion of the International Searching Authority of PCT Application PCT/US2005/019361 based on U.S. Appl. No. 11/005,316, which is related to this application.

* cited by examiner

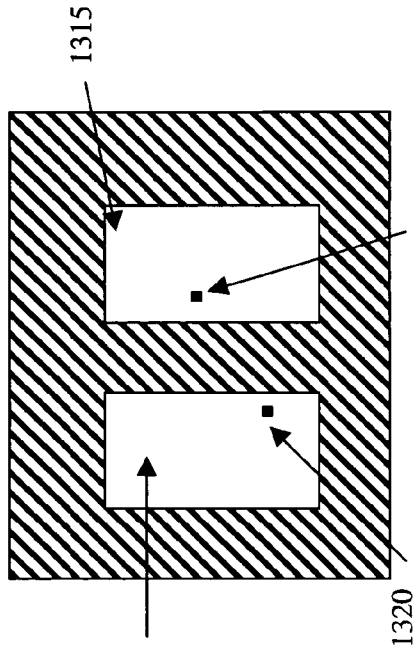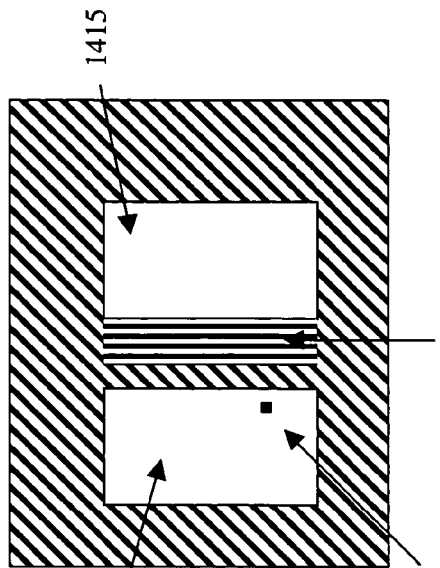
*Figure 13*
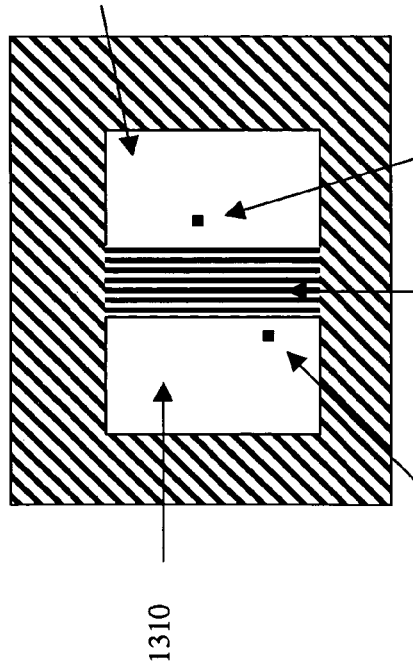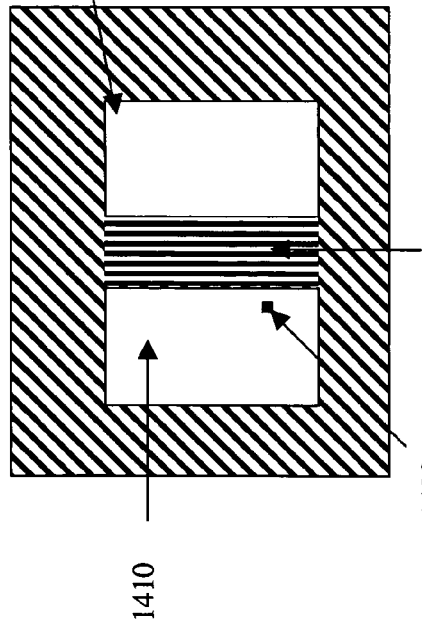
*Figure 14*

Jogs into the LPDR

Vias out

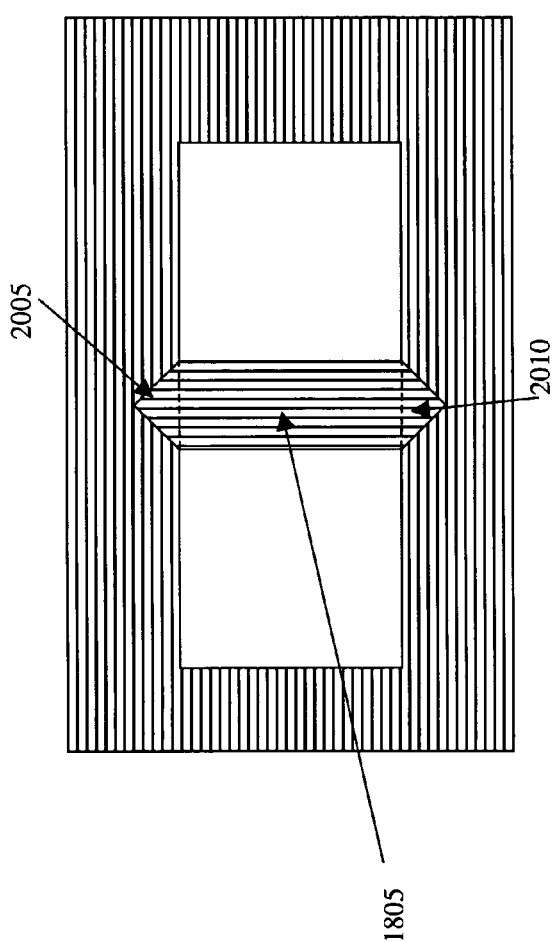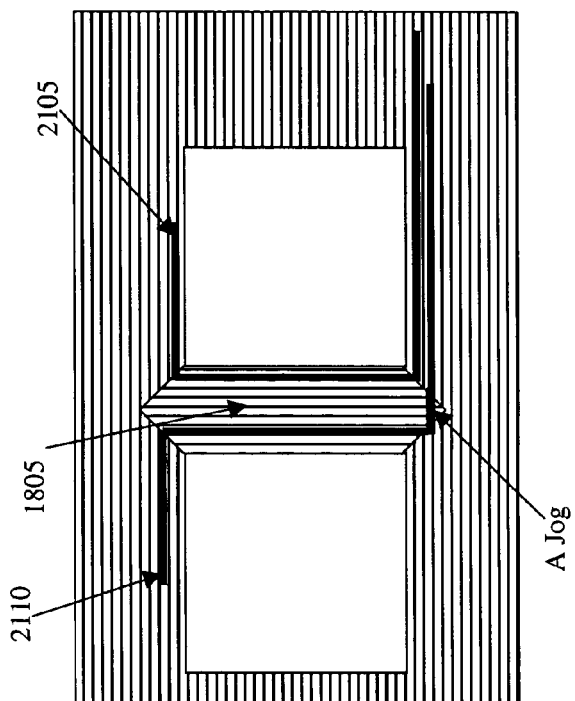

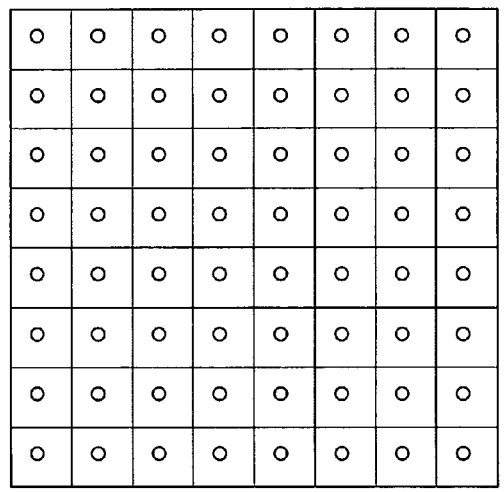
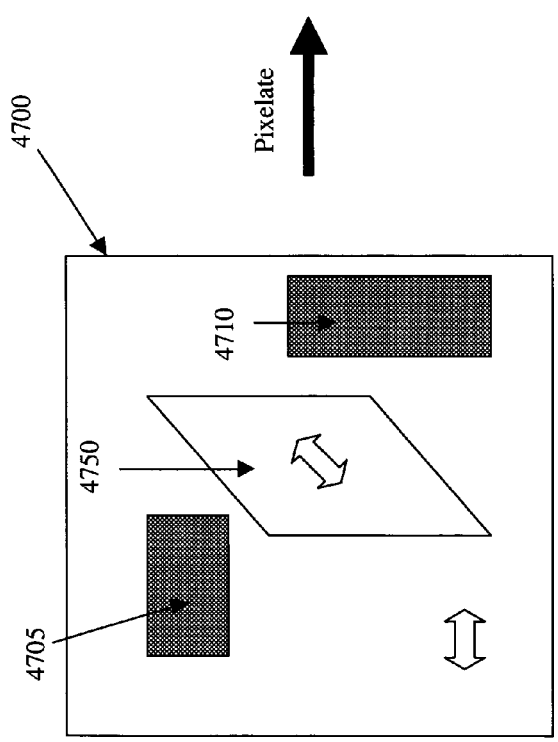
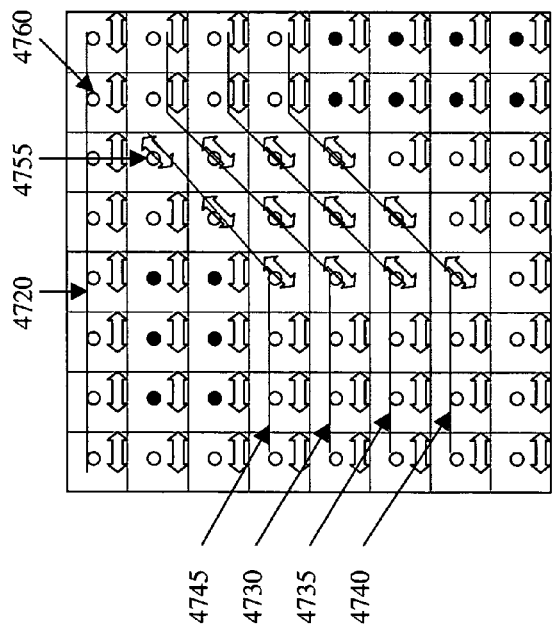
*Figure 47A*

LOCAL PREFERRED DIRECTION ROUTING

CLAIM OF BENEFIT TO PRIOR PROVISIONAL APPLICATION

This application claims the benefit of U.S. Provisional Patent Application 60/577,434, filed on Jun. 4, 2004.

CROSS REFERENCE TO RELATED APPLICATIONS

This Application is related to the following applications with the same filing date: U.S. patent application Ser. No. 11/005,316, filed Dec. 6/2004; U.S. patent application Ser. No. 11/005,448, filed Dec. 6/2004; and U.S. patent application Ser. No. 11/005,162, filed Dec. 6, 2004.

BACKGROUND OF THE INVENTION

An integrated circuit ("IC") is a semiconductor device that includes many electronic components (e.g., transistors, resistors, diodes, etc.). These components are often interconnected to form multiple circuit components (e.g., gates, cells, memory units, arithmetic units, controllers, decoders, etc.) on the IC. An IC also includes multiple layers of metal and/or polysilicon wiring that interconnect its electronic and circuit components. For instance, many ICs are currently fabricated with five metal layers. In theory, the wiring on the metal layers can be all-angle wiring (i.e., the wiring can be in any arbitrary direction). Such all-angle wiring is commonly referred to as Euclidean wiring. In practice, however, each metal layer typically has one global preferred wiring direction, and the preferred direction alternates between successive metal layers.

Many ICs use the Manhattan wiring model that specifies alternating layers of horizontal and vertical preferred direction wiring. In this wiring model, the majority of the wires can only make 90° turns. Occasional diagonal jogs are sometimes allowed on the preferred horizontal and vertical layers. Standard routing algorithms heavily penalize these diagonal jogs (i.e. assess proportionally high routing-costs), however, because they violate the design rules of the Manhattan wiring model. Some have recently proposed ICs that use a diagonal wiring model to provide design rules that do not penalize diagonal interconnect lines (wiring). Interconnect lines are considered "diagonal" if they form an angle other than zero or ninety degrees with respect to the layout boundary of the IC. Typically however, diagonal wiring consists of wires deposed at ±45 degrees.

Typical Manhattan and diagonal wiring models specify one preferred direction for each wiring layer. Design difficulties arise when routing along a layer's preferred direction because of obstacles on these wiring layers. For example, design layouts often contain circuit components, pre-designed circuit blocks, and other obstacles to routing on a layer. Such obstacles may cause regions on a layer to become essentially unusable for routing along the layer's single preferred direction.

An example that shows obstacles that cause regions on a design layout to become unusable for routing is illustrated in FIG. 1. This figure shows two wiring layers that each have two routing obstacles 115 and 120. One of the layers has a horizontal preferred direction; the other layer has a diagonal preferred direction. The obstacles 115 and 120 cause two regions 105 and 110 to become unusable for routing on both of these layers. Therefore, both the Manhattan and diagonal wiring models typically waste routing resources on the layers of a design layout.

Accordingly, there is a need in the art for a wiring model that allows Manhattan and diagonal wiring and recaptures the routing resources lost because of obstacles on a wiring layer. More generally, there is a need for a route planning method that maximizes the routing resources on each particular layer.

SUMMARY OF THE INVENTION

Some embodiments of the invention provide a method for routing. The method defines at least one wiring layer that has at least two regions with different local preferred wiring directions. The method then uses the differing local preferred wiring directions to define a global route on the wiring layer. The two regions are a first region with a first local preferred wiring direction, and a second region with a second local preferred wiring direction. The global route traverses the first region along the first local preferred wiring direction and traverses the second region along the second local preferred wiring direction.

BRIEF DESCRIPTION OF THE DRAWINGS

The novel features of the invention are set forth in the appended claims. However, for purpose of explanation, several embodiments of the invention are set forth in the following figures.

FIG. 1 illustraes an example that shows obstacles that cause regions on a design layout to become unusable for routing is illustrated in.

FIG. 13 presents an example of an LPDR that is created on a layer between two macros.

FIG. 14 illustrates an example of a pin adjustment operation that modifies the shape of an LPDR.

FIGS. 18-21 illustrate examples of impermeable boundaries between regions on a layer and examples of eliminating such boundaries by reshaping the regions.

FIGS. 47A and 47B illustrate examples of pixelating a capacity tile into numerous tiles with pixels at their centers.

DETAILED DESCRIPTION OF THE INVENTION

Figure 1:
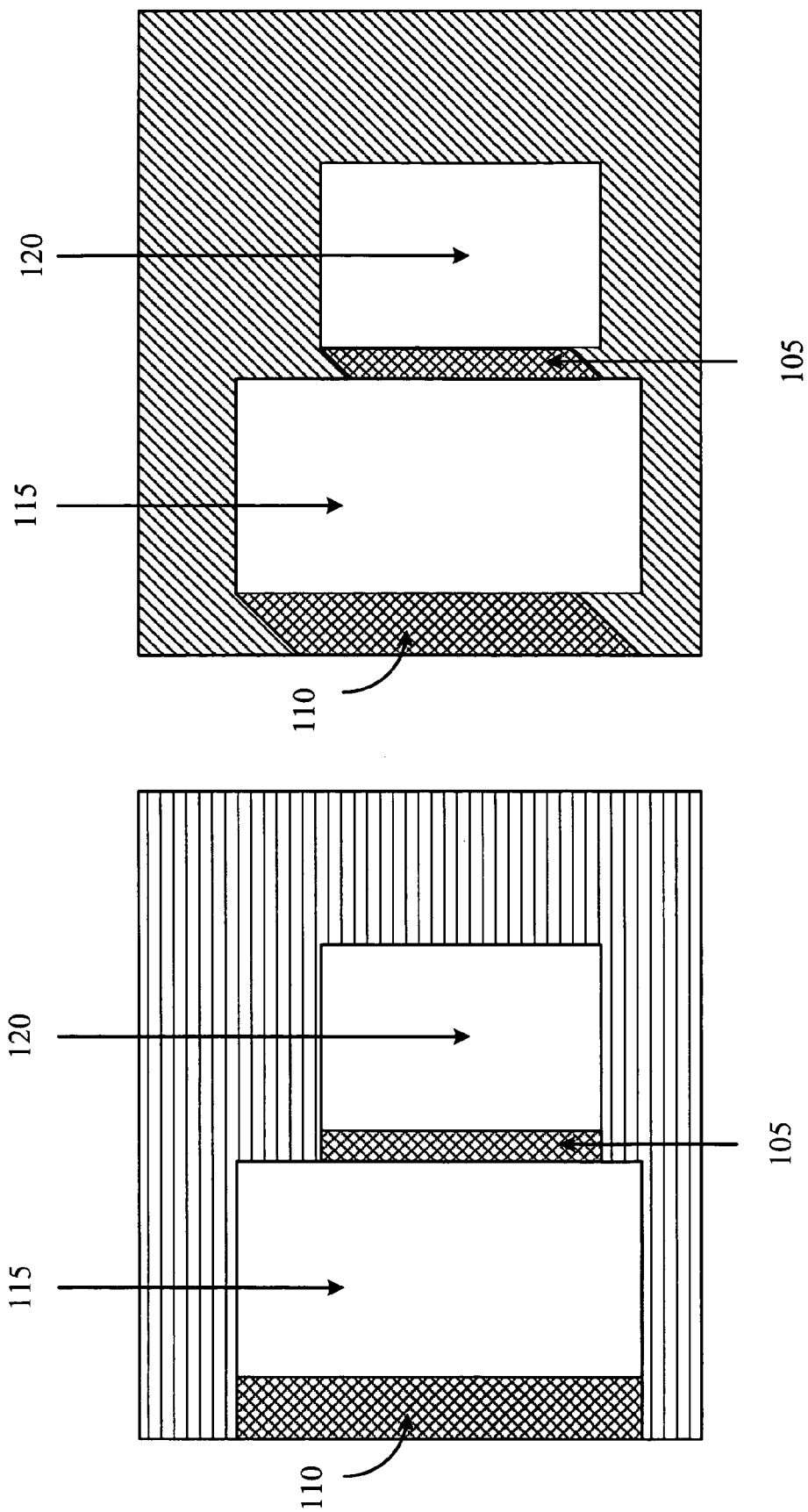

In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail.

Some embodiments of the invention provide one or more Electronic Design Automation (EDA) tools that use a Local Preferred Direction (LPD) wiring model. An LPD wiring model allows at least one wiring layer to have several different local preferred directions in several different regions of the wiring layer.

Several features of LPD design will be discussed below. Section I provides examples of LPD wiring models of some embodiments of the invention. Section II then describes how some embodiments define regions with different LPDs on the same wiring layer. Section III then describes global routers that use the LPD wiring model, while section IV describes detailed routers that use the LPD wiring model.

I. LPD Overview

A. Definitions

Several embodiments of the invention provide a router that routes a set of nets in a region of an integrated circuit ("IC") layout. Each routed net includes a set of routable elements in the IC-layout region. The routable elements are pins in the embodiments described below, although they might be other elements in other embodiments. The routes defined by some embodiments have "diagonal" edges. In some embodiments, a diagonal edge typically forms an angle other than 0° or 90° with respect to the layout's Cartesian coordinate axes, which are often parallel with the layout's boundary and/or the boundary of the layout's expected IC. On the other hand, a horizontal or vertical edge typically forms an angle of 0° or 90° with respect to one of the coordinate axes of the layout. The horizontal and vertical directions are referred to as the Manhattan directions.

Given a design layout with routing layers, some embodiments describe the wiring model of a layout in terms of (1) several wiring layers, (2) a global preferred direction $D_L$ for each layer L, and (3) a potentially-empty set of LPDs for each wiring layer L. Some embodiments define a "preferred" direction as the direction that a majority of the wires are laid out in a region. Some embodiments further quantify this amount in terms of percentages or amount of the wiring. For example, some embodiments define the preferred direction of a layer as the direction for at least 50% of the wires (also called interconnect lines or route segments) on the layer. Other embodiments define the preferred direction of a layer as the direction for at least 1000 wires on the layer.

Some embodiments of the invention use a five-layer wiring model that specifies the following global preferred directions: horizontal wiring on wiring layer 1, vertical wiring on wiring layer 2, horizontal wiring on wiring layer 3, +45° diagonal wiring on wiring layer 4, and −45° diagonal wiring (also referred to as 135° or D135 wiring) on wiring layer 5. One of ordinary skill will realize that other embodiments specify the global wiring directions differently or use a different number of wiring layers.

On a particular layer, a region is called an LPD region (or an LPDR) when the region has a local preferred wiring direction that is different than the global preferred wiring direction of the particular layer. In addition to the global preferred direction $D_L$, some embodiments define for each wiring layer L (1) at least 4 pitch values for use whenever a global or local preferred direction can be 0°, 45°, 90°, 135°; and (2) a possibly empty set of data tuples that represent regions on the layer that might have a local preferred direction that differs from the global preferred direction $D_L$ of the layer.

The pitch values describe the track pitch along a global or local preferred direction. In some embodiments, pitch values may change from layer to layer. Also, in some embodiments, each region's particular tuple t includes an "octangle" $O_t$ that represents the shape of the particular region, and a direction $d_t$ that represents the local preferred direction (i.e., 0°, 45°, 90°, 135°) of the particular region. Some embodiments allow a region's LPD $d_t$ to be the same direction as the global one.

An octangle in some embodiments is a data structure that is useful for design layouts that have items with horizontal, vertical, and/or ±45° directions. Specifically, in these embodiments, an octangle represents a convex geometric shape in terms of eight values, $x_{LO}$, $y_{LO}$, $s_{LO}$, $t_{LO}$, $X_{HI}$, $y_{HI}$, $s_{HI}$, and $t_{HI}$. These eight values define eight half-planes in two coordinate systems, where one coordinate system is a Manhattan coordinate system that is formed by an x-axis and a y-axis, and the other coordinate system is a 45°-rotated coordinate system that is formed by an s-axis and a t-axis. The s-axis is at a 45° counterclockwise rotation from the x-axis, while the t-axis is at a 135° counterclockwise rotation from the x-axis. In the layouts of some embodiments, horizontal lines are aligned with the x-axis, vertical lines are aligned with the y-axis, 45° diagonal lines are aligned with the s-axis, and −45° diagonal lines are aligned with the t-axis.

Octangles are further described in U.S. patent application Ser. No. 10/443,595 entitled "Method and Apparatus for Representing Items in a Design Layout," which published as U.S. Published patent application 2004-0225983A1. This patent application is incorporated herein by reference. In the description below, both the wiring and non-wiring geometries of the design layout are convex shapes, or can be decomposed into convex shapes, that have horizontal, vertical, and ±45° sides. One of ordinary skill will realize, however, that some embodiments might use the octangle data structure in cases where the wiring or non-wiring geometries are more restricted.

Some embodiments impose several consistency requirements on an LPD description. For instance, some embodiments require each LPD region to be entirely within the chip area. Also, in some embodiments, different LPD regions on a given layer can abut only at their boundary. In addition, in some embodiments, all LPD regions are non-degenerate, i.e. they contain at least one interior point.

Careless definition of LPDs can lead to curious consequences like a separated island on a plane that allows almost no wiring to enter or leave. Since EDA tools typically provide no intelligence about the intention or suitability of such a description, some embodiments of the invention implement an additional plausibility analysis as a separate checking stage that can be called from a Graphical User Interface (GUI) or a text-based interface (such as the Python Interface) in an initial planning stage.

A macro block is a complex pre-designed circuit block that is used in a layout. Examples of such blocks include IP Blocks, RAM cells, etc.

B. EXAMPLES

Figure 2:
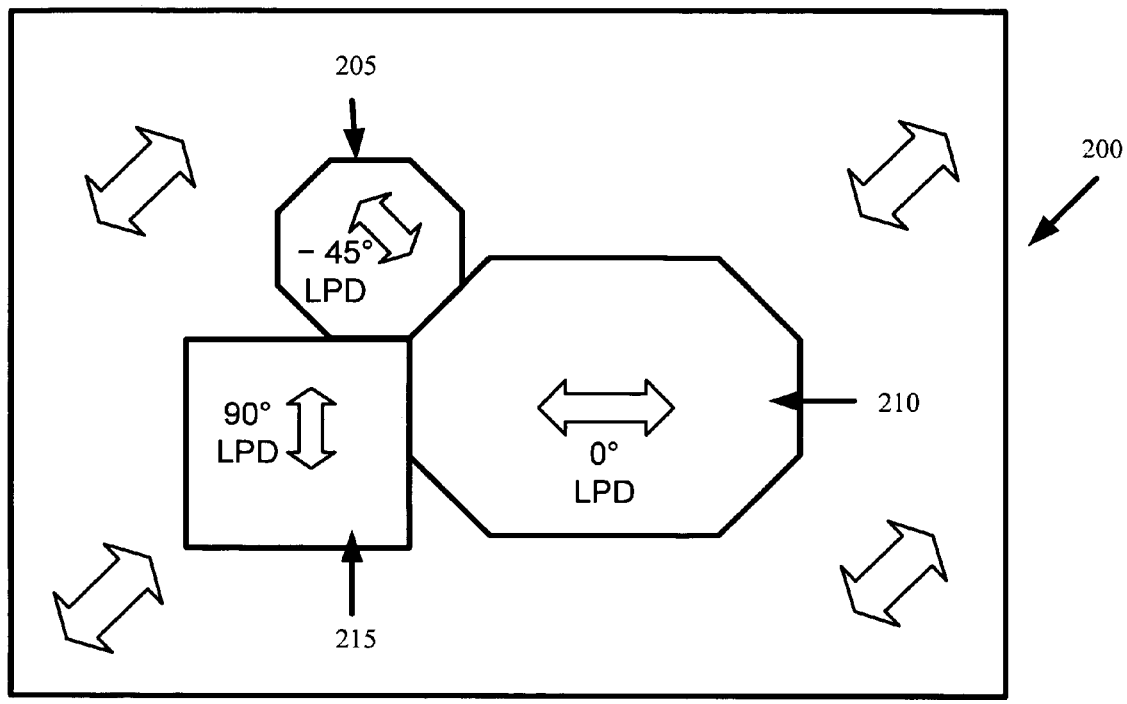
FIG. 2 illustrates an example of a design layout with several differently shaped local preferred direction (LPD) regions according to some embodiments of the invention.

An example of a design layout with several differently shaped LPD regions according to some embodiments of the invention is illustrated in FIG. 2. This example shows a wiring layer 200 having a 45° global preferred direction, an octagonal region 205 having a −45° local preferred direction, an octagonal region 210 having a horizontal (0°) local preferred direction, and a rectangular region 215 having a vertical (90°) local preferred direction.

Figure 3:
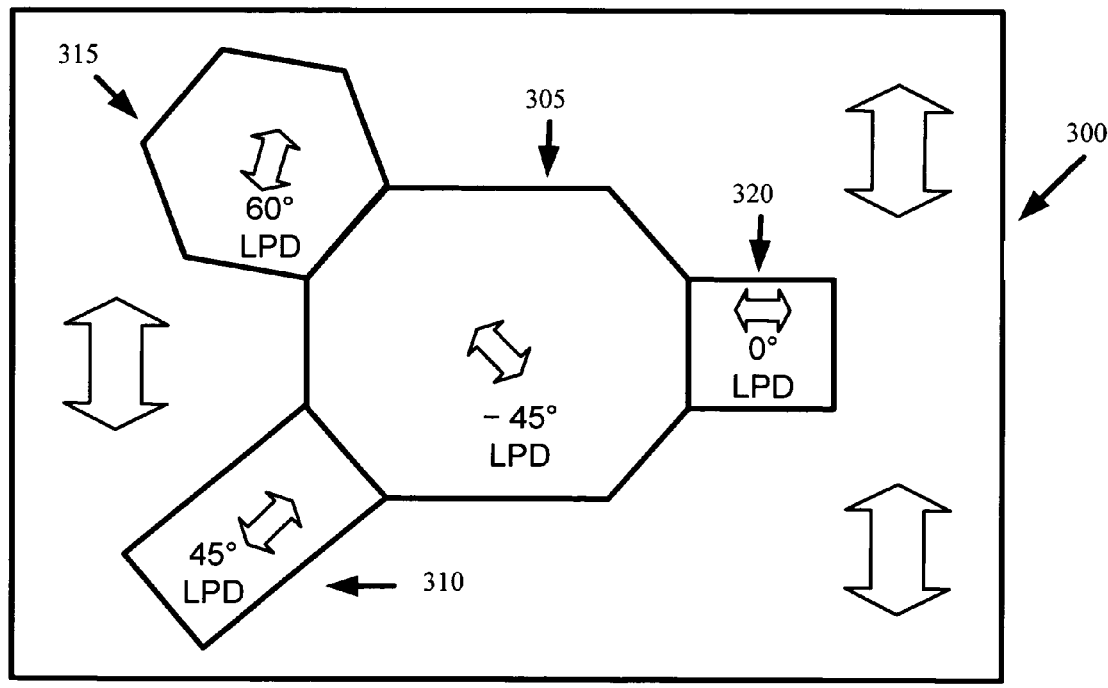
FIG. 3 illustrates another example of a wiring layer with several differently shaped LPD regions (LPDRs) according to some embodiments of the invention.

FIG. 3 illustrates another example of a wiring layer with several differently shaped LPD regions according to some embodiments of the invention. This example shows a wiring layer 300 having a 90° global preferred direction. The layer 300 has four LPD regions having different shapes and different local preferred directions. In the center of the layer 300 is an octagonal LPD region 305 having a −45° local preferred direction. Adjacent to the lower-left side of region 305 is a rectangular LPD region 310 having a 45° local preferred direction. Adjacent to the upper-left side of region 305 is a hexagonal LPD region 315 having a 60° local preferred direction. Adjacent to the right side of region 305 is a square LPD region 320 having a horizontal (0°) local preferred direction. This example illustrates the flexibility of the LPD wiring model when designing a wiring layer with different shaped LPD regions having different local preferred directions.

Figure 4A:
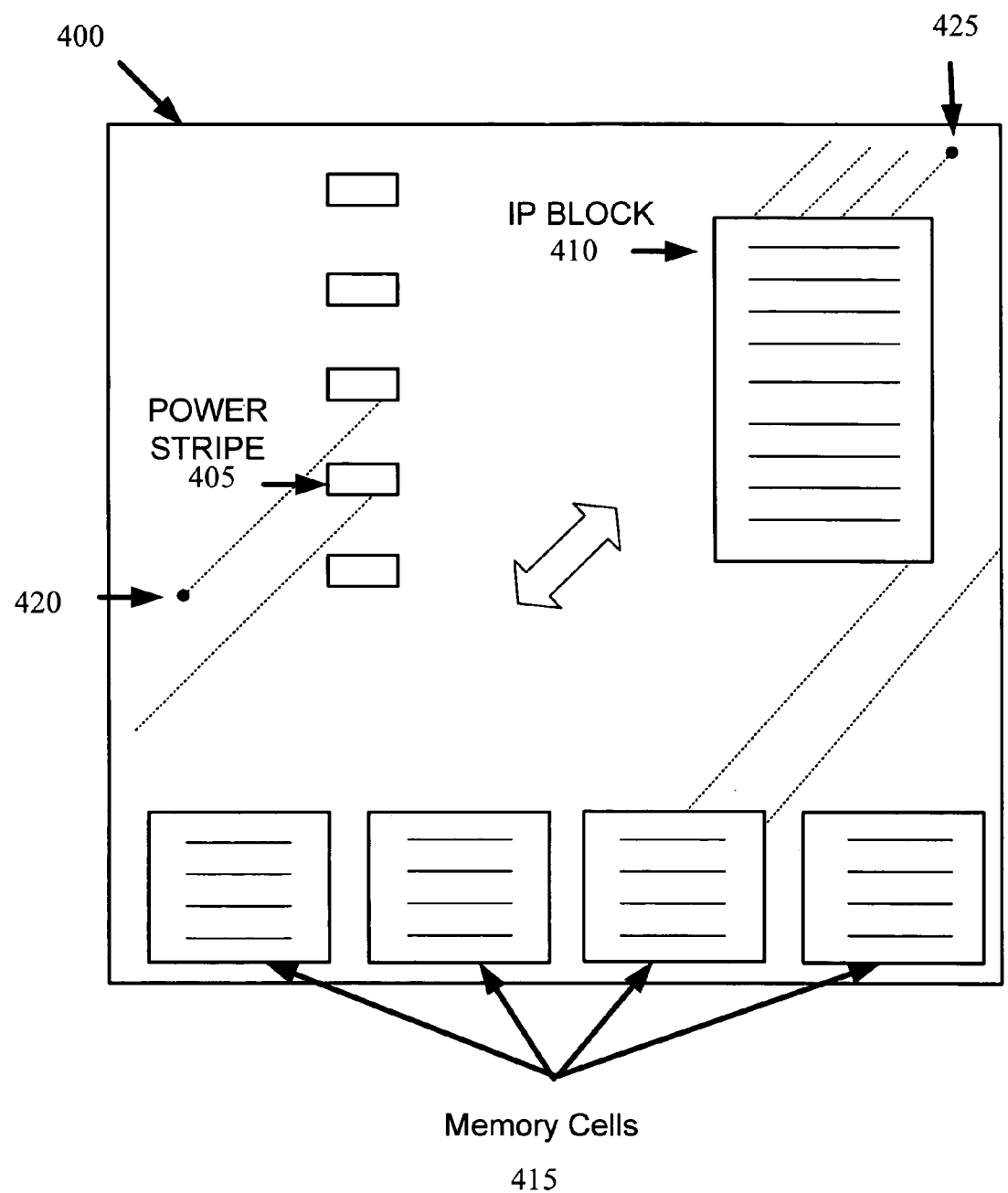
FIGS. 4A and 4B provide examples that illustrate the advantage of LPD wiring model in allowing routing resources normally lost due to obstacles on a wiring layer to be recovered.
Figure 4B:
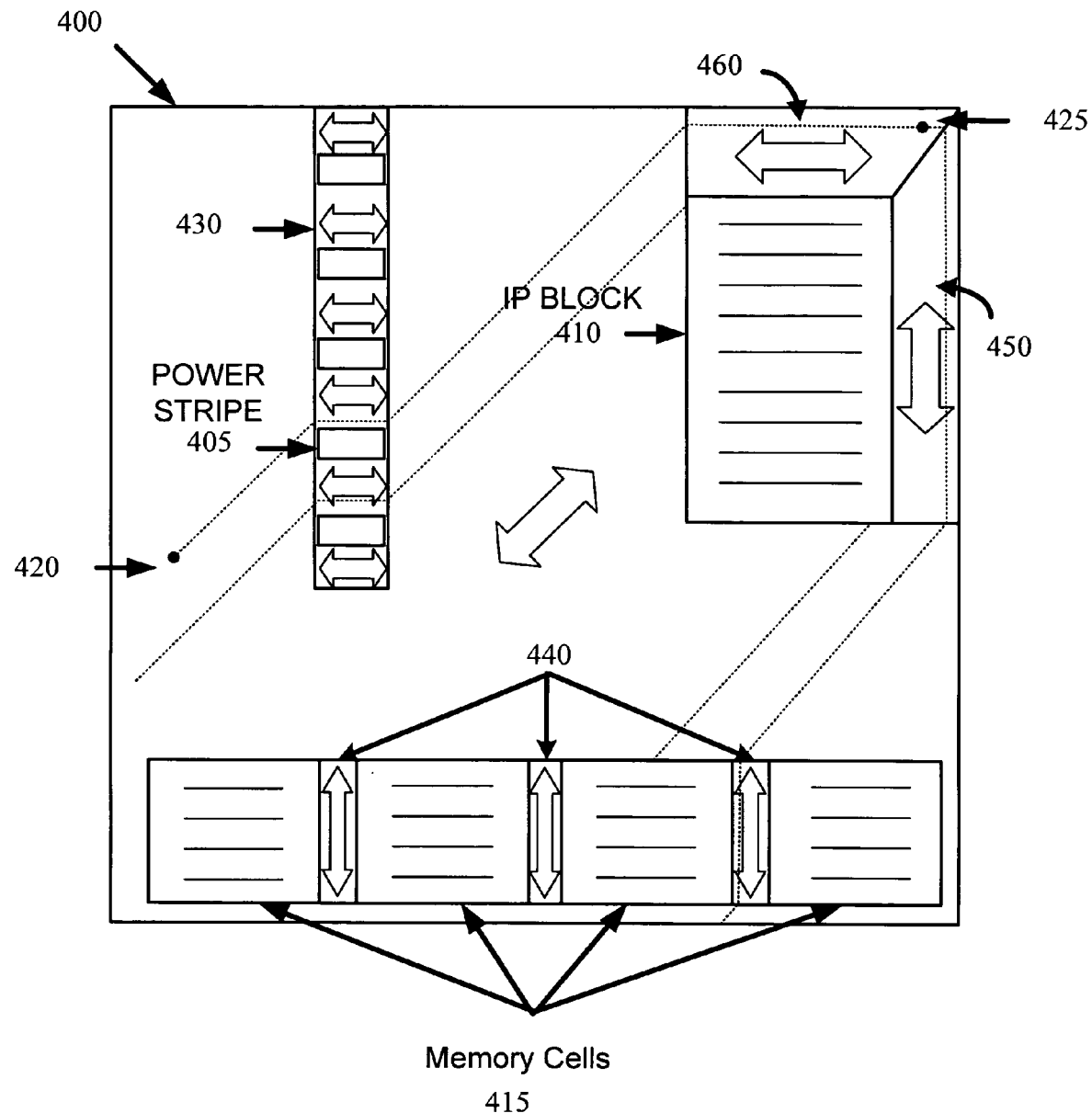

The examples illustrated in FIGS. 2 and 3 present simple cases of the LPD wiring model in a design layout. However, these examples do not illustrate any macros or other obstacles to the wiring on a layer. One of the advantages of the LPD wiring model is that it allows routing resources normally lost due to obstacles on a wiring layer to be recovered. FIGS. 4A and 4B provide examples that illustrate this advantage.

Specifically, FIG. 4A illustrates a wiring layer 400 having a diagonal global preferred direction. This wiring layer includes a column of power via arrays 405, an IP Block 410, a set of memory cells 415, and two pins 420 and 425. FIG. 4A also illustrates dotted lines that represent examples of diagonal wiring on the layer. The power stripe 405, IP Block 410, and the set of memory cells 415 are all obstacles to wiring on the wiring layer. For instance, as shown in FIG. 4A, a problem arises when pins 420 and 425 need to be connected to each other or to other pins, as the diagonal wiring that connects to pin 420 is obstructed by the power via arrays 405 while the diagonal wiring that connects to pin 425 is obstructed by the IP block 410.

In order to solve these routing problems, some embodiments define LPDRs about these obstacles with the LPDs of these regions different than the global preferred direction of the layer. FIG. 4B illustrates examples of such LPDRs. Specifically, this figure illustrates LPDRs 440 that are defined between the power via arrays and that have a horizontal (0°) LPD. Instead of defining an LPDR between each pair of the adjacent power via arrays, some embodiments define just one LPDR (with a horizontal LPD) that covers all the aligned power via arrays. This LPDR will have certain regions (i.e., the regions where the power via arrays exist) blocked for routing. These embodiments define only one LPDR in order to optimize the runtime processing of the LPDRs, as each LPDR takes up memory and computational resources.

FIG. 4B also illustrates LPD regions 435 that are between the RAM blocks 415 and that have a vertical (90°) LPD. In addition, an LPD region 430 having a vertical (90°) local preferred direction is defined between the right side of the IP Block 410 and the right boundary of the wiring layer, while an LPD region 445 having a horizontal (0°) local preferred direction is defined between the top side of the IP Block 410 and the top boundary of the wiring layer. The boundary between LPDR 430 and LPDR 445 is defined as a 45° diagonal line in order to increase the capacity of the wiring between two such regions. Defining such boundaries and the advantages of such boundaries will be further described below.

The LPD regions illustrated in FIG. 4B allow wiring that was previously obstructed to now traverse around the obstacles by routing through these LPD regions along their LPDs. For instance, as shown in FIG. 4B, pins 420 and 425 can now be connected through a set of interconnect lines that traverse along the global 45° direction, traverse through the LPDR 440 in the horizontal direction, traverse again along the global 45° direction, and then traverse through the LPDR 445 in the horizontal direction.

C. Joining Routes At LPD Borders

Figure 5:
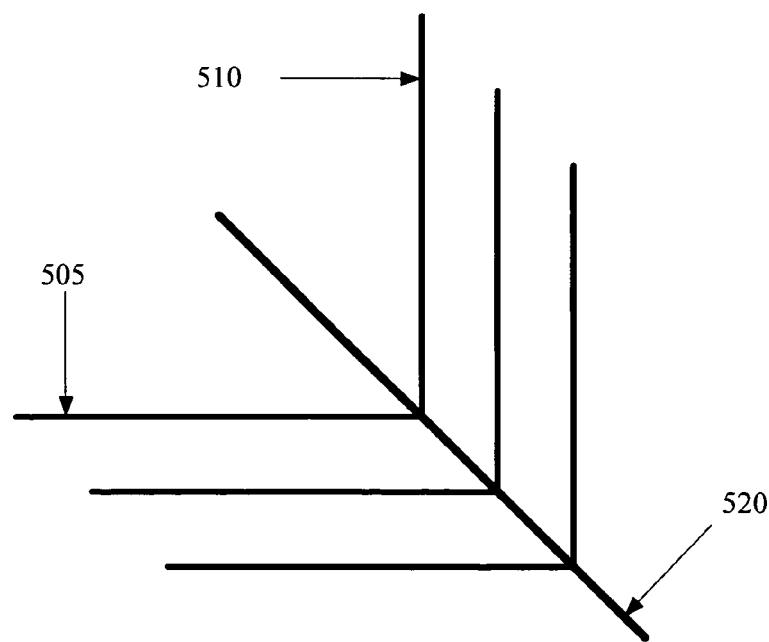
FIG. 5 illustrates an example of such a joining model of some embodiments.

A common issue to address in LPD routing is how to join together route segments that traverse two different regions with two different LPDs on the same layer. Some embodiments of the invention join route segments together along a region that is neither parallel nor perpendicular to either route segment. FIG. 5 illustrates an example of such a joining model of some embodiments. In this figure, horizontal tracks 505 are located in a region with a horizontal local preferred direction, while vertical tracks 510 are located in a region with a vertical local preferred direction. As shown in FIG. 5, horizontal and vertical tracks are joined together along a diagonal region 520, which is a diagonal line in this example.

Figure 6:
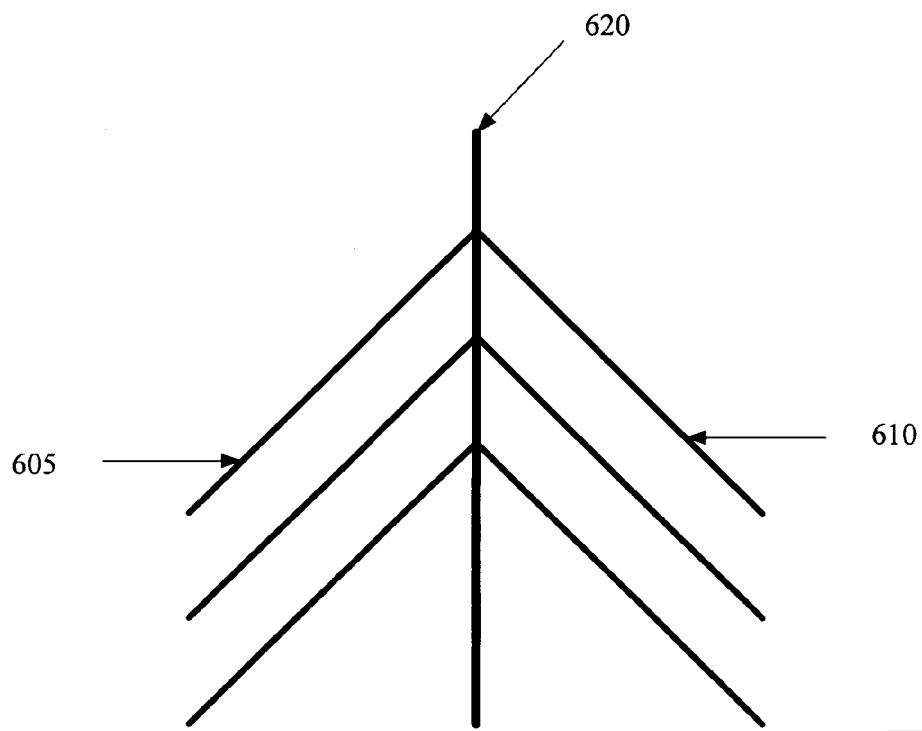
FIG. 6 illustrates another example of a joining model.

FIG. 6 illustrates another example of such a joining model. In this figure, +45° tracks 605 are located in a region with a +45° local direction, while −45° tracks 610 are located in a region with a −45° local direction. As shown in FIG. 6, 45° and −45° tracks are joined together along a vertical region 620, which is a vertical line in the example. Some embodiments manifest such joining models in terms of boundaries between the regions, as further described below in Section II.

D. Pitch

Some embodiments allow each LPDR to have its own set of pitch values. Other embodiments define a different pitch for each possible routing direction of each wiring layer. For instance, some embodiments define at least four (4) pitch values for each wiring layer, with one pitch value for each standard direction (horizontal, vertical, 45°, and 135°). In some embodiments, the distance between each track in each LPD region is set according to the pitch value corresponding to the routing direction in that region.

In some embodiments, the distance between any two parallel tracks is an integer multiple of the pitch, even when the two parallel tracks are in different LPDRs. Offset is the coordinate at the center of a routing track (e.g., it is the x-coordinate for vertical tracks). The offset of the tracks can be defined for each LPD or can remain undefined to be later determined by the detailed router. In either case, the track offsets are defined globally for each wiring direction on a layer. Thus, in some embodiments, there is a common offset for all parallel tracks within all LPD regions within a particular layer.

Pitches and offsets may vary from layer to layer. If the pitch for a particular region is left undefined, its value is estimated by applications (e.g., global and detailed routers). Some embodiments perform this estimation based on common utility functions that are dependent on minimum size net class and width/spacing of this net class. For example, if just one pitch is defined for a Manhattan direction X, the pitch for the other Manhattan direction Y is automatically estimated with the same value by all applications. The same applies for both diagonal directions. This means that if just the X-pitch is defined, the Y-pitch is defaulted to the same value as X-pitch. In some embodiments, the two diagonal pitches are derived from technology design rules, e.g., from the minimum spacing and width of the typical nets.

II. LPD Region Generation

Some embodiments of the invention include an LPDR generator that designates regions on one or more layers as LPD regions. In some embodiments, the LPDR generator automatically detects LPDR candidates and designates some of these candidates as LPD regions. In some of these embodiments, the LPDR generator also provides the designer with a graphical user interface that allows the designer to specify LPD regions and to modify the attributes (e.g., boundaries and LPDs) of these regions. In other embodiments, the LPDR generator does not perform any automatic detection and designation of LPDRs, but instead only provides the designer with a GUI that allows the designer to specify and modify LPDRs. Also, some embodiments allow a user to define and manipulate LPDRs and LPDs through text-based interfaces, such as a Python Interface.

The auto-detection and generation of LPDRs is first described below. This discussion is then followed by a discussion of the GUI of the LPDR generator of some embodiments of the invention.

A. Auto LPDR Generator

The auto-LPDR generator is intended to make use of LPDRs to increase the routing resources without forcing the user to understand and create LPDRs. As discussed above, LPD creation targets regions the lack routing resources along the global preferred wiring direction of the layer. Such regions typically exist in the alleys between closely placed macros and/or between a macro and the layout's boundary. Also, such regions can be defined between power via arrays used to distribute power in the layout. Sub-section 1 below first describes defining LPDRs based on macros, and then sub-section 2 describes defining LPDRs between power via arrays. It should be noted that some embodiments first define LPDRs between the power via arrays, and then define LPDRs based on macros. Alternatively, some embodiment define these LPDRs together.

1. Macros

Figure 8:
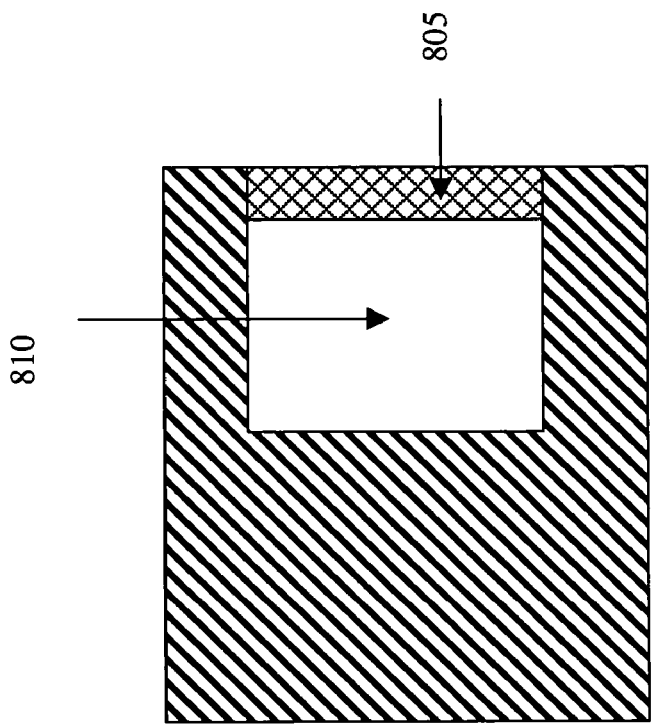
FIGS. 7 and 8 illustrate examples of regions that are between macros or between macros and the layout boundary and that would benefit from LPD wiring.
Figure 7:
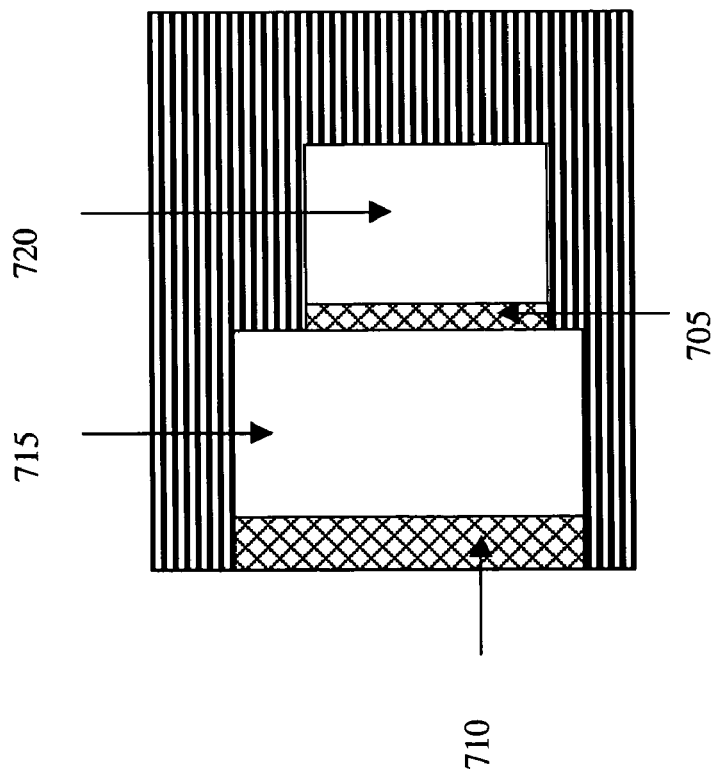

FIGS. 7 and 8 illustrate examples of regions that are between macros or between macros and the layout boundary and that would benefit from LPD wiring. Specifically, FIG. 7 illustrates two macro blocks 715 and 720 on a layer with a horizontal global preferred direction. As shown in this figure, the region 705 between the two macros and the region 710 between the macro 715 and the layer boundary provide small amounts of routing space, which are not particularly useful given the horizontal global preferred direction of the wiring on the layer. FIG. 8 illustrates a region 805 between a macro 810 and the boundary of a layer with a 45° diagonal wiring. Like the regions 705 and 710 of FIG. 7, the regions 805 provides a small amount of routing space that is not particularly useful given the 45° global preferred direction of the wiring on the layer. Hence, to make use of regions 705, 710, and 805, the preferred wiring directions of these regions should be specified differently from the global preferred wiring direction of their layer.

Figure 9:
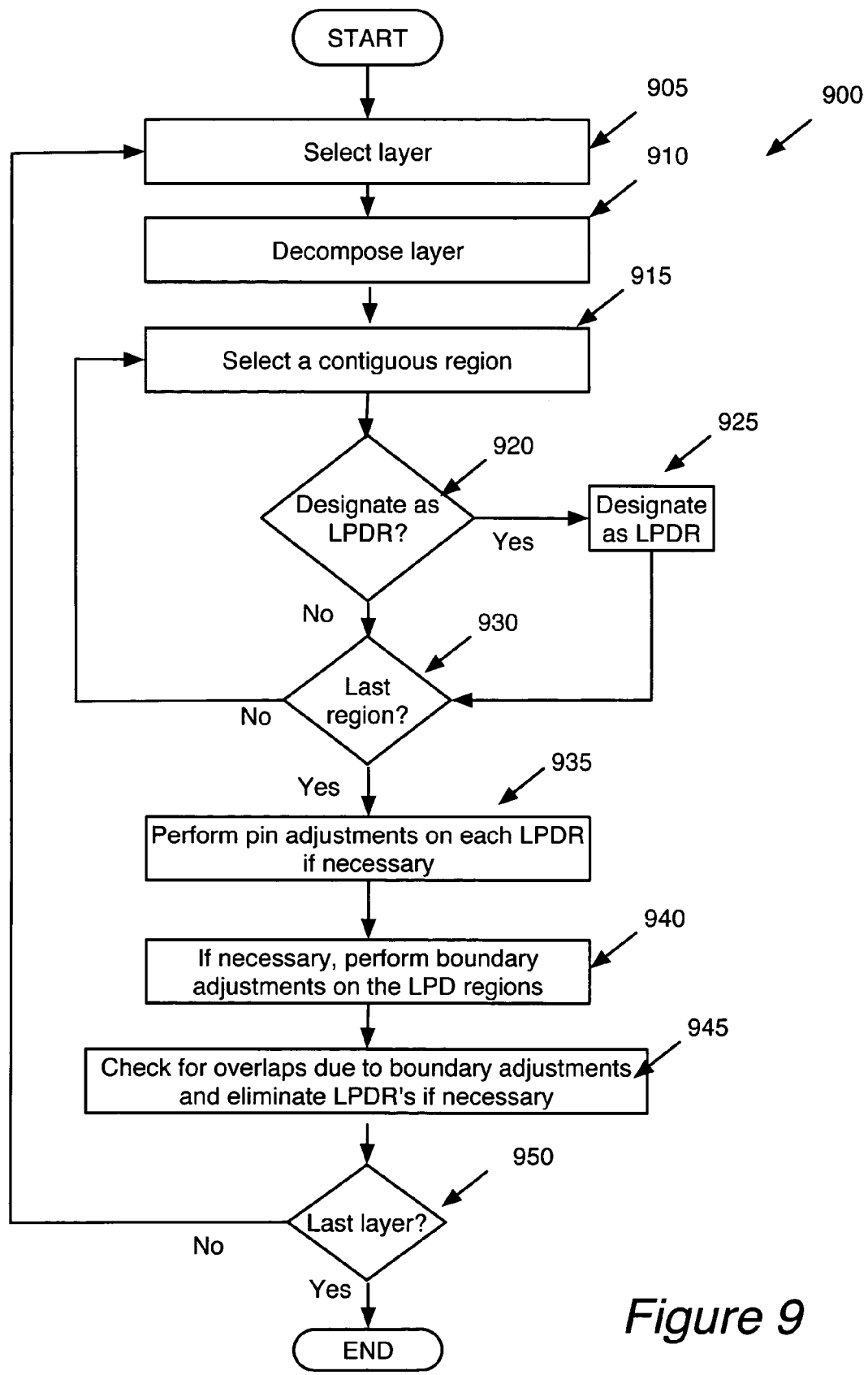
FIG. 9 illustrates an auto-LPDR generation process that is used by some embodiments to generate LPDRs in a layout.

FIG. 9 illustrates an auto-LPDR generation process 900 that is used by some embodiments to generate LPDRs in a layout. This process: (1) identifies candidate regions, (2) designates some or all of the candidate regions as LPDRs, (3) adjusts the LPDRs for pin access, and (4) modifies LPDRs to improve routability between LPDRs and between LPDRs and non-LPDR regions on a layer. This process is described in terms of several examples that relate to LPDR generation on layers with Manhattan global preferred directions.

As shown in FIG. 9, the process 900 starts by selecting (at 905) a layout layer. The process then decomposes (at 910) the layout layer into several regions. In some embodiments, the process decomposes the selected layout layer by projecting rays from the corner vertices of the outline of the macro blocks on the selected layer. The outlines of the macro blocks might have been defined prior to 910 or they might be defined at 910 based on the shape and structure of the content of the macro blocks.

Figure 10:
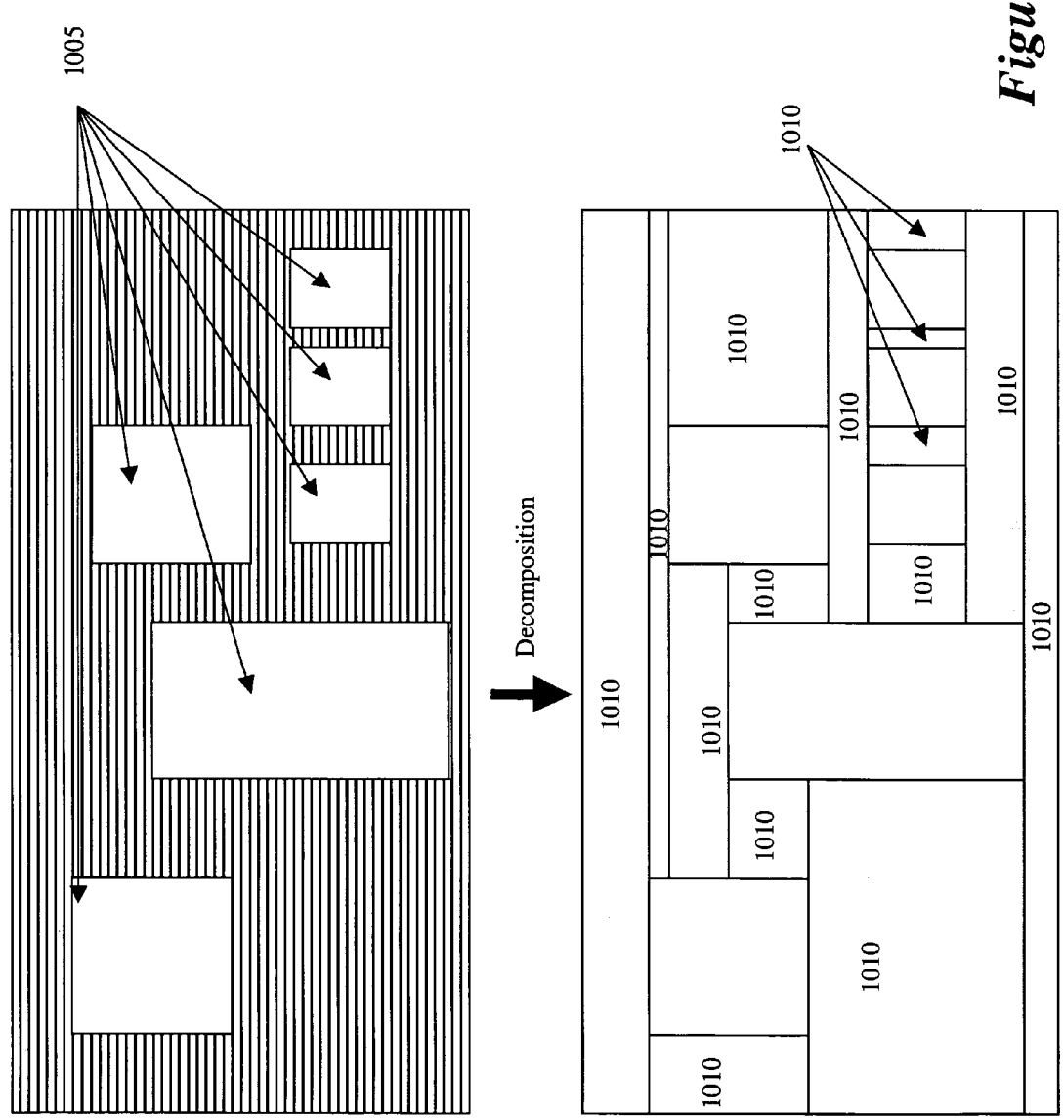
FIG. 10 illustrates an example of a decomposition operation on a layer with a horizontal global preferred direction.

The projected rays are in the direction of the global preferred wiring direction of the selected layer. FIG. 10 illustrates an example of a decomposition operation on a layer with a horizontal global preferred direction. In this example, the layer has six macros 1005. Rays are projected from the vertices of these six macros in the horizontal global preferred direction. These projections define thirteen candidate LPD regions 1010.

After 910, the process then selects (at 915) one of the contiguous regions created through the decomposition. It then determines (at 920) whether it should designate the selected region as an LPDR for a particular local preferred direction. In some embodiment, the process makes this determination by applying a set of geometric criteria. The criteria are meant to ensure that the designation of the selected region as an LPDR does not remove routing resources from a layer, that usable resources are created by the local preferred direction of the LPDR, and that sufficient additional resources get created in order to justify the extra runtime and/or memory cost of including an LPDR.

In some embodiments, the criteria for defining LPDRs on a layer with a horizontal global preferred direction is:

$W_{Max} \geq$ Width of Region $\geq W_{Min}$, and

Length of Region $\geq L_{Min}$, where the width of the region is in the horizontal direction, the length of the region is in the vertical direction, $W_{Max}$ and $W_{Min}$ are upper and lower limits on the width of the region, and $L_{Min}$ is a lower limit on the length of the region. The lower limit on region width ensures that the amount of additional vertical or diagonal resource is worth the cost of LPDRs. The upper limit on region width ensures that significant horizontal resources are not lost. Finally, the lower limit on the region's length ensures that the region is not too short, as vertical or diagonal tracks that are smaller than some length might not be of any significant use. This way the additional vertical or diagonal routes will have significant movement along the vertical or diagonal direction.

In some embodiments, the criteria for defining LPDRs on a layer with a vertical global preferred direction is:

$L_{Max} \geq$ Length of Region $\geq L_{Min}$, and

Width of Region $\geq W_{Min}$.

Again, the width of the region is in the horizontal direction, the length of the region is in the vertical direction, $L_{Max}$ and $L_{Min}$ are upper and lower limits on the length of the region, and $W_{Min}$ is a lower limit on the width of the region. The lower limit on region length ensures that the amount of additional horizontal or diagonal resource is worth the cost of LPDRs. The upper limit on region length ensures that significant vertical resources do not get lost. Finally, the lower limit on the region's width ensures that the region is not too thin, as horizontal or diagonal tracks that are smaller than some length might not be of any significant use. This way the additional horizontal or diagonal routes will have significant movement along the horizontal or diagonal direction. Some embodiments define the criteria for defining LPDRs on a layer with diagonal global preferred directions similarly.

If the process determines (at 920) that the selected region is not a good candidate for an LPDR, the process transitions to 930, which will be described below. On the other hand, when the process determines (at 920) that the selected region is a good LPDR candidate, it transitions to 925, where it designates the selected region as an LPDR. At 925, the process also designates the LPD of the selected region.

Figure 11:
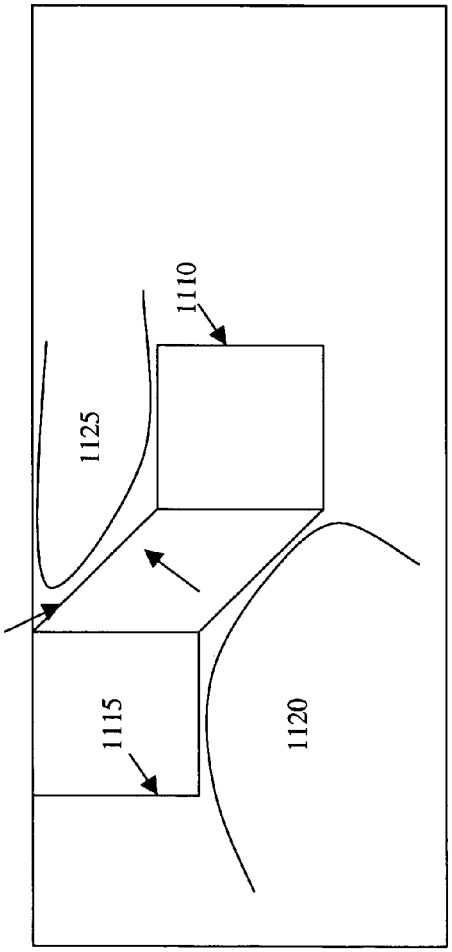
FIG. 11 illustrates a 45° LPD for an LPDR that is defined between two macro blocks that are diagonally offset from each other.

For a layer that has a Manhattan global preferred direction, some embodiments define the LPD of a designated LPDR on that layer as the Manhattan direction that is orthogonal to the layer's Manhattan global preferred direction. On a layer that has a diagonal global preferred direction, some embodiments define the LPD of a designated LPDR on that layer as one of the Manhattan directions. This Manhattan direction might be a direction that is identified by the dimensional attributes (e.g., orientation) of the LPDR. For instance, when the LPDR is a tall and narrow rectangle aligned with the y-axis, the LPD direction might be designated as the vertical direction. Alternatively, some embodiments define the LPD of an LPDR on any layer based on the dimensional attributes of the LPDR. Also, some embodiments define the LPD of an LPDR that is defined between two or more macro blocks based on the positional relationship of the macro blocks. For instance, FIG. 11 illustrates a 45° LPD for an LPDR 1105 that is defined between two macro blocks 1110 and 1115 that are diagonally offset from each other, because it facilitated routing between the open areas 1120 and 1125 to reduce the impact of the macroblocks.

Figure 12:
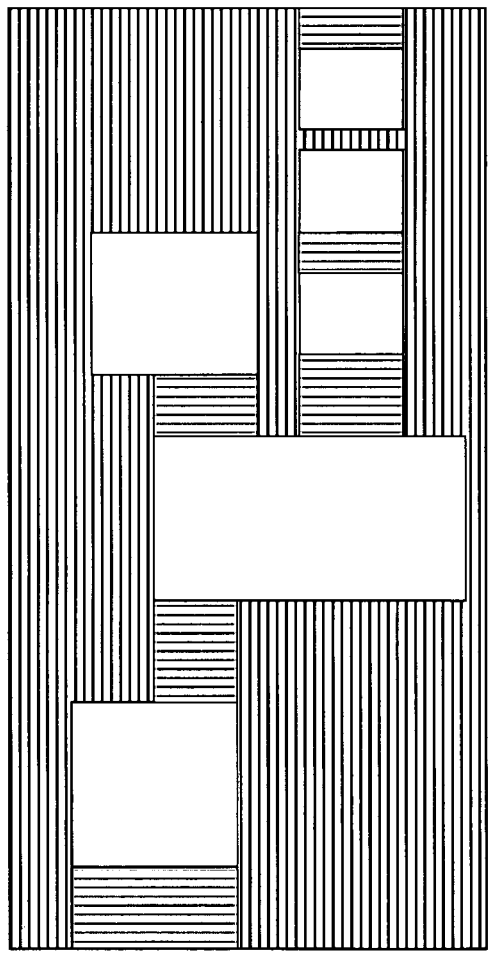
FIG. 12 illustrates the elimination of several candidate LPD regions, which were created in the tessellation illustrated in FIG. 10.

FIG. 12 illustrates the elimination of several candidate LPD regions, which were created in the tessellation illustrated in FIG. 10, for failing to satisfy the above-described width and length criteria. In this example, the remaining LPDRs (i.e., the LPDRs illustrated in this figure) all have been assigned a vertical LPD.

After 925, the process transitions to 930. At 930, the process determines whether it has examined all the contiguous regions created on the selected layer by the decomposition operation at 910. If not, the process selects (at 915) another contiguous region, determines (at 920) whether this region should be designated as an LPDR, and (3) in case of an affirmative determination at 920, designates (at 925) the selected region as an LPDR.

When the process determines (at 930) that it has examined all the contiguous regions created on the selected layer by the decomposition operation at 910, the process examines (at 935) each particular region that it designated (at 925) as an LPD region to determine whether it needs to adjust or eliminate this region based on pins at the boundaries of the particular region.

The newly created LPDRs should not hinder pin access. Hence, the process 900 needs to ensure that the LPDRs provide a safe distance for access to the pins. Accordingly, for each particular LPDR defined at 925, the process initially determines (at 935) whether there is at least one pin on one side of the particular LPDR that needs to connect to another pin on another side of the LPDR. If so, the process discards the LPDR in some embodiments, as the LPDR would block the easiest way to connect the two pins. FIG. 13 presents an example of an LPDR 1305 that is created on a layer between two macros 1310 and 1315. On the two sides of the LPDR 1305, the two macros have two pins 1320 and 1325 that need to connect. Hence, as shown in FIG. 13, the pin adjustment operation at 935 removes the LPDR 1305 from the layout. Instead of discarding (at 935) an LPDR, the process 900 in some embodiments tries to modify (at 935) the shape of the LPDR (e.g., tries to make the LPDR narrower or shorter as further described below) when it determines that there is one pin on one side of the particular LPDR that needs to connect to another pin on another side of the LPDR. If the modification fails to lead to an acceptable solution, the process then discards the LPDR in some embodiments.

The process 900 also identifies (at 935) each LPDR defined at 925 that has one or more pins on its sides even when the pins do not need to connect across the LPDR. For each such LPDR, the process (1) changes the shape of the LPDR to create one or more open corridors for pin access, and (2) then determines whether the modified LPDR still satisfies the above-mentioned criteria for creating the LPDR. If the modified LPDR no longer satisfies one or more of the criteria (e.g., the modified LPDR's width is smaller than the required minimum width), the process discards the LPDR. Otherwise, the process keeps the LPDR with its modified shape.

FIG. 14 illustrates an example of a pin adjustment operation that modifies the shape of an LPDR. Specifically, this figure presents an example of an LPDR 1405 that is created on a layer between two macros 1410 and 1415. On one side of the LPDR 1405, the macro 1410 has a pin 1420 that needs to be connected. Hence, as shown in FIG. 14, the pin adjustment operation at 935 makes the LPDR 1405 narrower (i.e., reduces its width).

Figure 16:
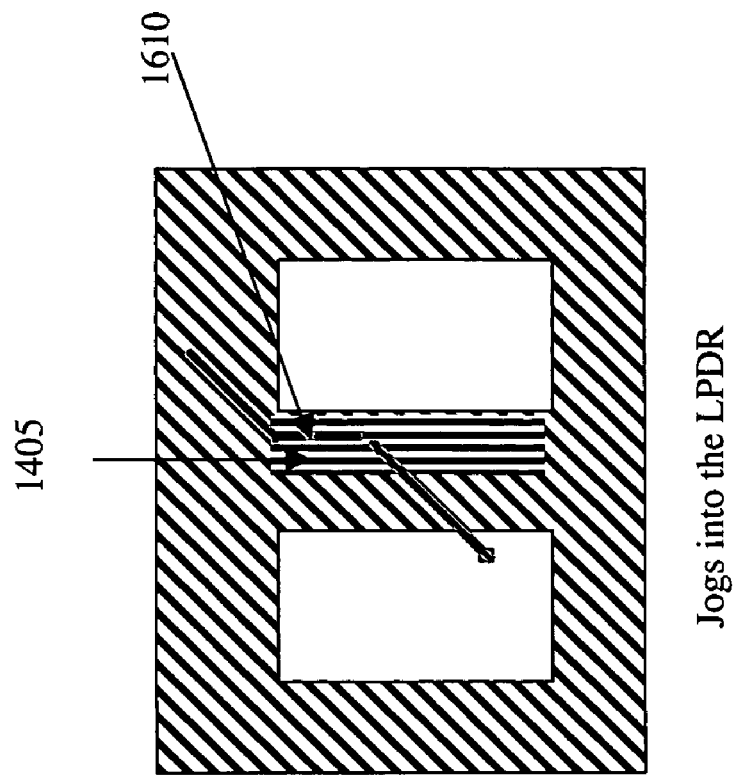
FIG. 16 illustrates an example of how some embodiments allow access to the pin through a 45° jog into the modified LPDR, a vertical traversal through this LPDR, and then traversing back in the 45° direction after leaving the LPDR.
Figure 15:
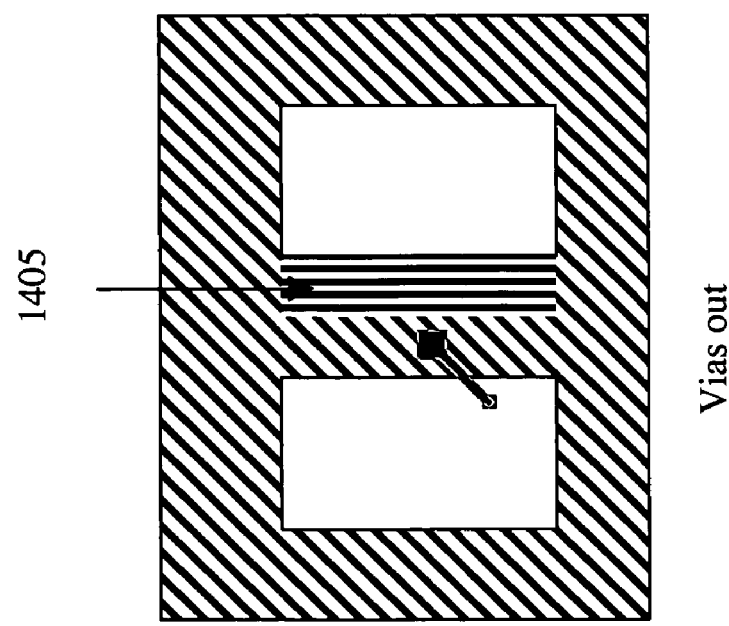
FIG. 15 illustrates an example that shows the use of the corridor created by the adjustment for a via access to the pin. For this modification.

Modifying the shape of an LPDR provides sufficient routing flexibility for accessing the pins. This leeway can be used by routes to either via out of the layer (the way they would have done without LPDRs) or to jog into the LPDR and blend into the flow. For the LPDR modification illustrated in FIG. 14, FIG. 15 illustrates an example that shows the use of the corridor 1405 created by the adjustment for a via access to the pin. For this modification, FIG. 16 illustrates an example of how some embodiments allow access to the pin through a 45° jog 1610 into the modified LPDR 1405, a vertical traversal through this LPDR, and then traversing back in the 45° direction after leaving the LPDR. Given that jog 1610 is not along a the LPD of the region 1405, some embodiments assess this jog a penalty for traversing a portion of this region along its non-preferred direction.

The amount that a dimension of the LPDR is adjusted is dependent on the number of pins on the side or sides of the LPDR that are associated with that dimension. For instance, some embodiments deduct the following distance D from each side of an LPDR region:

$$D = \text{Max}(S_{Min}, P_{Max} * \text{pitch} * C_{Pin})$$

where $P_{Max}$ is the number of pins along the edges of the LPDR, pitch is the wiring pitch along the global preferred direction, $C_{Pin}$ is a pin routing cost that is a heuristic parameter that quantifies the cost of a number of tracks that have to be left aside per pin, and $S_{Min}$ is the minimum spacing requirement for pin access, which is defined by the design rules. Some embodiments drop the min-spacing requirement from the above formula in order to simplify it as follows:

$$D = P_{Max} * \text{pitch} * C_{Pin}$$

Some embodiments might use different rules for performing pin adjustments on layers with diagonal global preferred directions than on layers with Manhattan global preferred directions. For instance, some embodiments may choose to maintain the diagonal direction in a vertically/horizontally shaped region and hence may discard an LPDR when there is a pin at the boundary of the LPDR.

Figure 17:
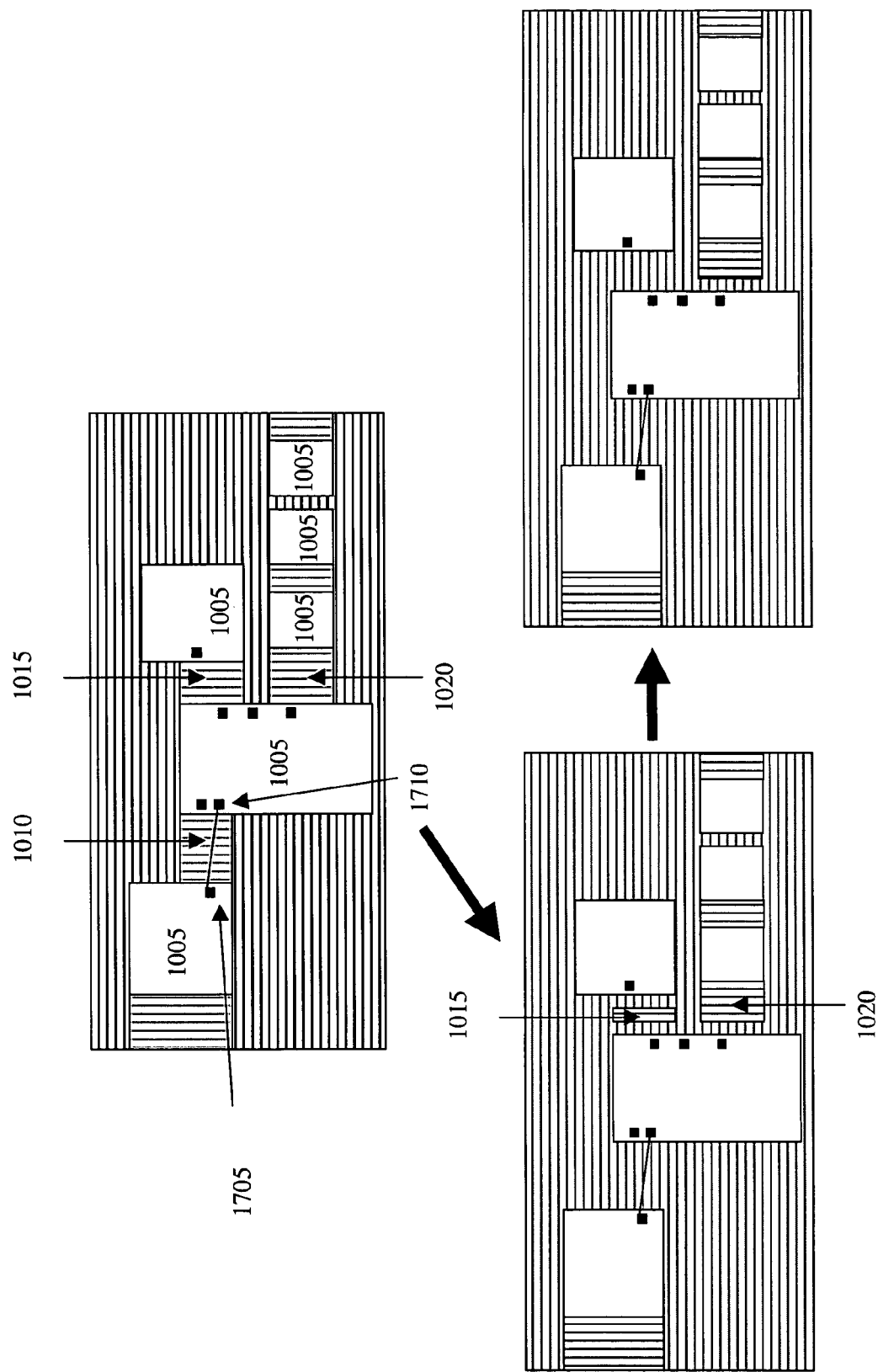
FIG. 17 illustrates another example of the pin adjustment operation.

FIG. 17 illustrates another example of the pin adjustment operation. This example is a continuation of the examples illustrated in FIGS. 10 and 12. The top layout illustration in FIG. 17 presents several pins on the sides of the macros 1005. Next, the bottom left layout illustration in FIG. 17 shows the elimination of LPDR 1010. This LPDR was eliminated because two pins 1705 and 1710 on its sides need to be connected to each other. The bottom left layout also illustrates the narrowing of LPDRs 1015 and 1020 to create corridors for accessing pins on the side of these two LPDRs. Finally, the bottom right layout in FIG. 17 illustrates the elimination of the narrowed LPDR 1015 for failing to satisfy the minimum width criteria for a vertical LPDR.

After performing the pin adjustment operation at 935, the process performs a boundary adjustment operation at 940. In some embodiments, the routability between two regions is dependent on their routing directions and the orientation of the edge separating the two regions. Specifically, when one of the wiring directions between two regions on a layer is parallel to a boundary between the two regions, then some embodiments define the capacity at the boundary between two regions as zero. Such a boundary is referred to as an impermeable boundary between the two wiring directions.

Figure 18:
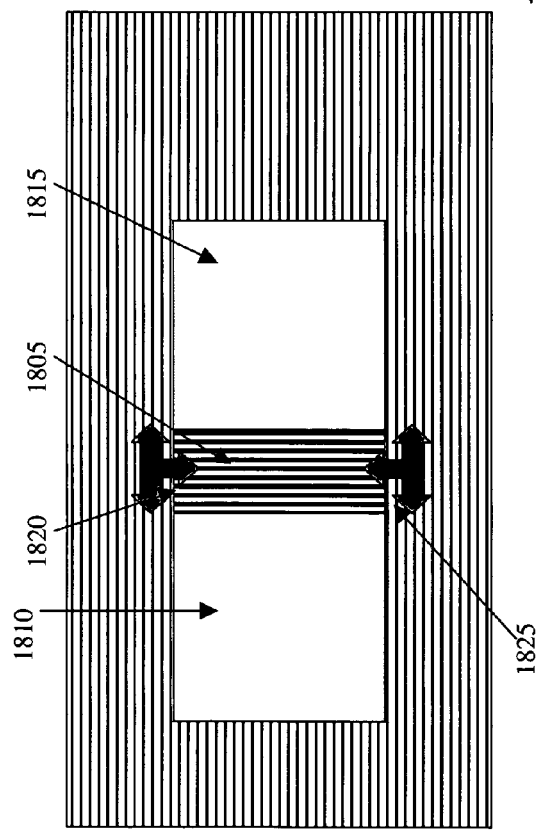
Figure 19:
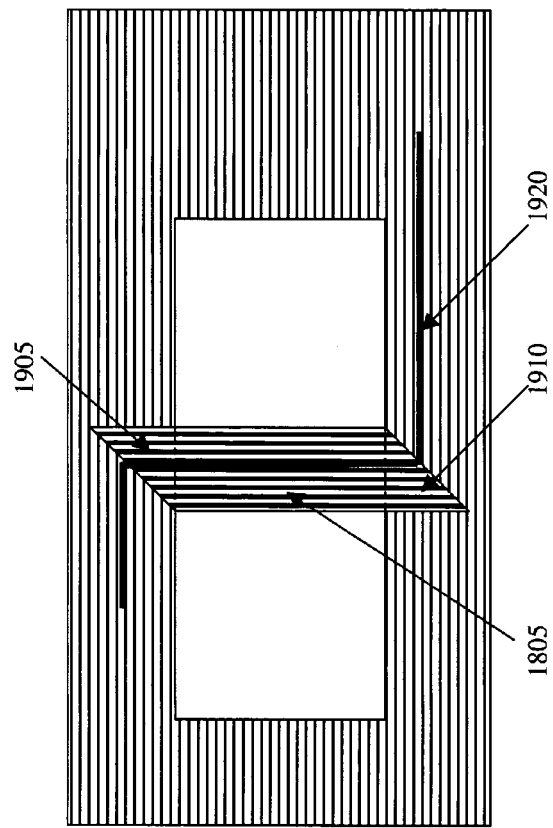

To avoid such impermeable boundaries, the process 900 performs the boundary adjustment operation at 940 that changes the boundary between two regions to eliminate any impermeable boundaries between them. FIGS. 18-20 illustrate examples of impermeable boundaries between regions on a layer and examples of eliminating such boundaries by reshaping the regions. Specifically, FIG. 18 illustrates a layer with a horizontal global preferred wiring direction and a LPDR 1805 between two macros 1810 and 1815. As shown in this figure, the LPDR 1805 has a vertical LPD. The LPDR 1805 also has horizontal top and bottom sides 1820 and 1825 that are parallel to the horizontal global preferred wiring direction of the layer. Accordingly, some embodiments define the wireflow capacity across the top and bottom sides 1820 and 1825 as zero (i.e., define these sides as impermeable sides). Such a wireflow definition is a conservative definition as a detailed router might allow non-preferred direction jogs at such boundaries.

The permeability at the boundary of the LPDR 1805 and the region with the global preferred wiring direction can be improved by modifying the shape of this boundary. For instance, FIG. 19 illustrates the addition of triangular crown regions 1905 and 1910 to the top and bottom sides of the LPDR 1805. Each triangular crown extension of the LPDR 1805 includes a 45° edge and a vertical edge. In some embodiments, the 45° edge is a permeable edge for routes to enter and exist the LPDR, while the vertical edge is an impermeable edge as it is parallel to the vertical LPD of the LPDR 1805. FIG. 19 illustrates an example of a route 1920 that traverses through the LPDR 1805 through its permeable edges.

FIG. 20 illustrates the additions of alternative triangular crown regions 2005 and 2010 to the top and bottom sides of the LPDR 1805. Each of these triangular crown extensions of the LPDR 1805 includes two 45° edges, both of which are in some embodiments, permeable edges. FIG. 21 illustrates two routes 2105 and 2110 that enter the LPDR 1805 through these permeable edges. However, as shown in FIG. 21, the route 2105 includes a non-preferred direction jog in the LPDR 1805. Hence, the added advantage of the two extra permeable edges that are provided by the crown extensions 2005 and 2010 come at the expense of requiring some routes to have non-preferred direction jogs in the LPDR.

LPDR crown extensions provide well-defined bending points for the routes. These well-defined points are only as strict as the layer direction itself. Accordingly, in some embodiments, the same kind of jogs that can run orthogonal to a routing direction can also violate the bending points in case the benefit offsets a higher price of a non-preferred-direction jog.

Some embodiments use the following approach to modify an impermeable boundary of an LPDR on a Manhattan layer. The impermeable boundary of the LPDR abuts two edges of the LPDR that abut the boundary edges of the layer or of macros on the layer. Each of these two edges is checked to determine whether it can be extended. This involves checking the bounds of the macro's edge next to it. The end-point of the edge is termed extendible if the edge can be elongated at that end-point without extending beyond the macro's edge. The amount, by which the edge needs to extend for stretching up to the obstruction edge, is the ExtendLimit. The extendibility and the ExtendLimit are determined at four points, which are two endpoints of both the edges.

The following description provides an example of the stretching logic that is performed to stretch a vertically shaped LPDR. When the LPDR can be extended at both its left top corner and right top corner, then the process discards the LPDR as there was some error in its creation. Alternatively, when the LPDR can be extended at its left top corner but not its right top corner, then the process stretches the LPDR's left edge upwards by the minimum of the LPDR width and a maximum top stretch limit. If the LPDR's left edge cannot be stretched by this minimum amount, then the LPDR is discarded in some embodiments.

When the LPDR can be extended at its right top corner but not its left top corner, then the process stretches the LPDR's right edge upwards by the minimum of the LPDR width or a maximum top stretch limit. If the LPDR's right edge cannot be stretched by this minimum amount, then the LPDR is discarded in some embodiments. When the left and right top corners of the LPDR cannot be extended, then the process connects the left edge and the right edge by a 45° edge and a 135° edge respectively. The 45° and 135° edges should not exceed the top stretch limit. If truncated, a horizontal line should connect the 45° and 135° edges. Stretching the bottom boundary of a vertical LPDR or the right and left sides of a horizontal LPDR follows an analogous set of operations for the bottom, right, and left sides of an LPDR.

Figure 22:
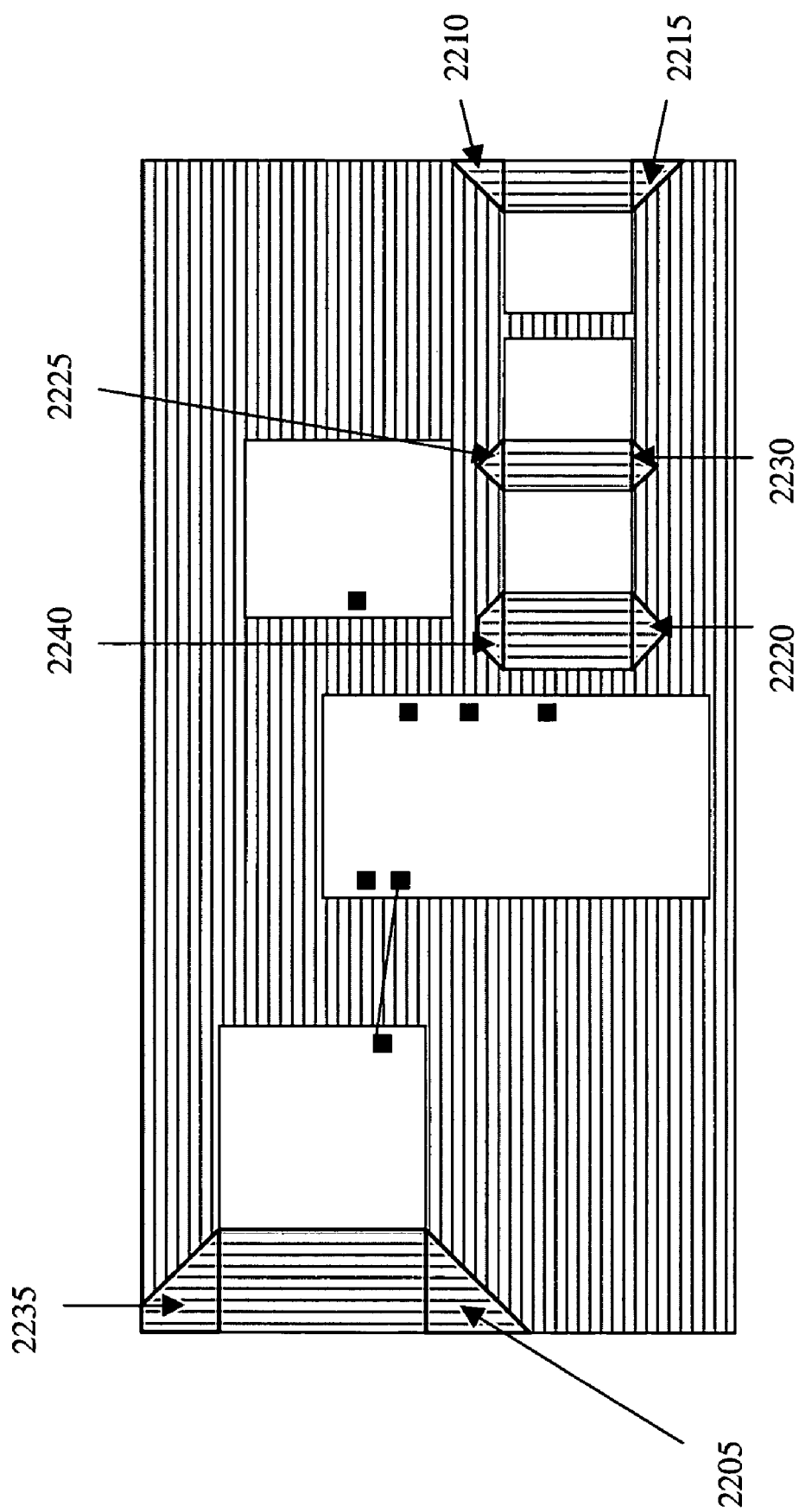
FIG. 22 illustrates an example of a boundary adjustment operation.

FIG. 22 illustrates another example of the boundary adjustment operation. This example is a continuation of the examples illustrated in FIGS. 10, 12, and 17. This figure illustrates the creation of crown extensions for each of the LPDRs with vertical LPDs. Crown extensions 2205, 2210, and 2215 are triangular extensions extended from one side of the LPDR, while crown extensions 2220, 2225, and 2230 are triangular extensions extended from both sides of the LPDR. Extensions 2235 and 2240 are four sided extensions that resulted because of the boundary of the layer or because of the minimum spacing requirement for pin access.

Some embodiments might use different rules for performing boundary adjustments on layers with diagonal global preferred directions than on layers with Manhattan global preferred directions. An LPDR, with a Manhattan LPD and a Manhattan outline on a layer with diagonal global preferred wiring, is always permeable itself. However, the LPDRs created around it can deteriorate its permeability/routability. Accordingly, for each macro on a diagonal layer that has LPDRs on two consecutive sides, some embodiments extend the two LPDRs to join them at the corner vertex where the sides meet. The modus operandi of this extension is to extend the Manhattan bound of region-end-point to a large value, and constrain the region with a diagonal bound. The bound is stretched diagonally outward from the vertex of the two consecutive sides.

Figure 23:
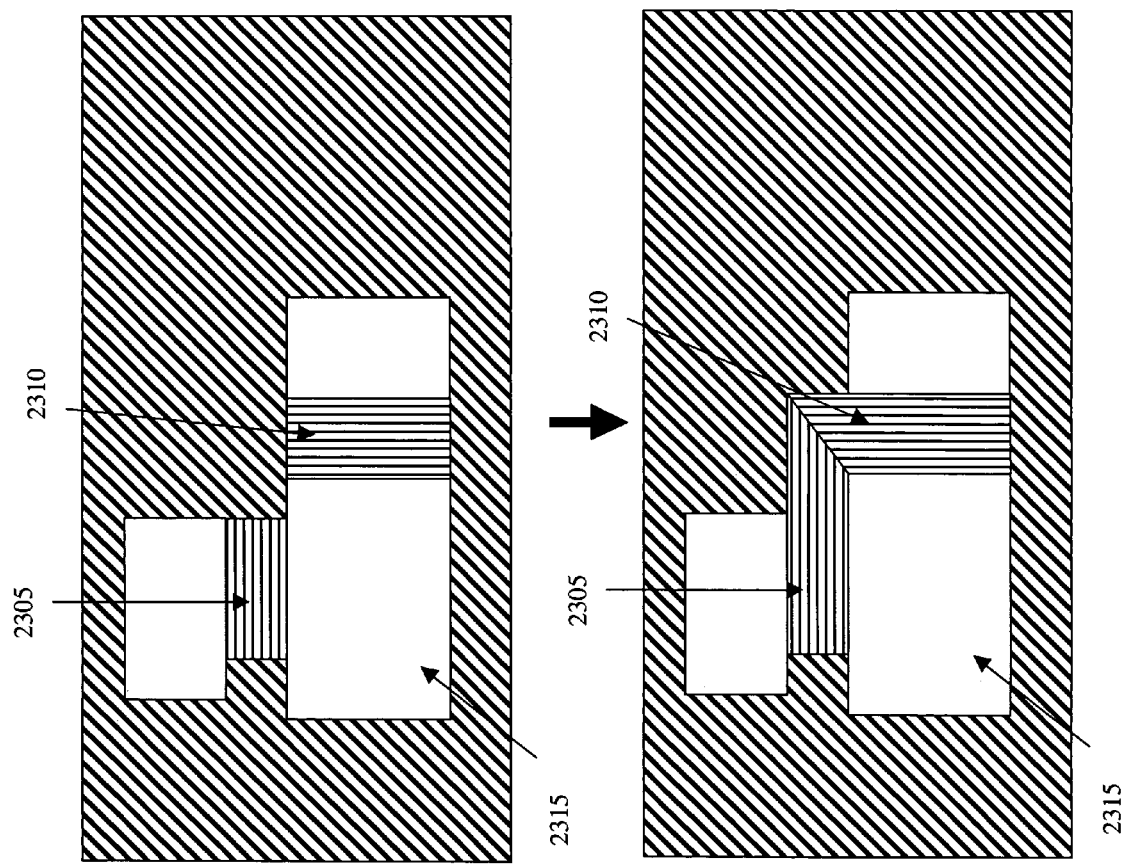
FIGS. 23-25 illustrate examples extensions of LPDRs.
Figure 24:
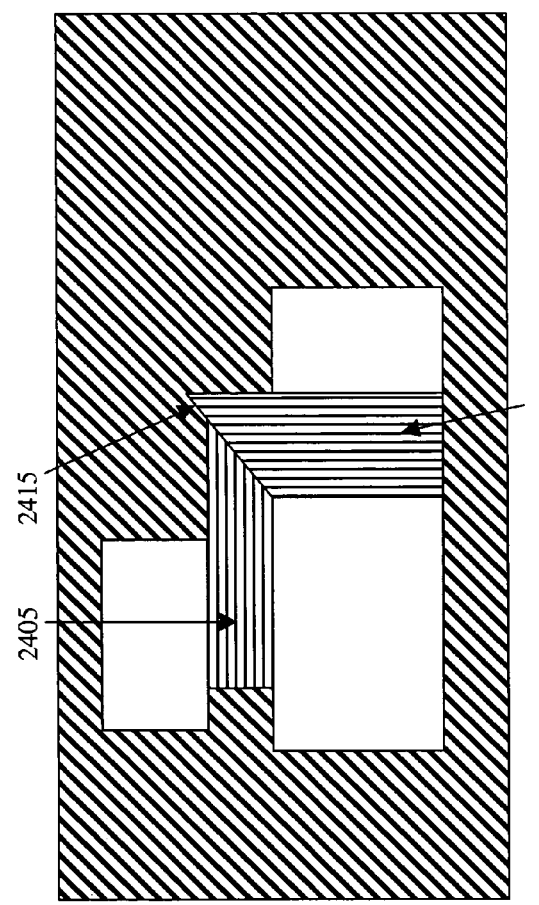
Figure 25:
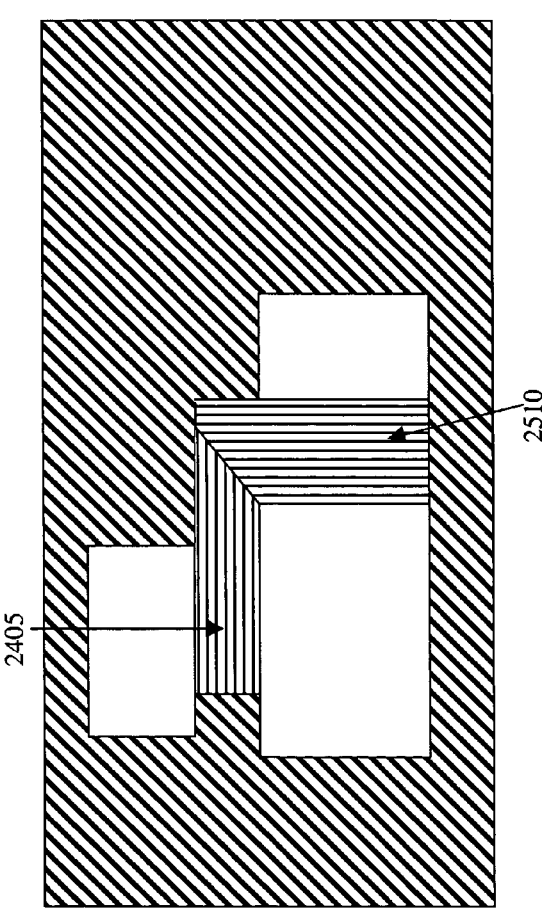

FIG. 23 illustrates an example of such an extension. Specifically, this figure illustrates expanding two LPDRs 2305 and 2310 that abut a macro 2315 to improve the routability between these LPDRs and the rest of the layer. Such a solution might lead to odd boundaries between the LPDRs, such as the contact between LPDRs 2405 and 2410 that are illustrated in FIG. 24. This contact creates an impermeable edge 2415 between the LPDR 2410 and the rest of the layer as it is parallel to the global preferred wiring direction of the layer. Such an impermeable edge is created because the height of LPDR 2405 is smaller than the width of LPDR 2410. In such cases, the two LPDRs might not be extended at all, might be extended as shown in FIG. 24 but then corrected during a manual LPDR creation by a designer, or might be extended in a manner that results in the pentagonal shape for LPDR 2510 that is illustrated in FIG. 25.

In extending LPDRs, the boundary adjustment operation at 940 might lead to the LPDRs overlapping other LPDRs. So, after the boundary adjusting operation at 940, the process 900 checks (at 945) all LPDRs on the selected layer to make sure that no two LPDRs overlap. When it identifies two LPDRs that overlap, it deletes (at 945) one of them (e.g., the smaller LPDR) in the region of the overlaps. After 945, the process determines (at 950) whether it has examined all the wiring layers. If not, the process returns to 905 to select another wiring layer and then performs the subsequent operations to potentially define one or more LPDs on this layer. When the process determines (at 950) that it has examined all the wiring layers that it needs to examine, the process ends.

2. Power Via Arrays

Power structures often reduce the routing resources that are available on the wiring layers. Power via arrays are one example of such power structures. A power via array includes a set of vias that are used to route power from power lines (also called power stripes) on the topmost metal layers down into the lower metal layers. These power stripes require Manhattan directed wiring to access the set of vias in the power array. Accordingly, as discussed above, problems in routing arise when trying to route wiring on a diagonal layer with Manhattan power stripes. As further described above, some embodiments solve this problem by defining LPDRs with Manhattan LPDs for horizontally or vertically aligned power via arrays.

Figure 26:
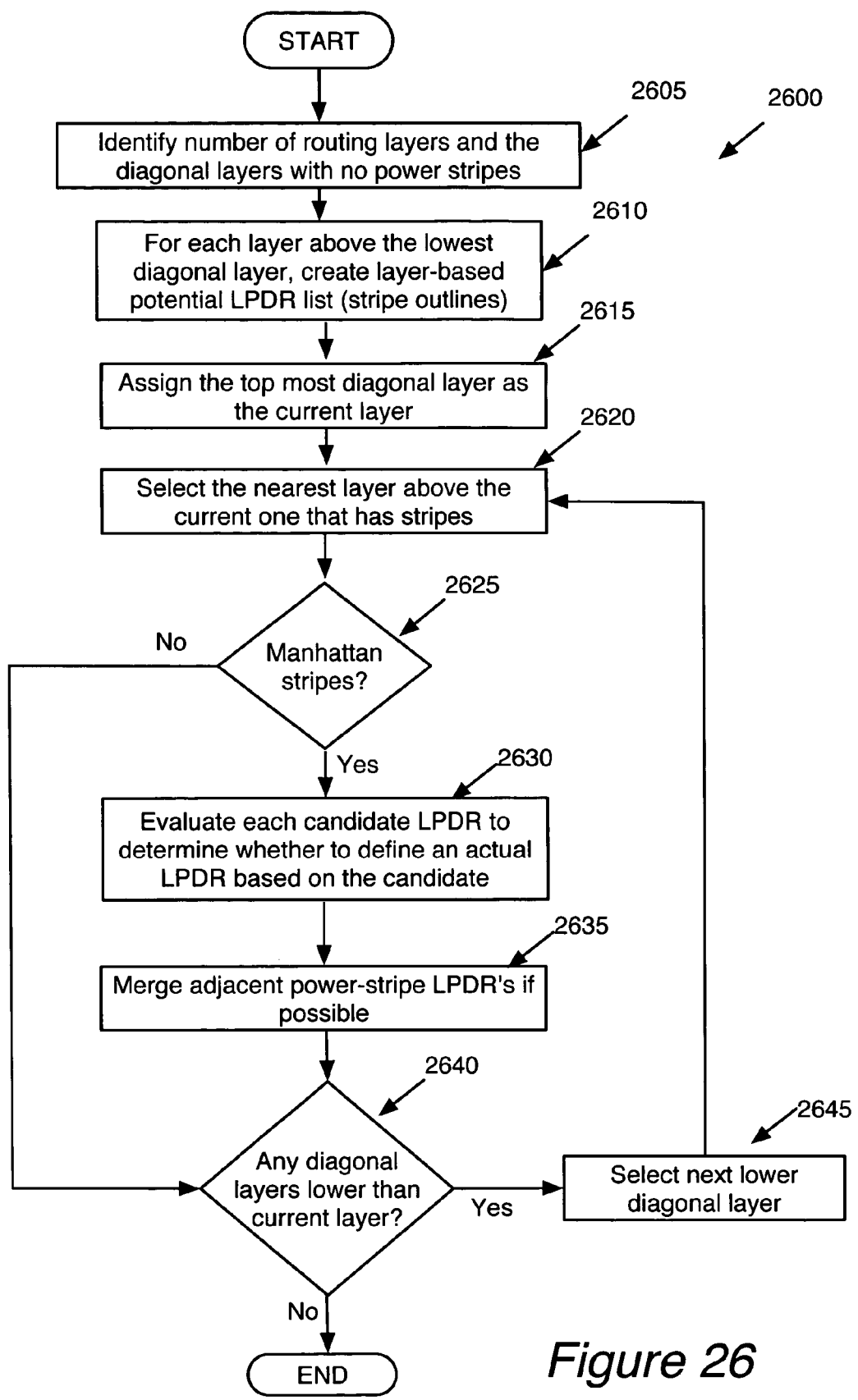
FIG. 26 illustrates a process that the LPDR generator of some embodiments uses to create LPDRs between power via arrays on diagonal wiring layers.

FIG. 26 illustrates a process 2600 that the LPDR generator of some embodiments uses to create LPDRs between power via arrays on diagonal wiring layers. This process creates LPDRs starting from the top-most diagonal layer and moves down until it finishes with all the diagonal layers. In a layer, the process considers all the power stripes in some embodiments, while considering only power stripes greater than a configurable threshold size (e.g., 100 micron) in other embodiments. The process ignores all diagonal power stripes. For each Manhattan power stripe that is greater than the threshold size, the process creates an LPDR with the same outline as the stripe. The LPD of the LPDR will be horizontal for a vertically shaped LPDR, and vertical for a horizontally shaped LPDR. For each potential LPDR, the capacity will be calculated for the Gcells containing the LPDR (with and without the LPDR). If the LPDR increases the capacity at least two-fold, the LPDR is added to the database. Otherwise, the LPDR will be discarded.

As shown in FIG. 26, the process 2600 identifies (at 2605) the number of routing layers and the diagonal layers with no power stripes. The process 2600 then iterates (at 2610) through the power and ground nets in the netclass database to identify each Manhattan power stripe that is on a layer above the lowest diagonal layer and that is larger than a particular configurable threshold size. In some embodiments, the threshold size of the Manhattan power stripe is 100 microns, although this size can be redefined by a designer. Each Manhattan power stripe identified at 2610 might be used to define an LPDR on one or more diagonal wiring layers below it, as further described below. To identify power vias, some embodiments might represent an entire power via-stack that includes multiple cuts as one via.

Next, at 2615, the process defines the Current_Layer as the topmost diagonal layer. It then selects (at 2620) the nearest layer that is above the Current_Layer and that has Manhattan power stripes. The process then determines (at 2625) whether the selected layer above the Current_Layer has a sufficient number of (e.g., ten) Manhattan power stripes. The number of power stripes that are sufficient is configurable in some embodiments.

If the process determines that the selected layer does not have a sufficient number of Manhattan power stripes, the process transitions to 2640, which will be described below. Otherwise, the process evaluates (at 2630) the outline of each particular Manhattan stripe as a potential LPDR on the Current_Layer.

Specifically, for each potential LPDR that can be defined based on each particular Manhattan stripe, the process performs (at 2630) two capacity computations for the set of Gcells that contain the potential LPDR. One capacity computation is the total capacity of all the Gcells in the set without the potential LPDR, while the other one is the total capacity of these Gcells with the potential LPDR. The capacity calculation is performed with power/ground vias taken as obstructions. When the potential LPDR fails to increase the capacity of the set of Gcells at least two-fold, the process does not define an LPDR. Alternatively, on the Current_Layer, the process defines (at 2630) an LPDR based on the outline of the particular Manhattan power stripe when the potential LPDR increases the capacity of the set of Gcells at least two-fold.

Figure 27:
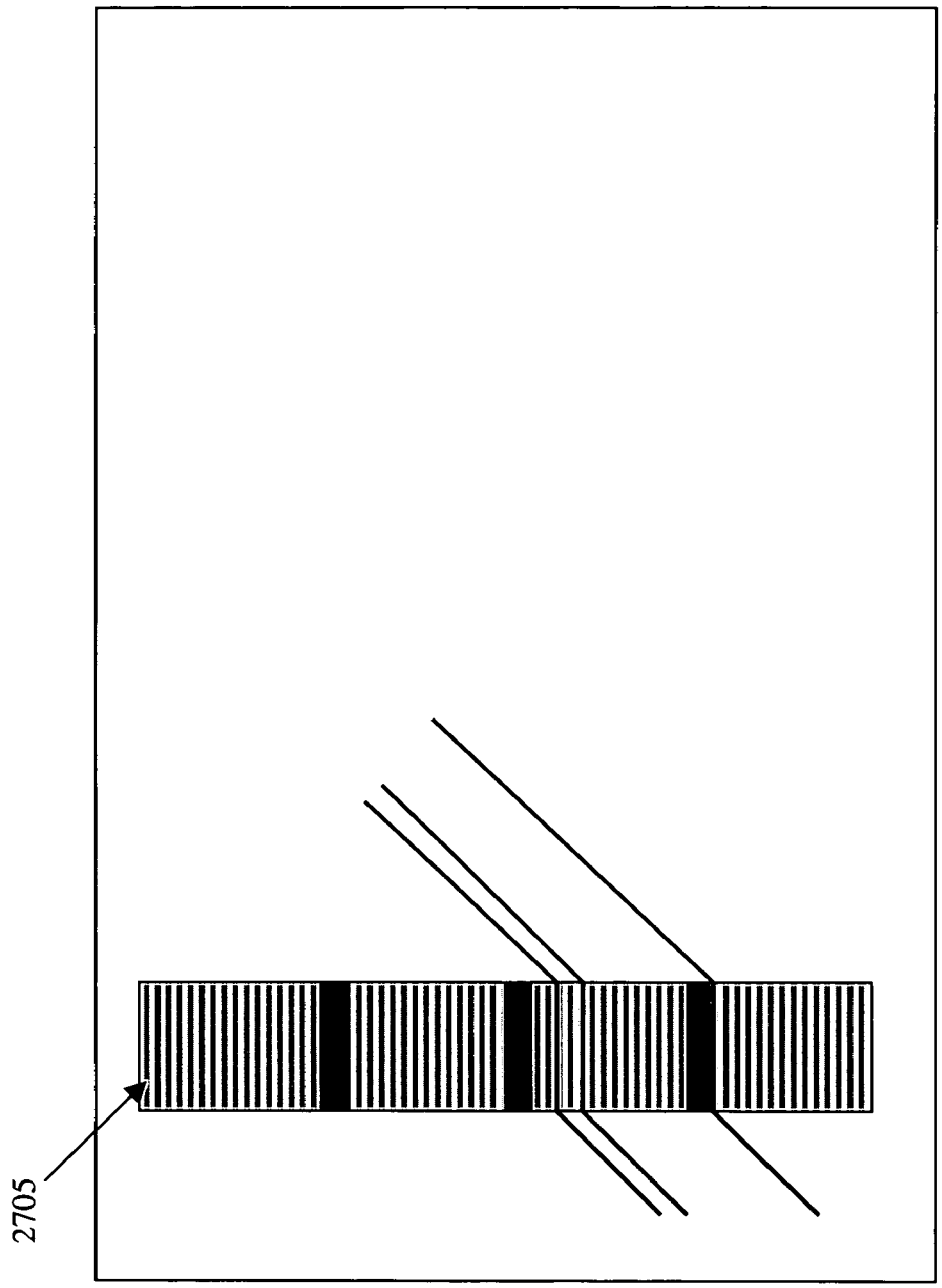
FIG. 27 illustrates an example of creating LPDRs about power structures.

FIG. 27 illustrates an example of creating LPDRs about power structures. Specifically, this figure illustrates a wiring layer that has a diagonal global preferred direction. This layer also has a region 2705 that is underneath a vertical power stripe. Hence, as shown in FIG. 27, the region 2705 can be defined as an LPDR that has a horizontal LPD. This LPD, in turn, provides horizontal routing and/or tracks that allows diagonal routing and/or tracks to pass through this region while avoiding the power-via obstacles that are defined for the vertical power stripe.

Figure 28:
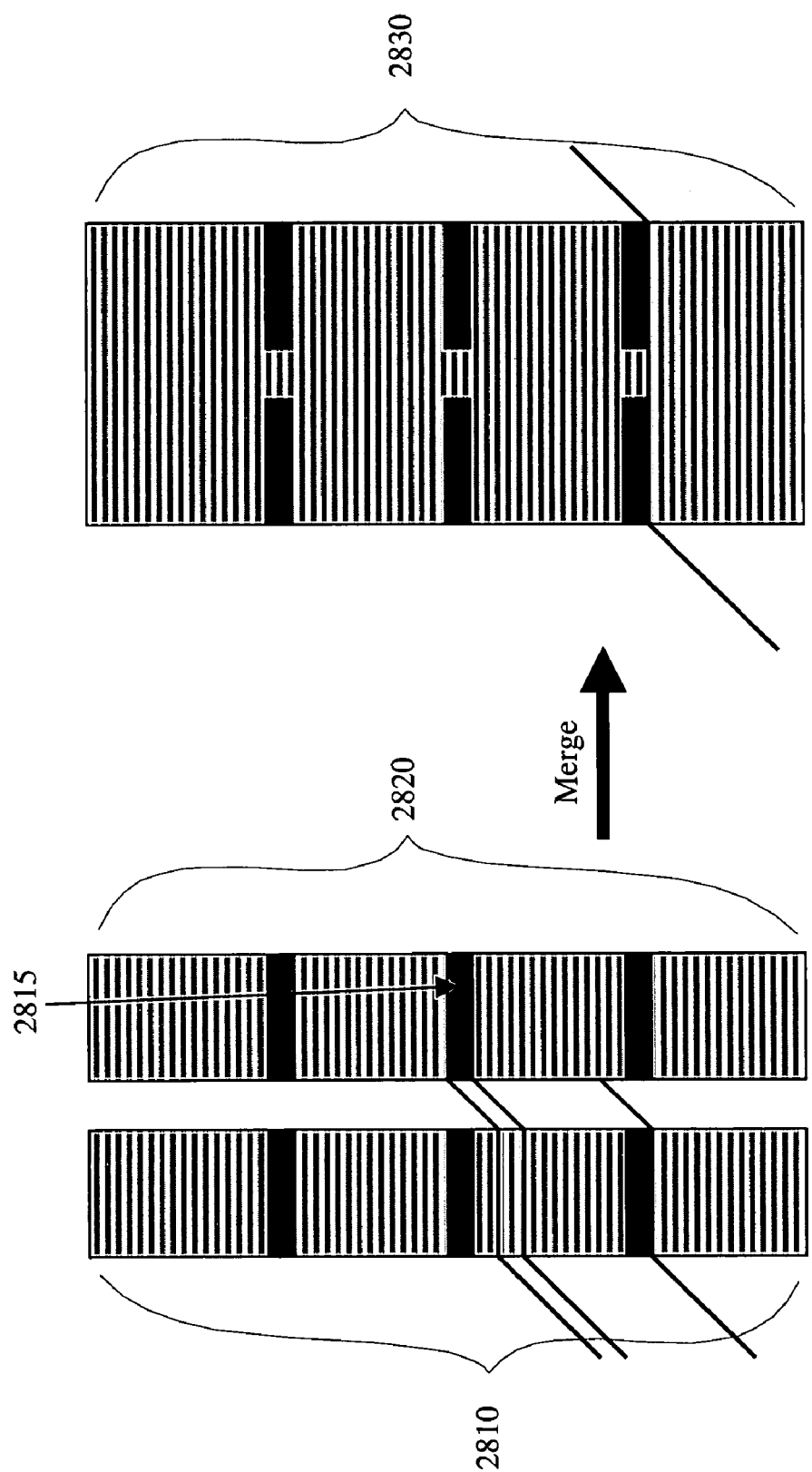
FIG. 28 illustrates the merging of the two LPDRs and to define a new LPDR.

After 2630, the process 2600 examines (at 2635) any LPDRs that it just created at 2630 to determine whether to merge adjacent LPDRs. Defining LPDRs for adjacent power stripes might create unusable channels between the LPDRs. FIG. 28 illustrates two LPDRs 2810 and 2820 that are defined for two different power stripes. In this example, the LPD in each LPDR is horizontal and the global preferred wiring direction of the layer is 45° diagonal. As shown in this figure, the wiring that leaves the LPDR 2810 that is defined for one power stripe can run into a power via stack 2815 in the LPDR 2820 of the other power strip.

FIG. 28 illustrates the merging of the two LPDRs 2810 and 2820 to define a new LPDR 2830. The "merged" LPD region 2830 is defined to encompass the region of both power stripes and has the same local preferred direction as the LPD of the replaced LPDRs 2810 and 2820. This merging allows the wiring to traverse efficiently across the region underneath the power stripes without the obstruction that existed when the two LPDRs 2810 and 2820 were separate.

Some embodiment merge power-stripe LPDRs that are closer than 10% of the stripe-width. Some embodiments perform the merging after the capacity-increase-based LPDR filtering because they assume that a region that does not gain capacity from a change to its routing direction, will not gain capacity even if merged with another LPDR. Other embodiments, however, might account for the merging while performing the capacity estimation and determining whether to define an LPDR.

In some embodiments, the merging operation merges two aligned (e.g., horizontally aligned) LPDRs by extending one LPDR (e.g., the LPDR to the left) towards the other LPDR (e.g., the LPDR to the right). The formula below quantifies the horizontal extension (HExt) of leftside LPDR towards a rightside LPDR:

$$HExt = (HSeparationOfStripe - viaStackOffset) \bmod interval,$$

where HSeperationOfStripe is the horizontal separation of the power stripes, viaStackOffset is the amount of offset between the via stack in the left stripe and the via stack of the right stripe, and interval is the distance between the two via stacks that are part of the stripe corresponding to the left LPDR. Some embodiments put a ceiling on the extension to make sure that not more than a particular percent of the layer is converted to LPDRs. For example, a Horizontal extension will take place only if the value is less than the stripe's width. A value greater than the ceiling is ignored, as it would not be helpful to draw anything less than the horizontal value. Hence, in such cases, some embodiments do not define the LPDR that would need to surpass the ceiling.

A second step after the extensions would be to check whether an LPDR has extended into the next LPDR. If so, the merging operation merges the definition of the two LPDRs, provided that they pass a capacity constraint, which will be described below. The above-described approach assumes that the via-stacks within a stripe are placed at regular intervals, that the interval remains the same for the two stripes being considered, and that power-vias do not lie outside the stripes. Some embodiments incorporate a check for such requirements at the beginning of the merging operation.

As mentioned above, the merging operation at 2635 performs another capacity-increase-based filtering. Unaligned vias can cause the failure of capacity increase. In case of a failure, the process in some embodiments discards the merged LPDR. Instead of performing a post-processing operation to merge LPDRs for adjacent power stripes, some embodiments might generate larger LPDRs at 2630 that account for the need to have a combined LPDR for adjacent power stripes.

After 2635, the process determines (at 2640) whether there is any diagonal layer lower than the Current_Layer. If so, the process selects (at 2645) the next lower layer, designates this layer as the Current_Layer, and transitions back to 2620, which was described above. Otherwise, the process ends.

Some embodiments define LPDRs about power structures in view of certain constraints. For instance, some embodiments do not create LPDRs around overlapping power stripes. In some cases, a designer has to manually analyze the LPDRs to ensure that this constraint is met. Also, as mentioned above, the LPDR generator in some embodiments first defines LPDRs about power structures and then defines LPDRs between the macros. Accordingly, the LPDR generator in some embodiments does not check whether the power-based LPDRs overlap any other existing LPDRs. In fact, the LPDR generator might delete all pre-existing LPDRs before creating any power-based LPDRs on a layer.

Figure 29:
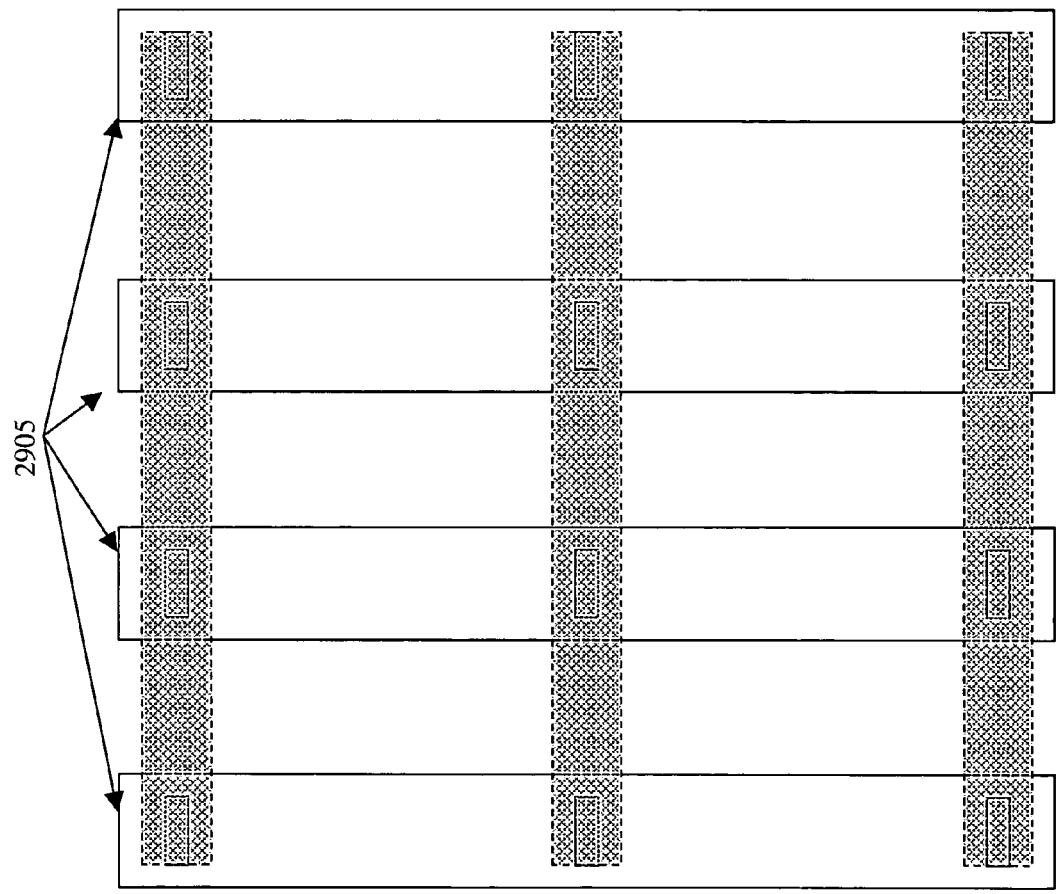
FIG. 29 illustrates an example of an alternative embodiment of the invention.

FIG. 29 illustrates an example of an alternative embodiment of the invention. This figure illustrates the outlines 2905 of several power stripes on a layer. It also illustrates several LPDRs that are orthogonal to the outline of the power stripes, instead of being defined parallel and in between the stripes.

B. Manual LPDR Generation

U.S. patent application Ser. No. 11/005,316, entitled "Local Preferred Direction Architecture, Tool, and Apparatus," filed concurrently with the present application, describes the GUI of the LPDR generator of some embodiments of the invention. This application is incorporated herein by reference.

III. Global Routing

Routing is at times performed in two stages, a global routing stage and a detailed routing stage. Global routing provides a general routing plan for nets in a layout. Detailed routing provides the specific routing plan for nets in a layout.

In the embodiments described below, the router partitions an IC-layout region into several square sub-regions. For each net being routed, the router then identifies a global route that connects the set of sub-regions that contain at least one pin of the net. Each net's global route is a set of edges (i.e., interconnect lines) that connects the set of sub-regions that contain the net's pins. The identified routes might have horizontal, vertical, and ±45° diagonal edges in the embodiments described below.

These edges are defined within a routing graph (also called a Groute graph) that is first described below. The overall flow of the router is then described, followed by a discussion of the computation of the capacity of edges in the routing graph in view of the local preferred directions of the layout.

A. Routing Graph

In some embodiments, the router uses two grids to create a Groute graph. The first grid is a coarser grid that divides the IC layout into a number of sub-regions, called Gcells. The second grid is a finer grid that divides each Gcell into four sub-regions. In the embodiments described below, the Gcells are square. This shape supports ±45° routing, as any set of ±45° wiring tracks that cut through a square Gcell will fill its horizontal and vertical boundaries consistently. One of ordinary skill will realize that other embodiments might use different shaped Gcells.

On each wiring layer, each of the four sub-regions in each Gcell is represented by a node at the center of the sub-region. The embodiments described below use the coarser grid to measure route congestion in the layout region, and use the finer grid to measure route lengths. Accordingly, below, the coarser grid is referred to as the congestion grid, while the finer grid is referred to as the length grid.

Figure 30:
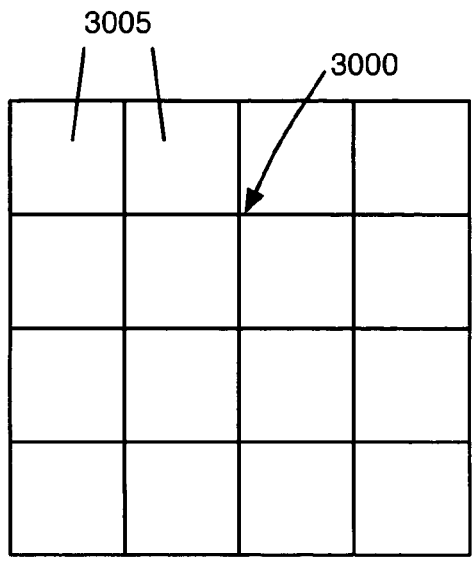
FIGS. 30-32 illustrate small sections of congestion and length grids.
Figure 31:
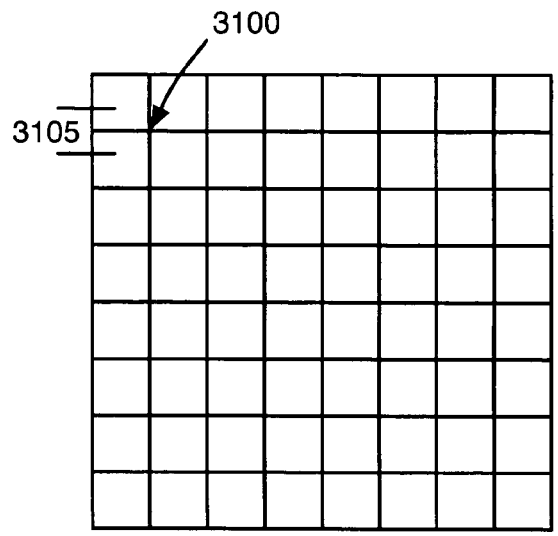

FIGS. 30 and 31 illustrate small sections of the congestion and length grids. As shown in these figures, intersecting horizontal and vertical lines form both these grids. FIG. 30 illustrates a 4×4 section of the congestion grid 3000. This section divides a portion of an IC region into 16 Gcells 3005. In the embodiments described below, the congestion grid divides the IC region into many more Gcells (e.g., tens or hundreds of thousands).

Figure 32:
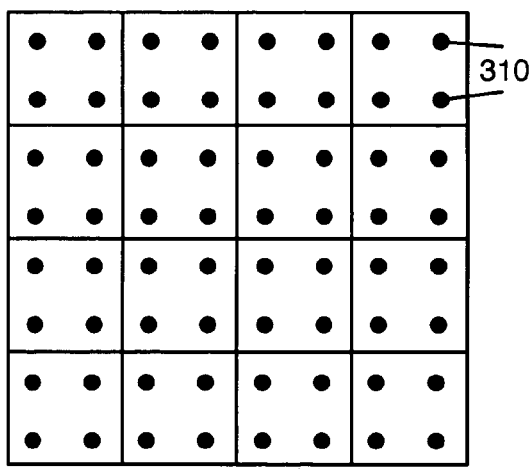

FIG. 31 illustrates a section of the length grid 3100 that corresponds to the section of the congestion grid 3000 illustrated in FIG. 30. As shown in this figure, the length grid divides each Gcell 3005 into four nodes 3105 on each wiring layer. FIG. 32 illustrates the four nodes in each Gcell on a particular layer. There are a number of planar and non-planar edges between the nodes defined by the length grid 3100. These edges are referred to as "node edges" in the discussion below.

A planar node edge connects two adjacent routing-graph nodes. Each such edge represents a set of wiring tracks along the edge's particular direction that connect the two sub-regions represented by the edge's two nodes. Planar node edges have different directions on different wiring layers.

Several examples of planar edges are illustrated in FIGS. 33-41. The first set of these examples, which are illustrated in FIGS. 33-36, ignore possible local preferred directions on the wiring layers, in order to simply convey the notion of the planar edge on a layer. The next set of examples, which are presented in FIGS. 37-41, then provide illustrations of planar edges on layers with more than one preferred direction (e.g., a layer with a global preferred direction and one or more local preferred directions).

Ignoring possible local preferred directions, FIGS. 33-36 illustrate planar edges on layers 2-5 along the global preferred directions of these layers in some embodiments. Some embodiments assume that there are no planar node edges between routing-graph nodes on layer 1, as this layer is often quite congested. Some of these embodiments promote all the pins on layer 1 to layer 2. Other embodiments, however, specify planar node edges on layer 1. In some of these embodiments, the planar node edges on layer 1 are in the same direction as planar node edges on layer 3.

Figure 33:
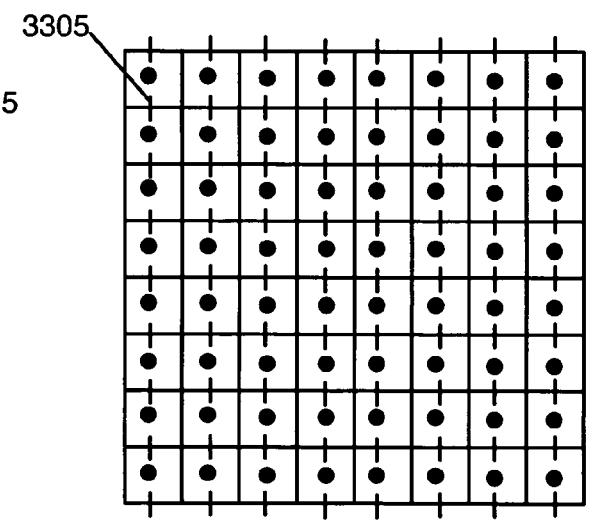
FIGS. 33-41 illustrate several examples of planar edges within the routing grids.
Figure 34:
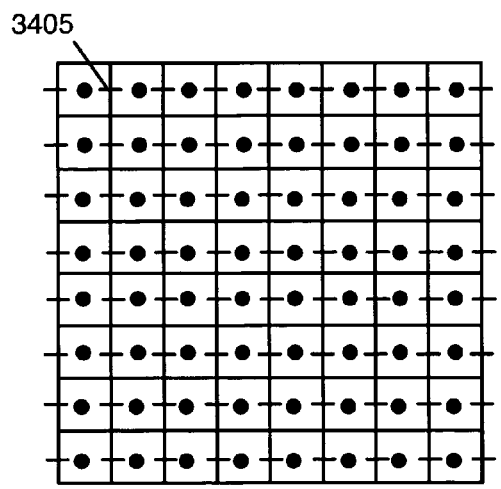

FIG. 33 illustrates that on layer 2 a vertical node edge 3305 exists between each pair of vertically adjacent nodes in a region on layer 2 that is to be routed according to the vertical global preferred direction of layer 2. FIG. 34 illustrates that on layer 3 a horizontal node edge 3405 exists between each pair of horizontally adjacent nodes in a region on layer 3 that is to be routed according to the horizontal global preferred direction of layer 3.

Figure 35:
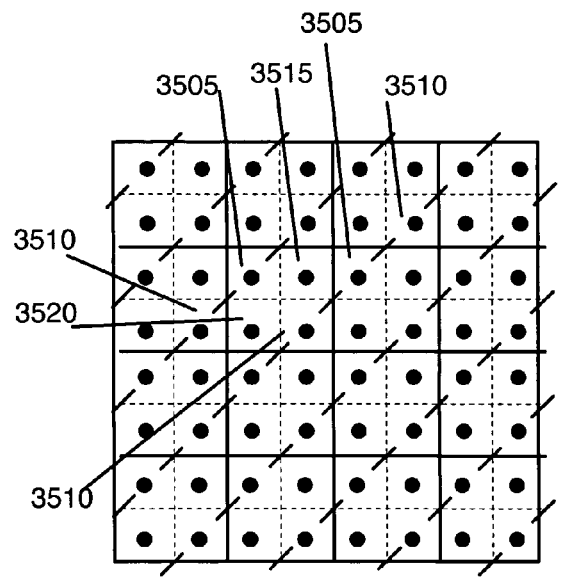
Figure 36:
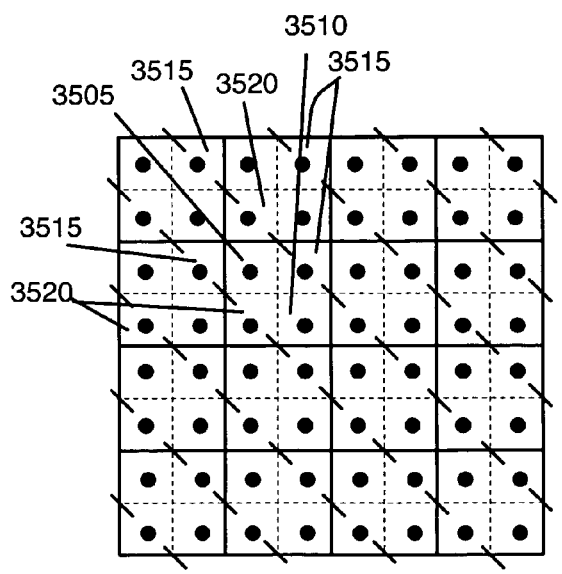

FIG. 35 illustrates that 45° diagonal node edges exist between northwest nodes 3505 and southeast nodes 3510 of different Gcells in a region on layer 4 that is to be routed according to the 45° diagonal global preferred direction of layer 4. As shown in this figure, no 45° diagonal node edges are incident on northeast nodes 3515 and southwest nodes 3520. FIG. 36 illustrates that −45° diagonal node edges exist between northeast node 3515 and southwest nodes 3520 of different Gcells in a region on layer 5 that is to be routed according to the −45° global preferred direction of layer 5. As shown in this figure, no −45° diagonal node edges are incident on northwest nodes 3505 and southeast nodes 3510.

For embodiments that allow local preferred directions on layers 2-5, FIGS. 37-40 illustrate potential planar edges along potential local preferred directions on layers 2-5. These edges are potential edges as they would only be defined if the nodes that they connect fall within regions that have their local preferred directions coincide with the direction of the edges.

Figure 37:
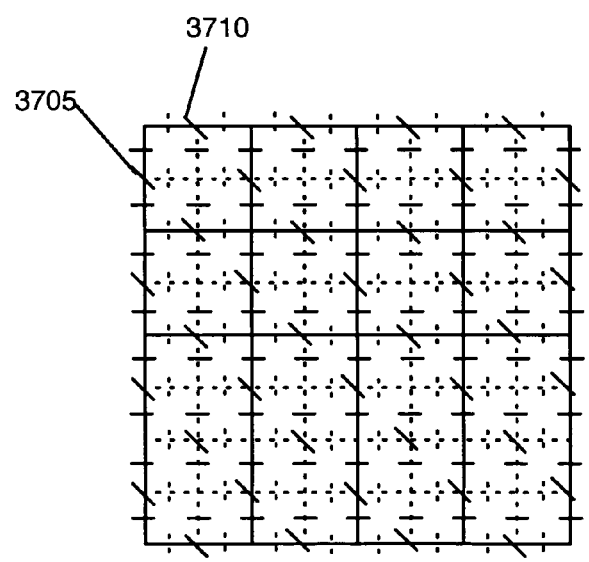

For instance, for layer 2, FIG. 37 illustrates a potential horizontal node edge 3705 between each pair of horizontally adjacent nodes and a potential −45° edge 3710 between northeast and southwest nodes of different Gcells on layer 2. The horizontal edges 3705 would only be defined when the nodes that they connect fall within regions on layer 2 that have a horizontal local preferred direction. Similarly, the −45° edges 3710 are only defined when the nodes that they connect fall within regions on layer 2 that have a −45° local preferred direction.

Figure 38:
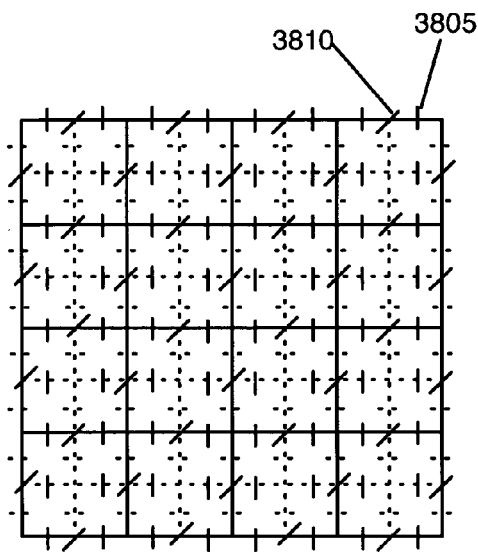
Figure 39:
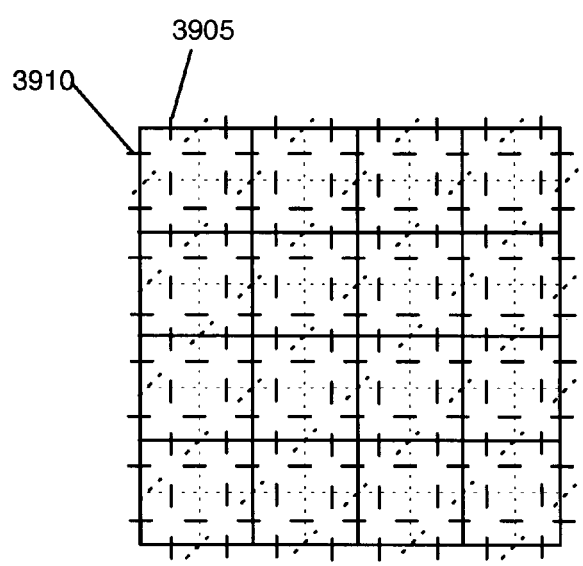
Figure 40:
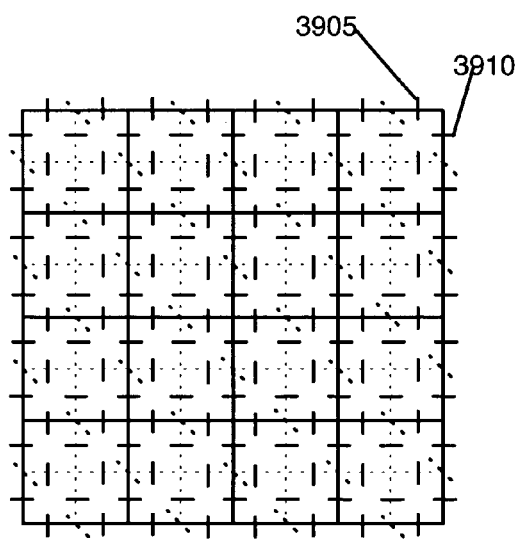

For layer 3, FIG. 38 illustrates a potential vertical node edge 3805 between each pair of vertically adjacent nodes and a potential 45° edge 3810 between northwest and southeast nodes of different Gcells on layer 3. For layers 4 and 5, FIGS. 39 and 40 illustrate a potential vertical node edge 3905 between each pair of vertically adjacent nodes and a potential horizontal node edge 3910 between each pair of horizontally adjacent nodes on layers 4 and 5.

Figure 41:
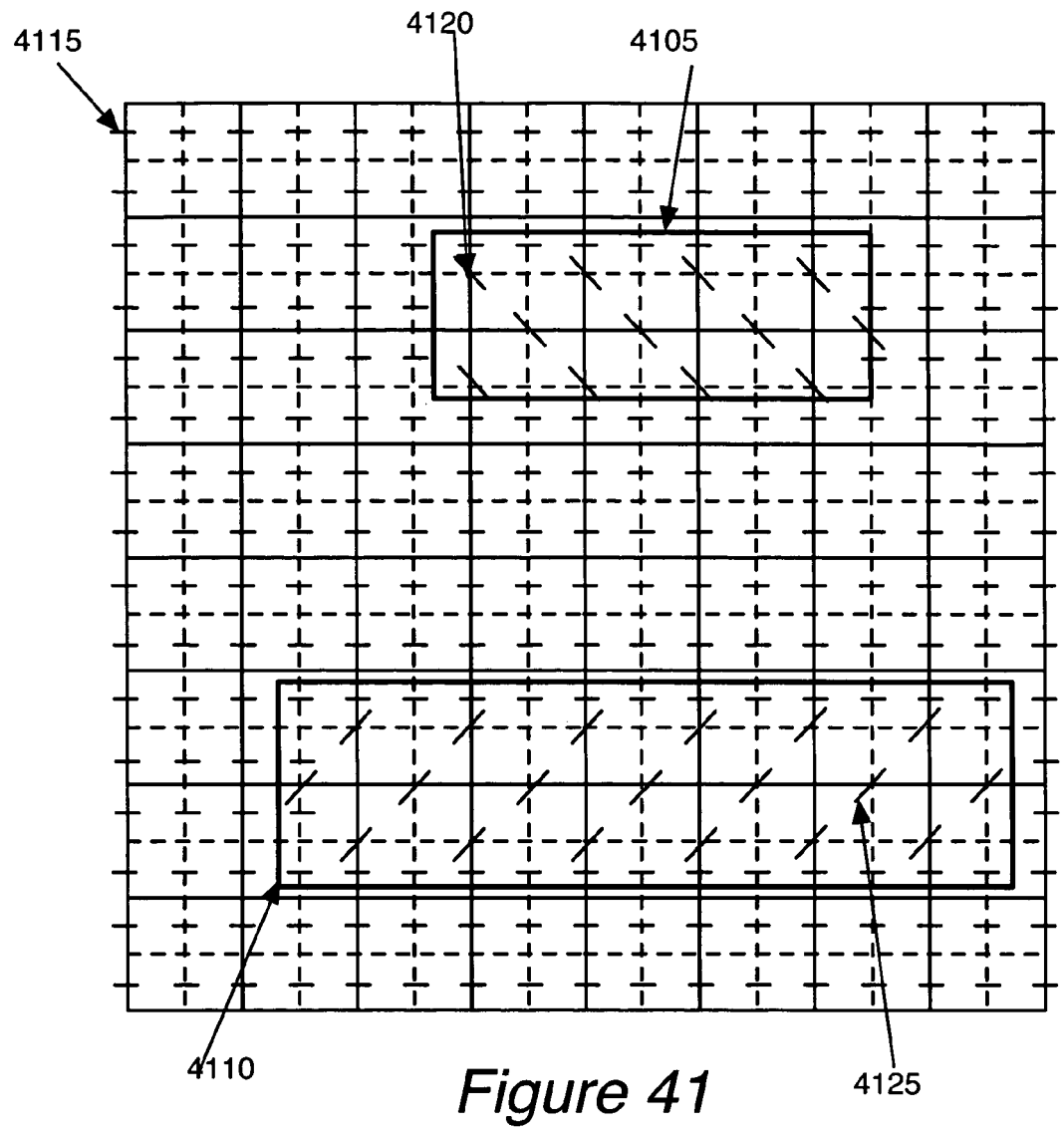

As shown in FIGS. 37-40, some embodiments allow only one diagonal direction on any layer. Some embodiments allow different diagonal directions for planar edges on the same layer, but never on the same Gcell boundary. FIG. 41 illustrates an example of a routing graph for layer 3 in a case where layer 3 has a horizontal global preferred direction and two regions 4105 and 4110 that respectively have a −45° and +45° local preferred directions.

This figure illustrates numerous horizontal planar edges 4115 between horizontally adjacent nodes on layer 3 that are not within regions 4105 and 4110. It also illustrates numerous horizontal planar edges 4115 between horizontally adjacent nodes along the boundaries of the regions 4105 and 4110, when the sub-regions represented by these nodes is not entirely within the regions. This figure also illustrates several −45° planar edges 4120 in region 4105, and several 45° planar edges 4125 in region 4110. The directions of these planar edges coincide with the local preferred directions of the two regions 4105 and 4110.

In some embodiments, each Manhattan node edge has a unit length cost (L). In these embodiments, each diagonal node edge has a length cost that equals the unit length cost times the square root of two ($L*\sqrt{2}$). Also, the use of a node edge across a Gcell boundary reduces the capacity of the boundary, and is thereby assessed a wire congestion cost.

The router examines wire congestion at Gcell boundaries on each layer available for routing. Specifically, the router computes capacities at Gcell boundaries on each routing layer. On a particular layer, the wiring resources (i.e., wiring tracks) across a Gcell boundary can be conceptually represented as a planar "congestion edge" across that boundary on the particular layer. The capacity of a congestion edge between two Gcells is the wiring capacity for all available wiring directions between the two Gcells.

Figure 42:
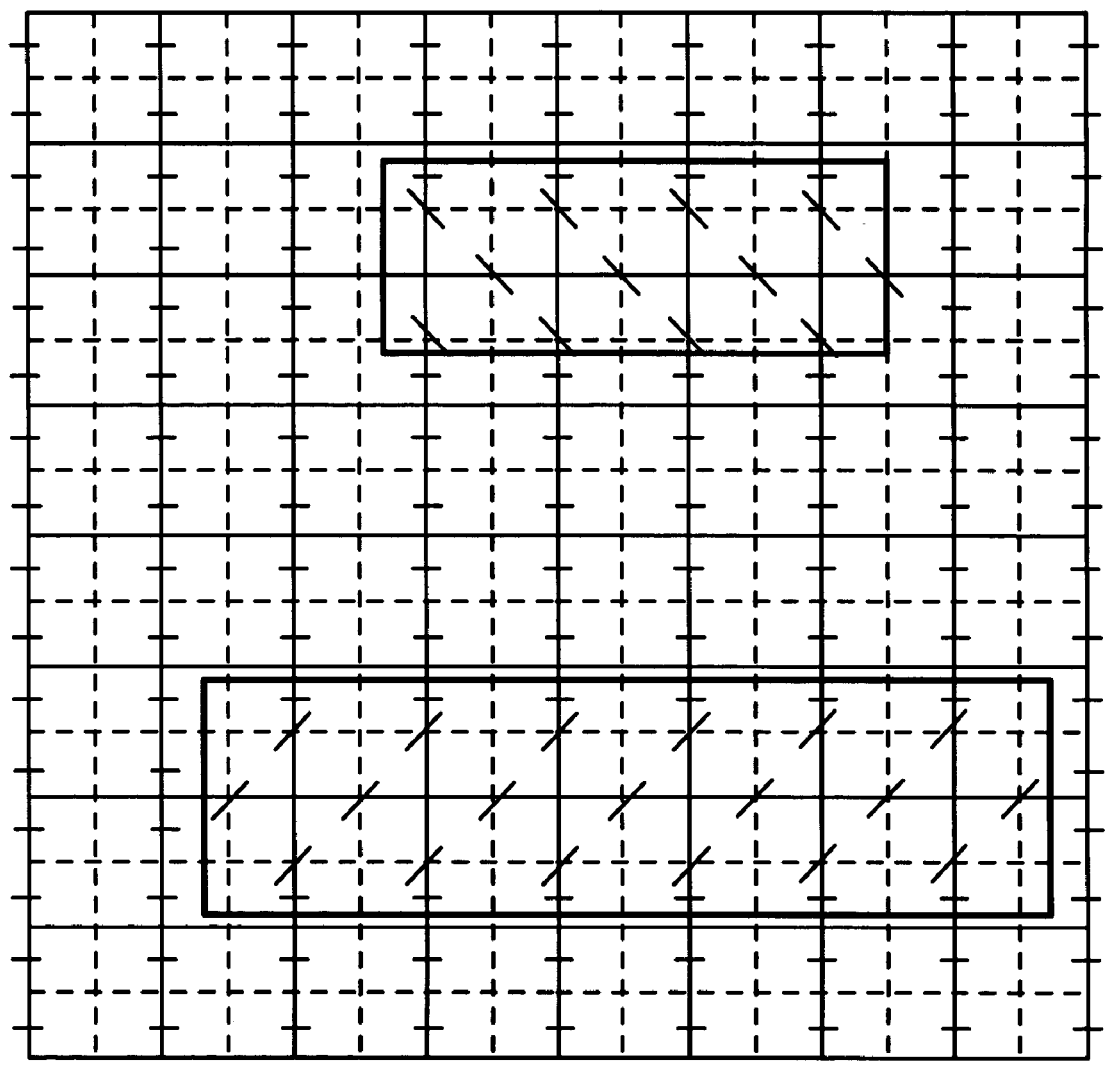
FIG. 42 illustrates an example of the planar congestion edges that are used to measure congestion along a layer for the example illustrated in FIG. 41.

For a boundary between two Gcells that do not fall in a region with a local preferred direction that is different than the layer's global preferred direction, the allowed wiring direction is the global preferred direction. For a boundary between two Gcells that fall within two or more regions with different preferred directions, the allowed wiring directions are the two or more wiring directions in some embodiments. FIG. 42 illustrates an example of the planar congestion edges that are used to measure congestion along layer 3 for the example illustrated in FIG. 41.

As illustrated in FIGS. 33 and 34, up to two vertical or horizontal planar edges can cross the boundary between each pair of vertically or horizontally adjacent Gcells in some embodiments. In addition, as illustrated in FIGS. 37-40, a diagonal edge can cross the boundary between two Gcells. Hence, the congestion along two horizontally aligned Gcells can be attributable to obstacles or routes along the two horizontal planar edges and the one diagonal planar edge that cross the boundary between these Gcells. Similarly, the congestion along two vertically aligned Gcells can be attributable to obstacles or routes along the two vertically planar edges and the one diagonal planar edge that crosses the boundary between these Gcells.

B. Overall Flow of the Router

Figure 43:
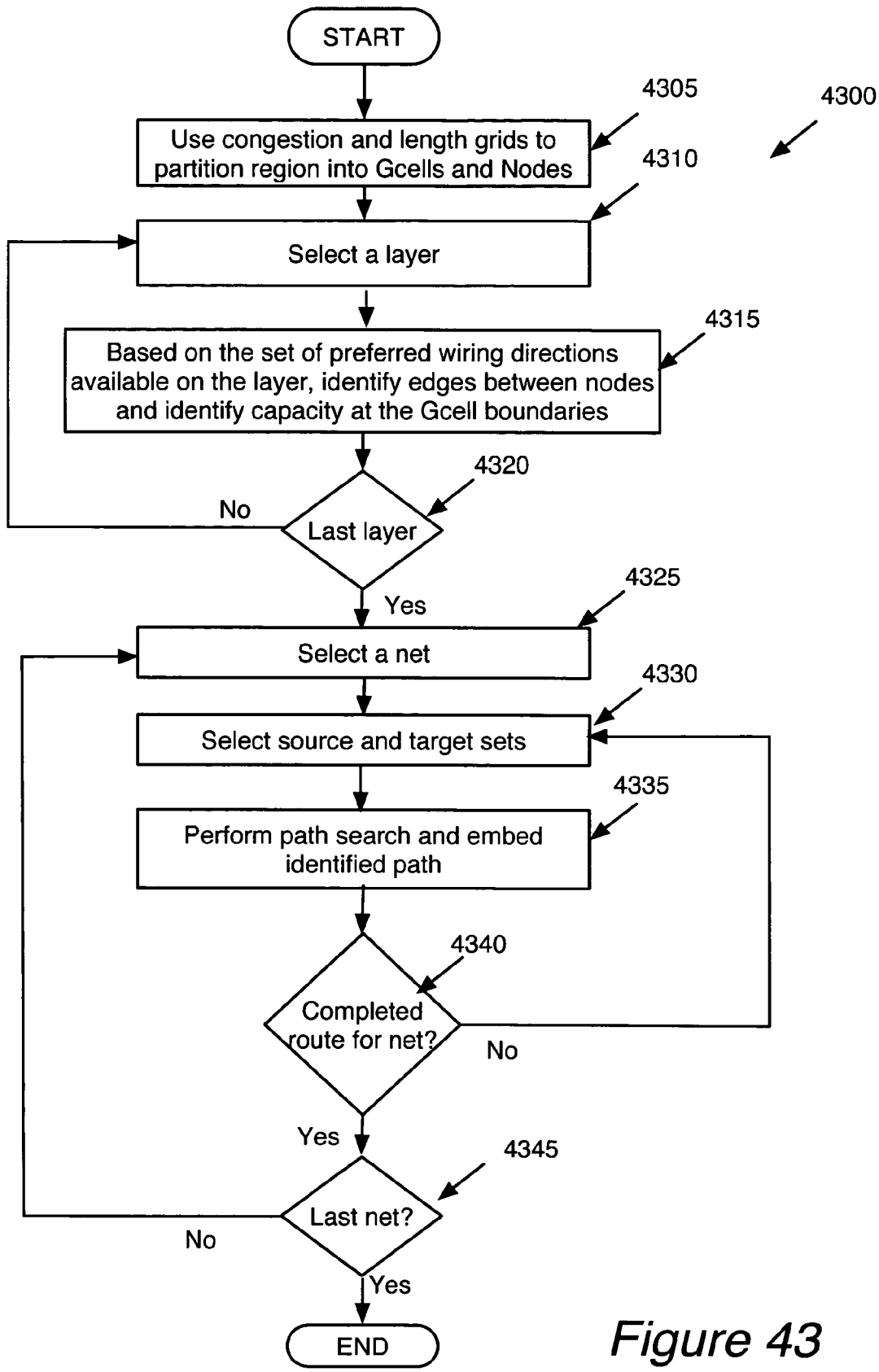
FIG. 43 illustrates a process that conceptually represents the overall flow of the router in some embodiments of the invention.

FIG. 43 illustrates a process 4300 that conceptually represents the overall flow of the router in some embodiments of the invention. As shown in this figure, the process 4300 initially uses (at 4305) the congestion and length grids 3000 and 3100 to partition the IC layout region into numerous Gcells, with four nodes on each routing layer in each Gcell. As described above, these Gcells and nodes define a Groute graph in which the router defines and embeds routes. The Groute graph includes a grid for each wiring layer.

Next, at 4310, the process selects one of the wiring layers. The process then identifies (at 4315) edges between the nodes of the routing graph for the selected layer, based on the global preferred wiring direction and the local preferred wiring directions (if any) of the selected layer. As described above by reference to FIGS. 37-40, the routing graph for each layer includes numerous potential horizontal, vertical, and diagonal edges. Hence, at 4315, the process examines each potential edge in the routing graph of the selected layer. The process specifies an actual edge in the selected layer's routing graph for each potential edge that matches a certain set of criteria. This identification process will be further described in Section C below.

At 4315, the process also defines the capacity at each Gcell boundary on the selected layer based on the global preferred wiring direction and the local preferred wiring directions (if any) of the selected layer. As mentioned above, on a particular layer, the wiring resources (i.e., wiring tracks) across a Gcell boundary can be conceptually represented as a planar "congestion edge" across that boundary on the particular layer. The capacity of a congestion edge between two Gcells is the wiring capacity for all available wiring directions between the two Gcells.

Different embodiments compute the capacity of edges in the global routing graph differently. For instance, some embodiments compute the capacity of edges in the Groute graph that correspond to regions in the layout with multiple different preferred directions based on novel capacity estimation techniques, while computing the capacity of edges in the Groute graph that correspond to regions in the layout with only one preferred direction based on existing capacity estimation techniques. Edge capacity computations will be further described in Section D below.

At 4315, the process also computes the via capacity for each Gcell. Different embodiments compute the via capacity differently. In a given Gcell, some embodiments compute the via capacity based on an area-based sampling of open areas within the Gcell. Other embodiments compute the via capacity between two adjacent layers in a Gcell as a user-adjustable constant times the maximum of all capacities of planar congestion edges into the Gcell on either of the layers.

After 4315, the process determines (at 4320) whether it has examined each wiring layer. If not, the process returns to 4310 to select another layer, and then performs the edge identification and capacity computations for this layer 4315. When the process determines that it has examined each routing layer, it transitions to 4325.

At 4325, the process selects a net for routing. It then specifies (at 4330) source and target sets for performing a path search for the selected net, and then performs a path search at 4335. For the first path search that the process performs to define a route for the selected net, the process often selects a node set that is associated with a particular pin of the net as the target set and specifies the nodes of the nearest K pins (where K can be 1) of the net as the source set. The nodes include any Steiner nodes that might have been defined for the net. For any additional path search that is performed to define the route for the selected net, the process defines (1) the target set as all the nodes that are associated with the routed pins and Steiner points of the net, and all nodes that are currently on the one or more paths embedded for the net during the current route generation, and (2) the source set as all nodes associated with any unrouted pin and Steiner point in the net's configuration that are within a certain distance of the target set.

The path search performed at 4335 is an A* path search that at each iteration tries to extend a partial solution with the best estimated cost. Specifically, during its path exploration phase, the process starts its path search by specifying the start of one or more paths from one or more source nodes. It then iteratively identifies one or more path expansions about the lowest cost path, until it identifies a path that connects a source node and a target node. Each identified expansion about a path is from a "current node" (also called "start node") reached by the path being extended to a "destination node" that neighbors the current node.

Figure 44:
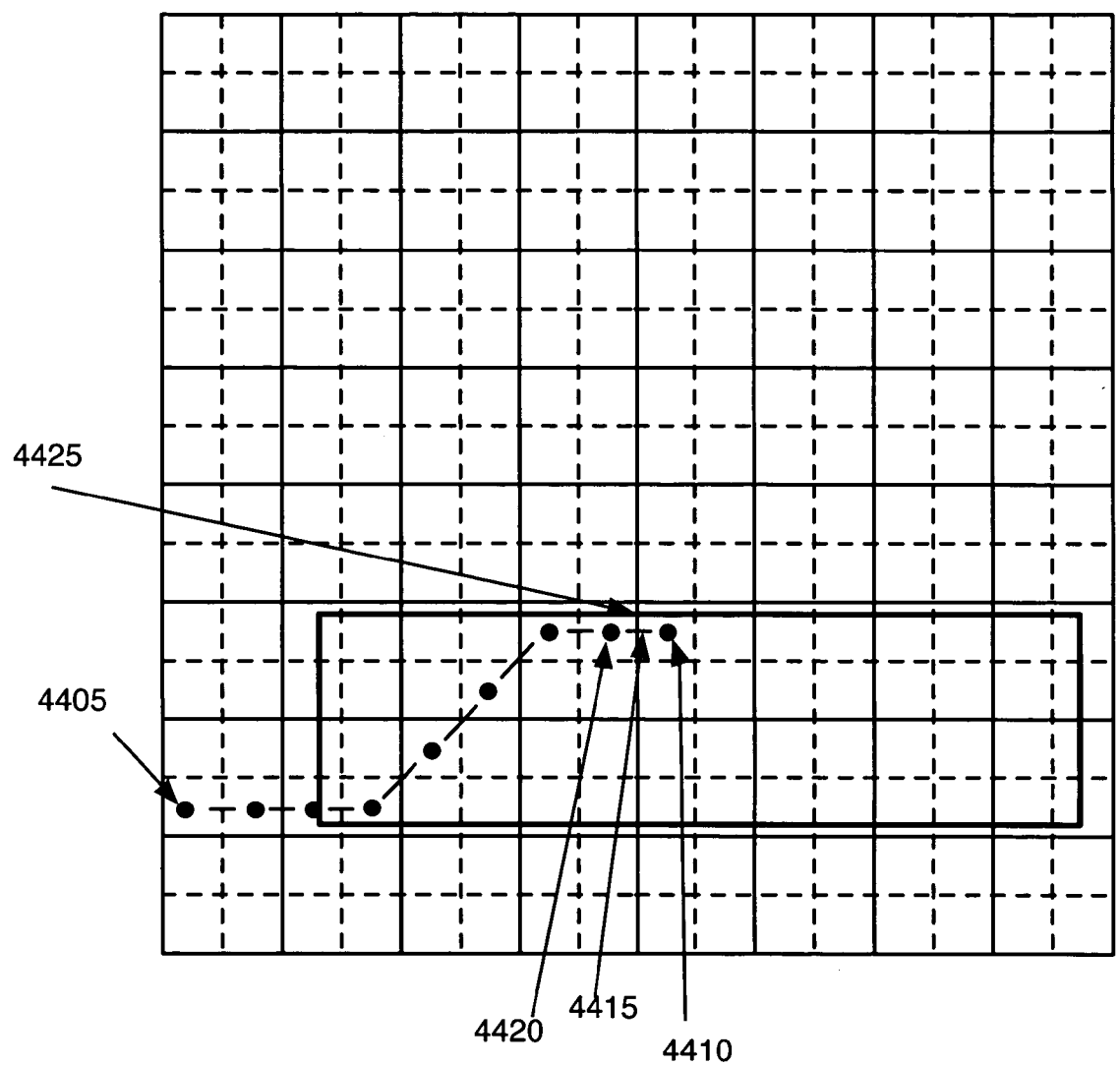
FIG. 44 illustrates a path search that starts at a node and ends at a node.

During the path search, the process examines the capacity at a Gcell boundary when it identifies an expansion across such a boundary, in order to ascertain the viability of the expansion. For instance, FIG. 44 illustrates a path search that starts at a node 4405 and ends at a node 4410. In reaching node 4410, this path search has explored various expansions. One of the expansions that has been identified is the expansion 4415 from node 4420 to node 4410 across Gcell boundary 4425. When the path search operation identifies this expansion, it determines whether the Gcell boundary 4425 has sufficient available capacity to define another route across this boundary in the direction of the expansion 4415. The available capacity across a Gcell boundary (such as boundary 4425) equals the initial capacity that the global router computed at 4315 minus the estimated number of tracks that it has since defined across that boundary. When the path search operation determines that an identified expansion is crossing an overcongested Gcell boundary, it either discards the expansion as a non-viable expansion or assigns this expansion a high cost.

When the path search at 4335 identifies a path between the source and target sets identified at 4330, the process embeds (at 4335) the identified path and then transitions to 4340. At

4340, the process determines whether it has defined a complete route for the net selected at 4325 (i.e., whether it has defined a route that connects all the pins of the net). If not, the process transitions back to 4330 to define new source and target sets for another path search, and then performs this path search to further define the route for the selected net.

When the process determines (at 4340) that it has completely defined the route for the selected net, it determines (at 4345) whether it has completed its routing of all the nets. If not, the process transitions back to 4325 to select another net for routing. In some instances, the global routing process 4300 rips up and redefines routes for a particular net one or more times, in order to facilitate the routing of other nets or to improve the routing of the particular net. Also, in some instances, one or more of the path search operations that the routing process performs for a particular net might not identify a path between source and target sets. In these instances, the routing process tries several times to identify such a path, and when it fails, it flags the net as one that it was not able to route. When the process 4300 determines (at 4345) that it has completed its routing of the nets, it terminates.

C. Edge Identification

As described above by reference to FIGS. 37-40, the routing graph for each layer includes numerous potential horizontal, vertical, and diagonal edges. At 4315, the global routing process 4300 specifies each potential edge in the routing graph of the selected layer as an actual edge if the potential edge matches a set of criteria.

For instance, in some embodiments, the process specifies an actual edge in the selected layer's routing graph for each potential edge that has its direction match the global preferred direction or one of the local preferred directions of the selected layer. A direction of a potential edge matches a preferred direction on the selected layer when the potential edge's direction matches the preferred wiring direction of at least a portion of the sub-region that is represented by a node connected by the potential edge. The above-described FIG. 41 illustrates an example of specifying actual edges between the routing graph nodes on layer 3 based on the global preferred horizontal direction and the two local preferred diagonal directions of this layer.

Other embodiments, however, define (at 4315) the actual edges in the routing graph differently. For each potential edge, these embodiments initially identify an associated region, called the edge region. These embodiments then determine whether the potential edge should be an actual edge based on the proportion of edge region in which the locally preferred direction matches the potential edge's direction.

Figure 45:
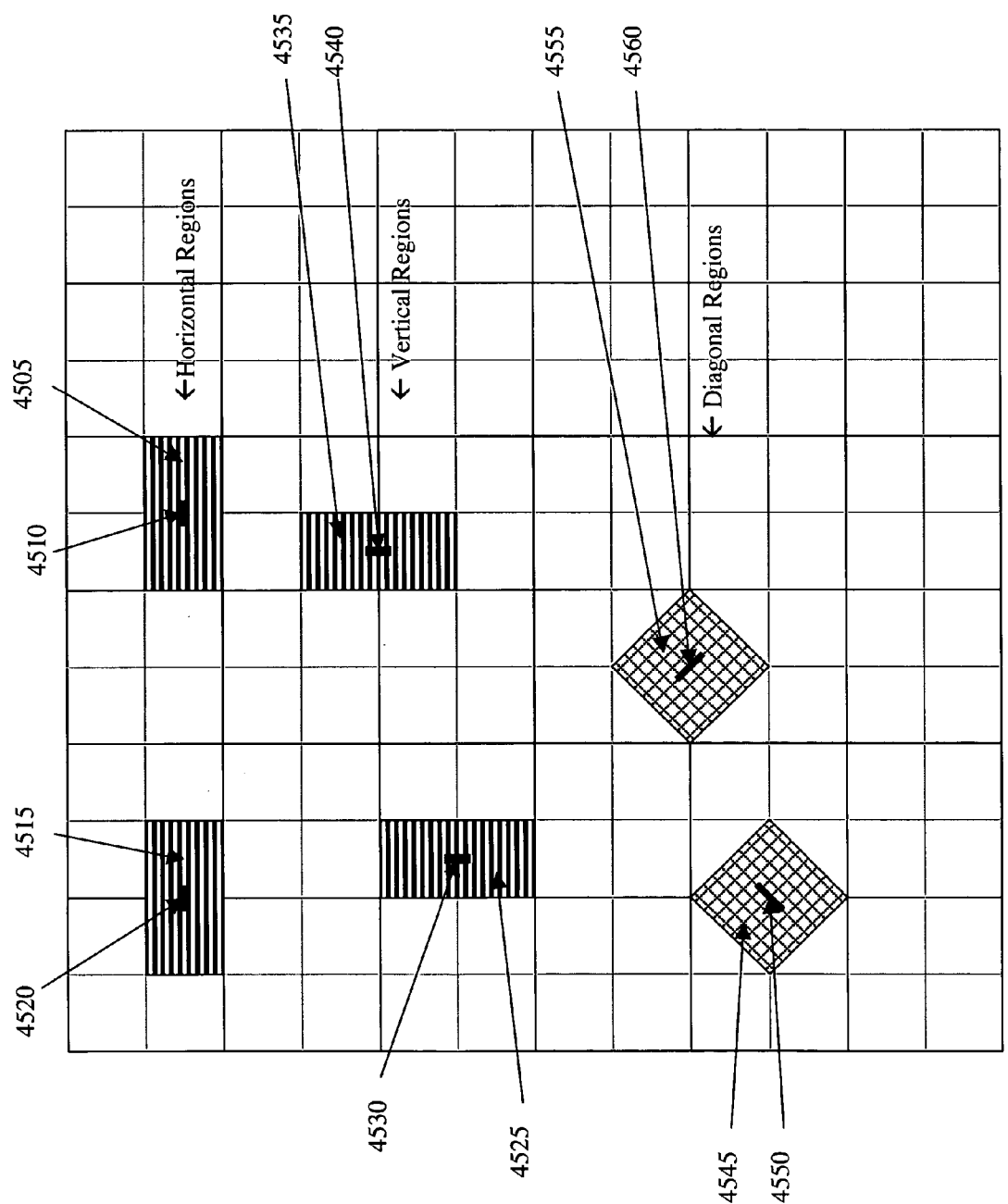
FIG. 45 illustrates several examples of edge regions.

FIG. 45 illustrates several examples of edge regions. Specifically, this figure illustrates a wiring layer that has been divided into a set of Gcells and four quadrants (i.e., four nodes) in each Gcell. The possible edges in some embodiments between such nodes were described above in FIGS. 37-41. As mentioned above, the potential horizontal (H) edges are between SE-SW and NE-NW quadrants, and the potential vertical (V) edges are between NW-SW and NE-SE quadrants. These potential Manhattan edges come in two flavors: external (between quadrants in different Gcells) and internal (between quadrants in the same Gcell). The potential diagonal edges include 45° (D45) edges between SE-NW quadrants of different Gcells, and −45° (D135) edges between SW-NE quadrants of different Gcells.

FIG. 45 illustrates examples of six edge regions for six potential edges. These six edge regions are (1) the edge region 4505 that is associated with the internal horizontal edge 4510, (2) the edge region 4515 that is associated with the external horizontal edge 4520, (3) the edge region 4525 that is associated with the internal vertical edge 4530, (4) the edge region 4535 that is associated with the external vertical edge 4540, (5) the edge region 4545 that is associated with the external D45 edge 4550, and (6) the edge region 4555 that is associated with the external D135 edge 4560.

For any potential edge of type H, V, D45, or D135 on each layer, some embodiments define $f_H$, $f_V$, $f_{D45}$, or $f_{D135}$, which are the fraction of the area in the edge's associated edge region on that layer at which the preferred direction matches the edge type. Some embodiments use the following rules to determine whether to specify an actual edge for a potential edge, where $f_M$ can be either $f_H$ and $f_V$, $f_D$ can be $f_{D45}$ or $f_{D135}$:

Manhattan edge:
    Define an actual edge if the $f_M$ of an external potential Manhattan edge (i.e., a Manhattan edge that connects two nodes in two different Gcells) is greater than one third.
    Define an actual edge if the $f_M$ of an internal potential Manhattan edge is greater than zero.

Diagonal edge:
    Define an actual edge if the $f_D$ of an external potential diagonal edge (i.e., a diagonal edge that connects two nodes in two different Gcells) is greater than one half.

Instead of using ⅓, 0, and ½ in the above-mentioned rules, other embodiments might use other parameters. In some embodiments, the router allows a designer to adjust these parameters.

It should be noted that the potential D45 and D135 edges across any Gcell boundary are associated with the same diamond-shaped stitch region. To avoid generating unresolvable nonplanaraties, some embodiments at most define only one of these diagonal edges at any Gcell boundary. The proposed criterion, $f_D > ½$, ensures only one diagonal edge is defined at any Gcell boundary. If a value less than ½ is selected, it would become possible for both edge directions to exceed the threshold, in which case some embodiments define an edge only in the direction with the greater fraction.

In the current global routing model, D45 and D135 routes use disjoint sets of quadrants ({SE, NW} and {SW, NE}, respectively). To avoid every route between such regions having to via to another layer and back, some embodiments stitch adjacent quadrants together if they are touched by D45 and D135 stitches.

D. Edge Capacity Estimation

As mentioned above, some embodiments compute the capacity of edges in the Groute graph that correspond to regions in the layout with only one preferred direction based on existing capacity estimation techniques. U.S. Published patent application 2004-0098680 describes some of the existing capacity estimation techniques.

These embodiments, however, compute the capacity of edges in the Groute graph that correspond to regions in the layout with multiple different preferred directions based on novel capacity estimation techniques. To define the capacity along a particular edge that crosses a particular Gcell boundary in a particular direction (e.g., a horizontal edge between two Gcells), some embodiments first identify a capacity tile that is associated with the particular edge. In some embodiments, the capacity tile for a particular edge is identical to the edge region that was used to determine whether to define the particular edge. The above-described FIG. 45 illustrated several examples of edge regions for different types of external edges (where an external edge is an edge between two Gcells).

Figure 46:
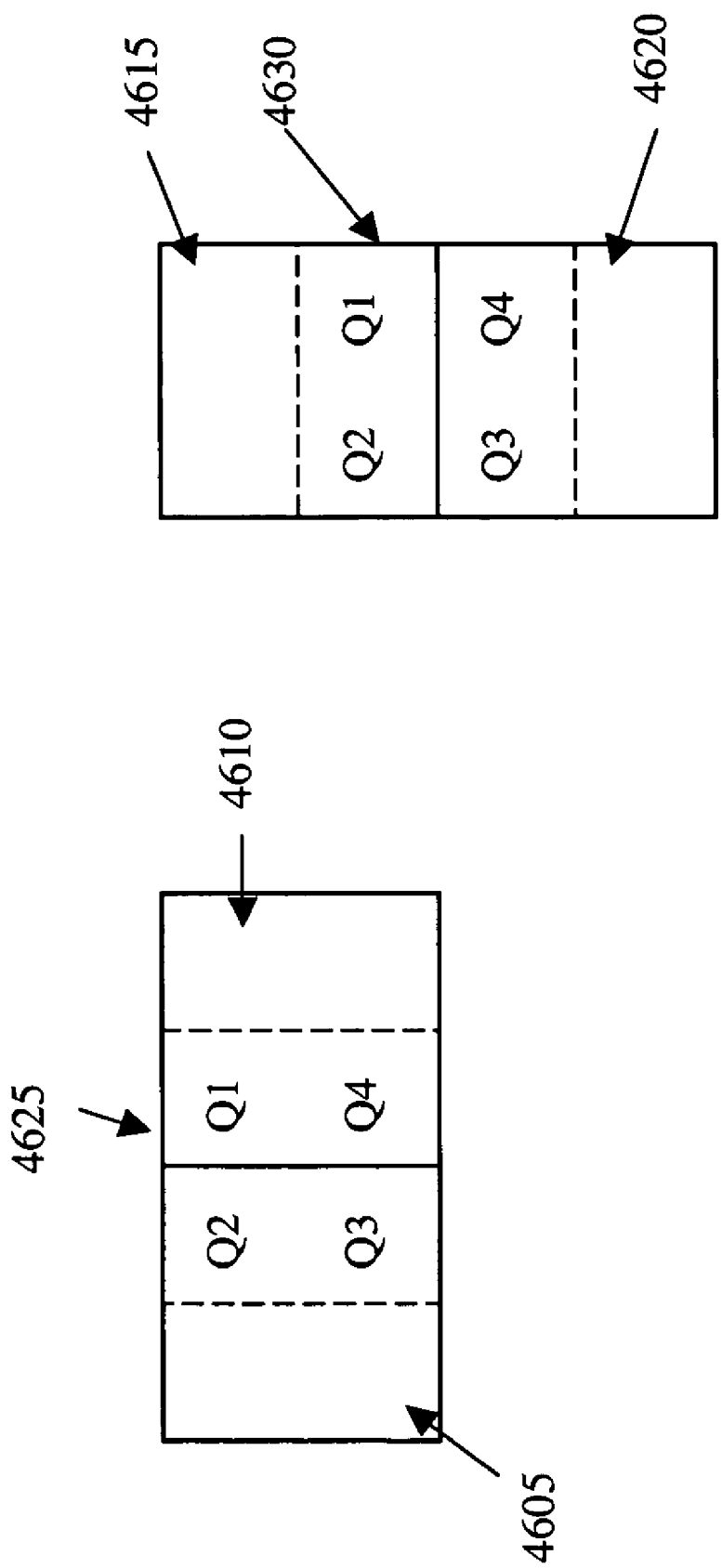
FIG. 46 illustrates two capacity tiles used in some embodiments of the invention.

In other embodiments, however, the capacity tile associated with a particular edge is different than the edge region of the particular edge. For instance, in some embodiments, the capacity tile is a square that is one Gcell wide and that is centered about the Gcell boundary crossed by the particular edge. Two such capacity tiles are illustrated in FIG. 46. In these figures, the dark-outline squares depict the Gcells 4605, 4610, 4615, and 4620, and dashed-outline squares represent the capacity tiles 4625 and 4630. The capacity tiles are used for both diagonal and Manhattan directions.

In FIG. 46, the Gcell boundary between cells 4605 and 4610 is designated as an E-W edge, while the Gcell boundary between cells 4615 and 4620 is designated as a N-S edge. In some embodiments, the possible planar edges along the E-W edge can be horizontal, 45°, and −45° directions, while the possible planar edges along the N-S edge can be vertical, 45°, and −45° directions.

After identifying the capacity tile associated with a particular edge, some embodiments pixelate the capacity tile. The pixelation operation divides the capacity tile into numerous square tiles, and represents each square tile in terms of a pixel located at the tile's center. FIG. 47 illustrates an example of pixelating a capacity tile 4700 into numerous tiles with pixels at their centers. As shown in this figure, capacity tile 4700 includes two obstacles 4705 and 4710, and one region 4750 with a 45° local preferred direction.

A pixel has three attributes: (1) Routing_Direction, which can be any of H, V, D45, or D135, (2) blocked, which can be true or false to indicate whether the pixel is free or blocked, and (3) half-blocked, which when set indicates that the pixel is only half blocked (as opposed to full blocked when the blocked field is true). The routing direction of a pixel will be the routing direction at the pixel's location. If the pixel is on the edge/vertex of an LPDR, a precedence order (D0, D90, D45, D135) will determine the direction. One reason to have a well-defined precedence is to remove any dependency on LPDR-ordering or platform. A pixel is flagged as a blocked pixel when a blockage (e.g., an obstacle, pin, or a previously defined route) overlaps some portion of the tile associated with the pixel. However, a pixel will not be designated as a blocked pixel by a mere touch of a blockage. In some embodiments, there must be a non-zero overlap between the pixel's tile and a blockage before the pixel is deemed to be blocked.

Figure 48:
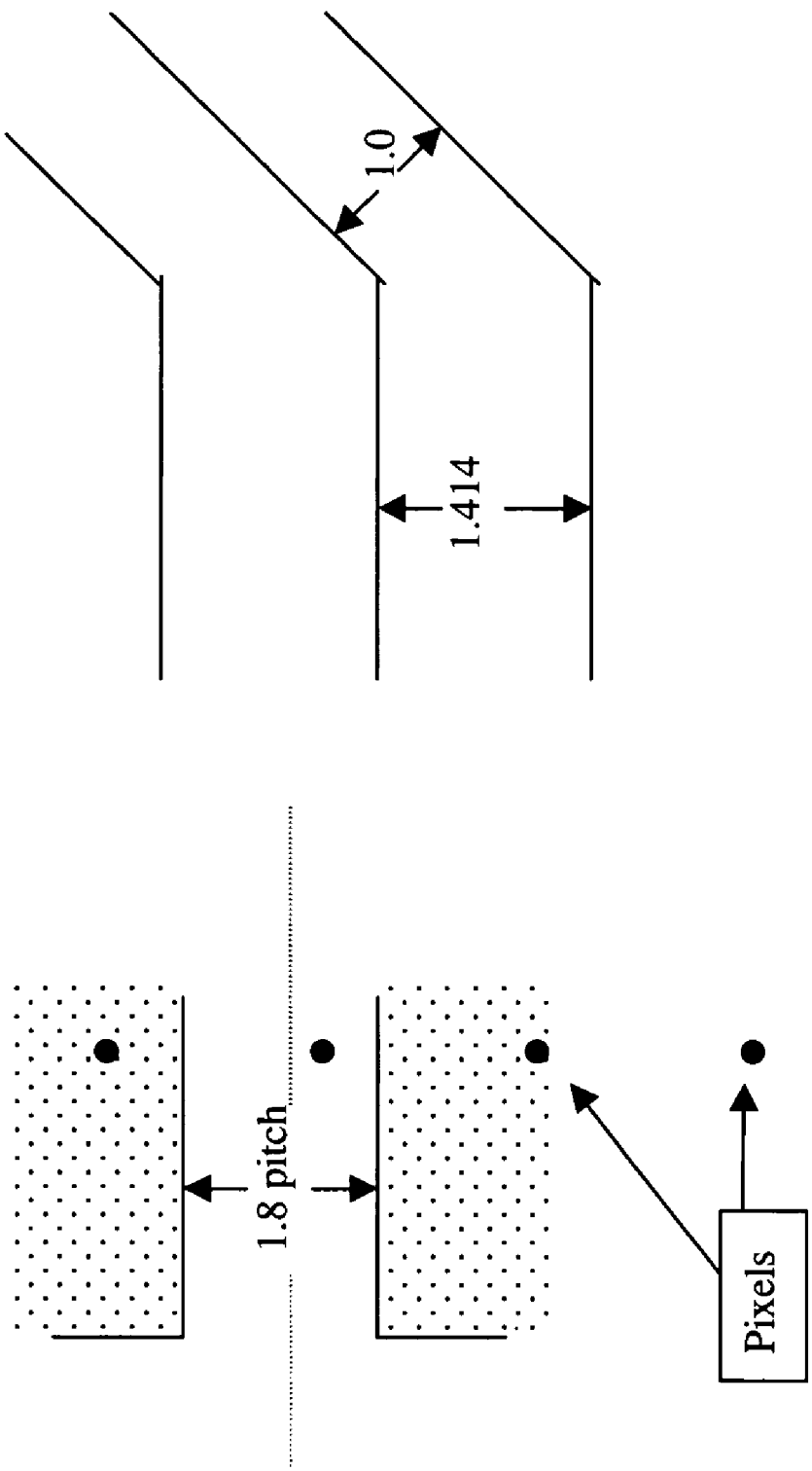
FIG. 48 presents an example that illustrates how some embodiments define the pixel pitch and the track pitch.

The distance between the pixels will determine the accuracy of detecting narrow single-track openings. Some embodiments define the pixel pitch equal to the track pitch. When the pixel pitch equals the track pitch, an opening up to 2.0 track-pitches might, depending on alignment with respect to the pixels, get flagged as no-opening, as shown in FIG. 48.

After pixelating a capacity tile, some embodiments then perform a ray tracing operation to quantify the capacity of the particular edge. Given a starting pixel from a starting set of pixels, a ray can be traced by jumping along the routing-direction to the next pixel, and then using the next pixel's routing-direction for the subsequent move and so on. The ray will end when it reaches an end pixel in an ending set of pixels, or when it reaches a blocked edge or a previously used pixel. If the ray fails to reach an end pixel, the ray will be discarded and all the pixels that the ray used before failing will be freed up for use by a subsequent ray-traversal. The capacity of the edge is then determined based on the number of rays that reach the end set of pixels.

FIG. 47A illustrates an example of such ray tracing. In this example, the ray tracing is performed from a start pixel in the leftmost pixel column to an end pixel in the rightmost pixel column. FIG. 47A presents two sets of pixels as blacked out to illustrate that they are blocked by obstacles 4705 and 4710 in the capacity tile 4700. Also, this figure illustrates a horizontal ray 4720 (at the top of the pixelated tile 4700) that traverses across this tile completely in the horizontal direction. It also illustrates three rays 4730, 4735, and 4740 that traverse across the pixelated tile first in a horizontal direction, then in a 45° direction, and finally in the horizontal direction. These rays change from between the horizontal and 45° directions twice as they enter and exit the region 4750 that has a 45° local preferred direction. Finally, FIG. 47A illustrates one ray 4745 that never reaches a pixel in the rightmost pixel column. This rays gets blocked at pixel 4755 because this pixel's direction (which is the LPD of the LPDR 4750) would require the ray to use pixel 4760, which was previously used by ray 4720.

Figure 47B:
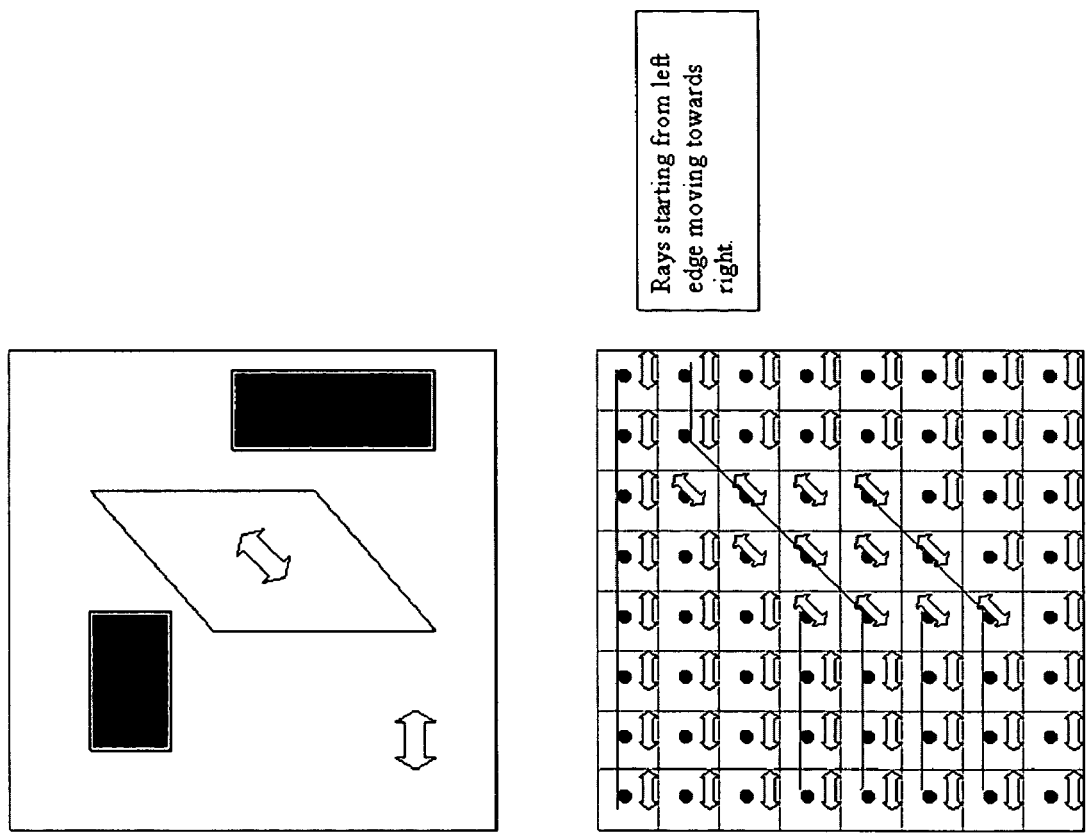

In some cases, ray tracing might not give the same result if the ray is started from the end point. FIG. 47B illustrates an example that is identical to the example illustrated in FIG. 47A, except that in FIG. 47B the ray tracing is performed from right to left. As shown in FIG. 47B, this ray tracing results in only one ray reaching its destination. However, for LPDRs spanning across many Gcells, such differences in the result of the ray tracing are expected to be a small percentage. Notwithstanding, some embodiments address this difference by performing both ray tracing operations (i.e., by once starting a ray tracing operation from the start points and once starting a ray tracing operation from the end points) and taking the bigger value produce by the two operations. Other embodiments might take the smaller value produced by the two operations.

a. Special Consideration for Diagonal Movements Along Pixels

Figure 49:
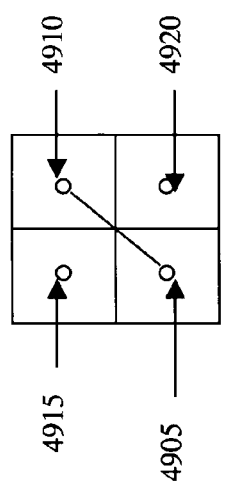
FIG. 49 presents an example that illustrates that a diagonal movement from a first pixel to a second pixel require not only that the second pixel be free but also requires the two pixels that neighbor both the first and second pixels to be free.

A diagonal movement from a first pixel to a second pixel require not only that the second pixel be free but also requires the two pixels that neighbor both the first and second pixels to be free. This is illustrated by the example illustrated in FIG. 49. This figure illustrates a move from pixel 4905 to 4910 in the 45° direction. For such a move to be possible, the pixels 4910, 4915, and 4920 have to be free. Such a move would result in the marking of pixel 4910 as being blocked. It would also result in the marking of pixels 4915 and 4920 as being blocked as the destination of a ray for all directions and as being "half used" for the 45° direction.

Figure 50:
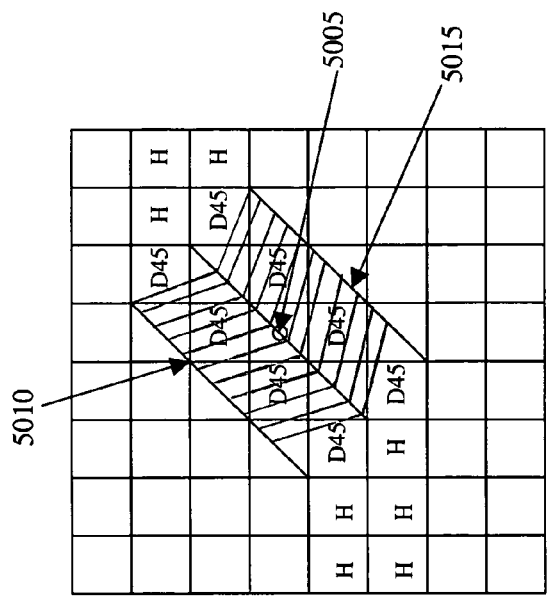
FIGS. 50-56 illustrate examples that illustrate how some embodiments define the capacity of edges for defining routes.

A half used pixel for a particular diagonal direction is a pixel that cannot serve as the destination of a ray in the particular diagonal direction but can serve as the neighboring pixel to two pixels that are connected in the 45° direction. Pixel 5005 in FIG. 50 is an example of a pixel that has two half uses. Specifically, half of this pixel is used by wire 5010, while the other half of this pixel is used by wire 5015.

b. The Direction to Move Along When a Change of Direction Occurs

Figure 51:
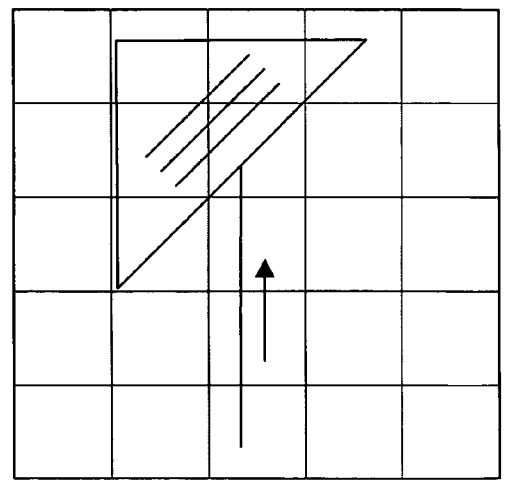

While ray tracing, it might be possible to move in two directions whenever there is a change of direction. For instance, as shown in FIG. 51, a horizontally moving ray might reach a pixel that is in a LPDR that has a −45° LPD. In such a case, the next move of the ray can be in the 135° direction or in the collinear −45° direction.

In such circumstances, some embodiments will move in the new direction that is "Forward" to the existing direction. Mathematically this is the direction that will result in a positive number when its dot-product with the previous direction is taken. Alternatively, Table 1 below identifies the direction to select whenever the direction of the previous pixel and the current pixel along the ray differs.

TABLE 1

| Previous | Current | | | |
|---|---|---|---|---|
| | D0 | D45 | D90 | D135 |
| D0 | — | D45 | Orthogonal | D315 |
| D45 | D0 | — | D90 | Orthogonal |
| D90 | Orthogonal | D45 | — | D135 |
| D135 | D180 | Orthogonal | D90 | — |
| D180 | - NA - | D225 | Orthogonal | D135 |
| D225 | D180 | - NA - | D270 | Orthogonal |
| D270 | Orthogonal | D225 | - NA - | D315 |
| D315 | D0 | Orthogonal | D270 | - NA - |

Figure 52:
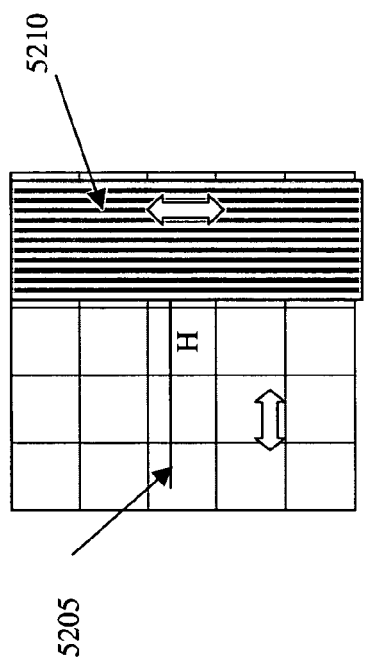

For orthogonal routing-direction, some embodiments determine the move direction in a way such that two criteria are met. First, to match the behavior of the detailed router, there is no permeability if the orthogonal regions are separated by an edge that is perpendicular (or parallel) to any of the two directions. One such example is illustrated in FIG. 52. This figure illustrates a horizontal ray 5205 that terminates when it reaches a LPDR 5210 with a vertical LPD, since the boundary of the LPDR region is orthogonal to the horizontal direction and parallel to the vertical direction.

Figure 53:
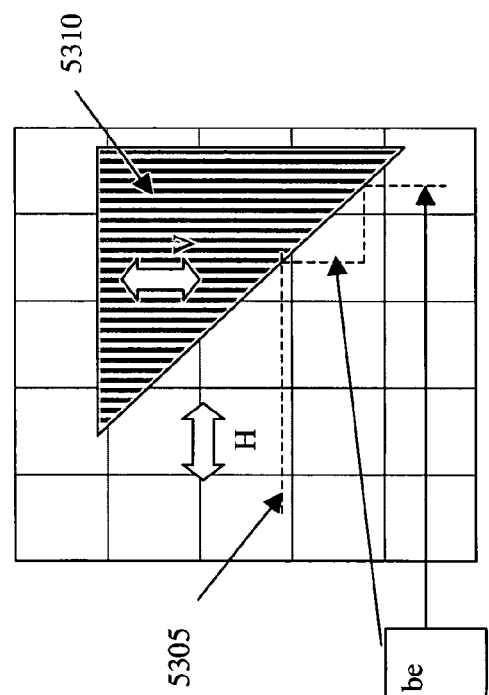

Second, the direction is away from the existing region, so that the move cannot re-enter the region, and then zig-zag along the border. FIG. 53 illustrates an example of this criteria. This figure illustrates a horizontal ray 5305 that enters an LPDR region 5310 with a vertical LPD. Here, the LPDRs boundary reached by the ray is neither parallel nor orthogonal to either direction. Hence, the ray 5305 can continue through the LPDR along its LPD. In this example, the ray moves up in the 90° direction instead of down in the −90° direction since moving down would result in undesirable zig-zag along the LPDR boundary, as shown in FIG. 53.

The pseudo code that some embodiments follow to implement these two criteria for a ray that is going from a first pixel with a horizontal direction to a second pixel with a vertical direction is as follows:

```
If the pixel below the first pixel has a horizontal direction
{
move-up //connect-to-top
}
else if the pixel above the first pixel has a horizontal direction
{
move down //connect-to-bot
}
else
{
do not connect
}
```

For D45-D135 moves, the "diagonal move" criteria is more relaxed at the transition point, as described above. Otherwise the diagonal moves would not be possible.

c. Starting Points for the Rays

As mentioned above, a ray tracing operation will be performed after pixellating a capacity tile. The starting point of the rays will be dependent on the planar edges that are available across the Gcell boundary associated with the capacity type.

Figure 54:
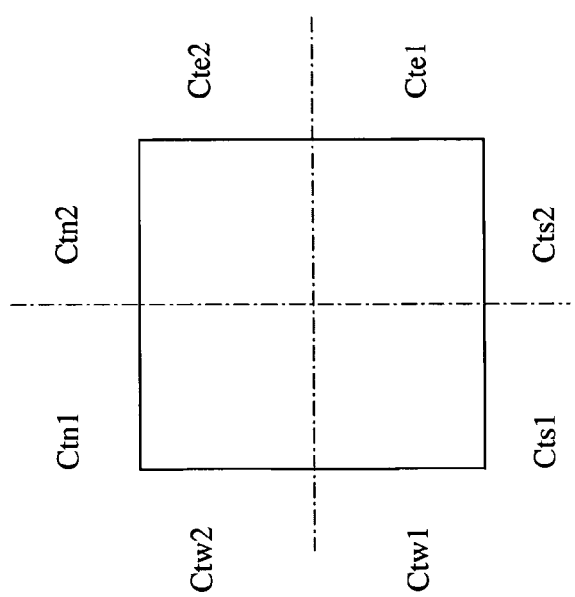

Each edge-type will have a corresponding set of start and end-points along the tile boundary. Union of the start-points for all the edges available along the Gcell boundary will be the start points for the entire outline. The end-points will be chosen in a similar fashion. FIG. 54 provides an illustration of eight sections Ctn1, Ctn2, Cts1, Cts2, Ctw1, Ctw2, Cte1, and Cte2 along the boundary of a tile that define eight different sets of pixels that can server as start and end points for different ray tracing operations. (The convention used for naming these eight sections is capacity tile section name: ct<directionChar><num>.) For instance, Table 2 below provides the start and end-points for each ray tracing operation for each edge-type.

TABLE 2

| Edge Type | Start Pixels are Pixels Along Boundary Edges | End Pixels are Pixels Along Boundary Edges |
|---|---|---|
| D0 | Ctw1, ctw2 | Cte1, cte2 |
| D45 | Ctw1, cts1 | Ctn2, cte2 |
| D90 | Cts1, cts2 | Ctn1, ctn2 |
| D135 | Ctn1, ctw2 | Cte1, cts2 |

The rays will begin from the pixels along the starting edges. The order of selecting pixels will be anti-clockwise beginning with the ctn1 edge.

Once a ray is able to reach its end-target, its orientation will be determined based on its two end-points. The ray will be classified by the X-angle (D0, D45, D90 or D135) closest to the orientation. If the stitch to which the ray gets classified is not available, the ray will be discarded and all the pixels will be freed for any subsequent traversal. The capacity along an edge is the total number of rays that successfully traverse from "start" to "end".

Figure 55:
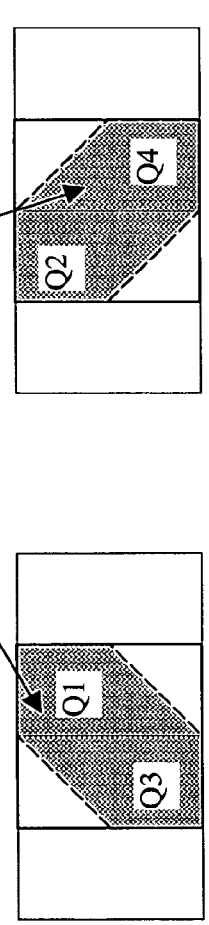

FIG. 55 illustrates the start and end edges for the 45° and 135° directions. As shown in this figure, the start and end edges are the edges of the locus of the third quadrant (Q3) of the capacity tile moving to the tile's first quadrant (Q1) for 45° edge, and the locus of tile second quadrant (Q2) moving to the tile's fourth quadrant (Q4) for 135° edge.

d. Obstructions

Big Manhattan obstructions need special handling in diagonal regions. Otherwise, the capacity that is calculated can allow routes through such obstructions. Hence, in some embodiments, if a Manhattan obstruction intersects a capacity tile that has a planar diagonal edge, the part of the obstruction that overlaps the extended region (and outside the tile) will be projected onto the tile outline. The projection onto the outline will block the corresponding start/end pixels. The projection will verify/check for the pixels along the path being diagonal. If a pixel is not diagonal, the projection ray will stop.

Figures 56A, 56B:
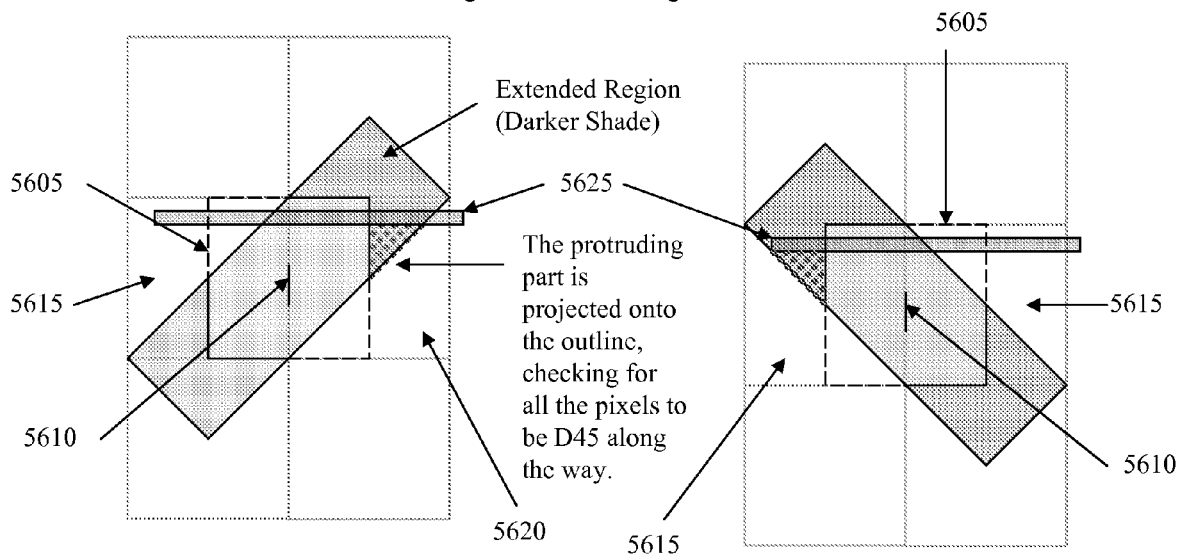

FIGS. 56A and 56B present two examples that illustrate this. In both examples, there is a capacity tile 5605 for a vertical boundary 5610 between two Gcells 5615 and 5620. Also, in both examples, a horizontal aligned obstruction 5625 overlaps the capacity tile 5605 and extends beyond this tile in both directions. FIG. 56A illustrates projecting the extension of the obstruction past the tile on the right hand side onto the capacity tile section Cte2 in the −135° direction. FIG. 56B illustrates projecting the extension of the obstruction past the tile on the left hand side onto the capacity tile section Ctw2 in the −45° direction. These projections shown that the obstruction 5625 completely blocks the pixels on the two sections Cte2 and Ctw2 for the 45° and 135° directions respectively.

e. Alternatives

Whenever a Manhattan and a diagonal region are separated by a Manhattan-oriented border, the theoretical limit for transition is 70%. The above-described model, models this limit to be 50%. The detailed router might be closer to 70% in transition percentage and hence the above-described model is somewhat conservative.

Choosing a pixel-pitch of half the track pitch would achieve the Manhattan-diagonal transition percentage much closer to the theoretical limit (70%). But more processing would be required to achieve the detailed router track behavior (implicit when pixel-pitch is equal to track-pitch). Some embodiments do not do this because of a 4-times increase in ray-tracing work and pixel-memory consumption. Memory consumption could, however, be controlled by not storing directions for pixels. These could be determined during ray-tracing (for the entire Gcell at one-go). For faster runtimes, a bottom up search mechanism for a KD tree could be used. This would significantly increased the implementation time.

Also, the above-described model has just one pixel-grid per direction. Other embodiments create a pixel grid for each direction, and define transition zones (around LPD outlines) to move from one grid to another.

IV. Computer System

Figure 57:
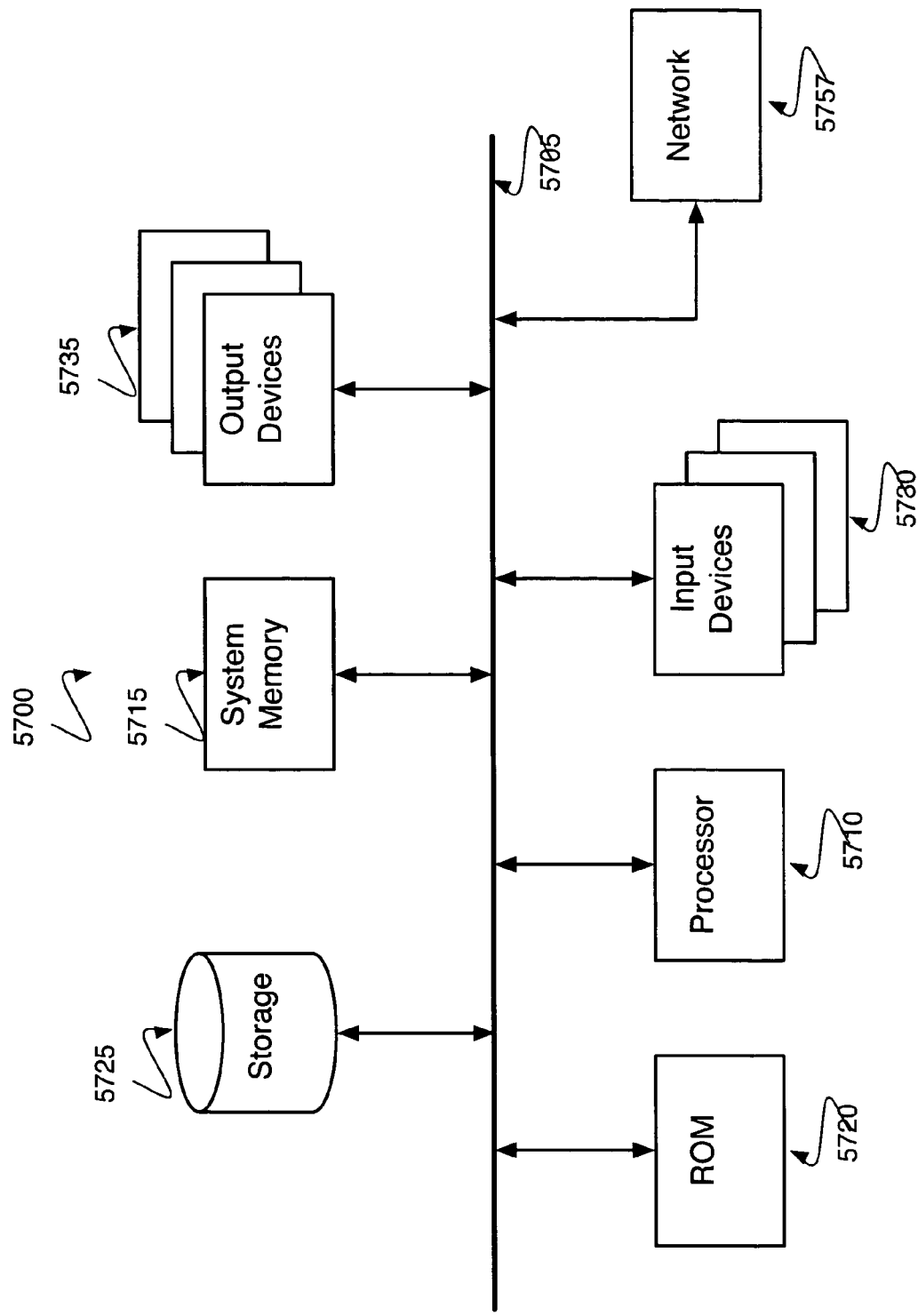
FIG. 57 conceptually illustrates a computer system with which some embodiment of the invention are implemented.

FIG. 57 conceptually illustrates a computer system with which some embodiment of the invention are implemented. Computer system 5700 includes a bus 5705, a processor 5710, a system memory 5715, a read-only memory 5720, a permanent storage device 5725, input devices 5730, and output devices 3035.

The bus 5705 collectively represents all system, peripheral, and chipset buses that support communication among internal devices of the computer system 5700. For instance, the bus 5705 communicatively connects the processor 5710 with the read-only memory 5720, the system memory 5715, and the permanent storage device 5725.

From these various memory units, the processor 5710 retrieves instructions to execute and data to process in order to execute the processes of the invention. The read-only-memory (ROM) 5720 stores static data and instructions that are needed by the processor 5710 and other modules of the computer system. The permanent storage device 5725, on the other hand, is a read-and-write memory device. This device is a non-volatile memory unit that stores instruction and data even when the computer system 5700 is off. Some embodiments of the invention use a mass-storage device (such as a magnetic or optical disk and its corresponding disk drive) as the permanent storage device 5725. Other embodiments use a removable storage device (such as a floppy disk or zip® disk, and its corresponding disk drive) as the permanent storage device.

Like the permanent storage device 5725, the system memory 5715 is a read-and-write memory device. However, unlike storage device 5725, the system memory is a volatile read-and-write memory, such as a random access memory. The system memory stores some of the instructions and data that the processor needs at runtime. In some embodiments, the invention's processes are stored in the system memory 5715, the permanent storage device 5725, and/or the read-only memory 5720.

The bus 5705 also connects to the input and output devices 5730 and 5735. The input devices enable the user to communicate information and select commands to the computer system. The input devices 5730 include alphanumeric keyboards and cursor-controllers. The output devices 5735 display images generated by the computer system. For instance, these devices display IC design layouts. The output devices include printers and display devices, such as cathode ray tubes (CRT) or liquid crystal displays (LCD). Finally, as shown in FIG. 57, bus 5705 also couples computer 5700 to a network 5757 through a network adapter (not shown). In this manner, the computer can be a part of a network of computers (such as a local area network ("LAN"), a wide area network ("WAN"), or an Intranet) or a network of networks (such as the Internet). Any or all of the components of computer system 5700 may be used in conjunction with the invention. However, one of ordinary skill in the art will appreciate that any other system configuration may also be used in conjunction with the invention.

While the invention has been described with reference to numerous specific details, one of ordinary skill in the art will recognize that the invention can be embodied in other specific forms without departing from the spirit of the invention. For instance, some embodiments define a crown boundary between an LPDR with a Manhattan LPD (e.g., a horizontal direction) and an LPDR with a non-Manhattan LPD (e.g., a 45° diagonal direction) in terms of an angle that is between the Manhattan and non-Manhattan directions (e.g., a 22.5° direction). Thus, one of ordinary skill in the art would understand that the invention is not to be limited by the foregoing illustrative details, but rather is to be defined by the appended claims.

We claim:

1. A method of defining global routes in an integrated circuit ("IC") layout comprising a plurality of layers, the method comprising:

a) defining a routing graph that comprises (i) a plurality of edges along a first local preferred direction defined for a first region of a particular layer of the IC layout, and (ii) a plurality of edges along a second local preferred direction defined for a second region of the particular layer, wherein the first and second local preferred directions are different;

b) defining the capacities of a plurality of edges based on the different local preferred wiring directions of the two regions; and c) defining a global route by performing at least one path search that uses the defined capacities of the edges to determine whether a particular edge from the plurality of edges comprises sufficient available capacity for a path expansion to use the particular edge, wherein a capacity defined for an edge is based on a maximum number of global routes allowed to use the edge.

2. The method of claim 1, wherein performing the at least one path search comprises:

a) identifying a plurality of path expansions across the plurality of edges;

b) for each particular path expansion across each edge, determining whether the particular path expansion has enough capacity for another route to use the edge; and c) when the particular edge has enough capacity, using the particular edge to define a particular route based on the path expansion.

3. The method of claim 2, wherein performing the at least one path search further comprises foregoing the use of the particular edge to define the particular route based on the path expansion when the particular edge does not have enough capacity.

4. The method of claim 1, wherein performing the at least one path search comprises identifying a plurality of path expansions across the plurality of edges.

5. The method of claim 1, wherein performing the at least one path search comprises:

a) identifying a first path expansion across a first edge, wherein the first edge is associated with a set of regions in a particular layer;

b) determining whether the first path expansion across the first edge is along a set of local preferred directions of the set of regions associated with the first edge; and c) when the first path expansion is along the set of local preferred directions, determining whether the first edge comprises sufficient remaining capacity for another path expansion.

6. The method of claim 1 further comprising:
a) before performing the at least one path search, identifying a set of potential directions for expansions across each of a plurality of edges based on the local preferred directions; and
b) using the identified potential directions to identify a set of path expansions during the at least one path search.

7. The method of claim 1, wherein each edge comprises an associated direction, the method further comprising:
a) before performing the at least one path search, using the local preferred directions to identify edges in the routing graph; and
b) using the identified edges to identify a set of path expansions during the at least one path search.

8. The method of claim 2 further comprising reducing the particular edge's capacity after using the particular edge to define the particular route, in order to account for the edges's use by the particular route.

9. The method of claim 1, wherein each edge is associated with at least one area in the IC layout, wherein defining the capacity of an edge comprises:
a) dividing the at least one area into a plurality of sub-regions;
b) generating lines to traverse across the at least one area based on local preferred wiring directions for the sub-regions, wherein the lines start at one set of sub regions; and
c) identifying the capacity of the edge based on a number of generated lines that terminate on another set of sub-regions.

10. The method of claim 9, wherein at least one of the lines cannot traverse across the at least one area because of blockage.

11. The method of claim 1, wherein each edge is associated with at least one area in the IC layout, wherein defining the capacity of an edge comprises:
a) determining whether the at least one area associated with the edge covers a boundary between two different regions with two different local preferred directions; wherein the two different regions comprise first and second regions;
b) when the edge covers the boundary between the two different regions, computing an estimated number of wire tracks that are incident on that boundary in the first region and an estimated number of wire tracks that are incident on that boundary in the second region; and
c) using the estimated numbers to define the capacity of the edge.

12. The method of claim 1,
wherein each of the plurality of layers comprises at least two regions with different local preferred wiring directions, wherein defining the capacities of the plurality of edges based on the different local preferred wiring directions of the two regions comprises defining the capacities of the plurality of edges based on different local preferred wiring directions of different regions on different layers.

13. The method of claim 1 further comprising defining, for the first region, a set of edges along the second local preferred direction at a boundary with the second region, wherein the set of edges is for facilitating traversal of the global route between the first and second regions.

14. A computer readable medium storing a computer program for defining global routes in an integrated circuit ("IC") layout comprising a plurality of layers, the computer program executable by at least one processor, the computer program comprising sets of instructions for:
a) defining a routing graph that comprises (i) a plurality of edges along a first local preferred direction defined for a first region of a particular layer of the IC layout, and (ii) a plurality of edges along a second local preferred direction defined for a second region of the particular layer, wherein the first and second local preferred directions are different;
b) defining the capacities of a plurality of edges based on the different local preferred wiring directions of the two regions; and
c) defining a global route by performing at least one path search that uses the defined capacities of the edges to determine whether a particular edge from the plurality of edges comprises sufficient available capacity for a path expansion to use the particular edge, wherein a capacity defined for an edge is based on a maximum number of global routes allowed to use the edge.

15. The computer readable medium of claim 14, wherein the set of instructions for performing the at least one path search comprises a set of instructions for:
a) identifying a plurality of path expansions across the plurality of edges;
b) for each particular path expansion across each edges, determining whether the particular path expansion has enough capacity for another route to use the edge; and
c) when the particular edge has enough capacity, using the particular edge to define a particular route based on the path expansion.

16. The computer readable medium of claim 15, wherein the set of instructions for performing the at least one path search comprises a set of instructions for foregoing the use of the particular edge to define the particular route based on the path expansion when the particular edge does not have enough capacity.

17. The computer readable medium of claim 14, wherein the set of instructions for performing the at least one path search comprises a set of instructions for identifying a plurality of path expansions across the plurality of edges.

18. The computer readable medium of claim 15, wherein the computer program further comprises a set of instructions for reducing the particular edge's capacity after using the particular edge to define the particular route, in order to account for the edges's use by the particular route.

19. The computer readable medium of claim 14, wherein each edge is associated with at least one area in the IC layout, wherein the set of instructions for defining the capacity of an edge comprises sets of instructions for:
a) dividing the at least one area into a plurality of sub-regions;
b) generating lines to traverse across the at least one area based on local preferred wiring directions for the sub-regions, wherein the lines start at one set of sub regions; and
c) identifying the capacity of the edge based on a number of generated lines that terminate on another set of sub-regions.

20. The computer readable medium of claim 19, wherein at least one of the lines cannot traverse across the at least one area because of blockage.

21. The computer readable medium of claim 14, wherein each edge is associated with at least one area in the IC layout, wherein the set of instructions for defining the capacity of an edge comprises sets of instructions for:

a) determining whether the at least one area associated with the edge covers a boundary between two different regions with two different local preferred directions, wherein the two different regions comprise first and second regions;
b) when the edge covers the boundary between the two different regions, computing an estimated number of wire tracks that are incident on that boundary in the first region and an estimated number of wire tracks that are incident on that boundary in the second region; and
c) using the estimated numbers to define the capacity of the edge.

22. The computer readable medium of claim 14, wherein each of the plurality of layers comprises at least two regions with different local preferred wiring directions, wherein the set of instructions for defining the capacities of the plurality of edges based on the different local preferred wiring directions of the two regions comprises a set of instructions for defining the capacities of the plurality of edges based on different local preferred wiring directions of different regions on different layers.

23. The computer readable medium of claim 14, wherein the computer program further comprises a set of intructions for defining, for the first region, a set of edges along the second local preferred direction at a boundary with the second region, wherein the set of edges is for facilitating traversal of the global route between the first and second regions.

* * * * *